(12) United States Patent
Giamei et al.

(10) Patent No.: US 10,831,497 B2
(45) Date of Patent: *Nov. 10, 2020

(54) COMPRESSION/DECOMPRESSION INSTRUCTION SPECIFYING A HISTORY BUFFER TO BE USED IN THE COMPRESSION/DECOMPRESSION OF DATA

(71) Applicant: INTERNATIONAL BUSINESS MACHINES CORPORATION, Armonk, NY (US)

(72) Inventors: Bruce C. Giamei, Lagrangeville, NY (US); Anthony T. Sofia, Hopewell Junction, NY (US); Matthias Klein, Poughkeepsie, NY (US); Simon Weishaupt, Stuttgart (DE); Mark S. Farrell, Pleasant Valley, NY (US); Timothy Slegel, Staatsburg, NY (US); Ashutosh Mishra, Poughkeepsie, NY (US); Christian Jacobi, West Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 9 days.

This patent is subject to a terminal disclaimer.

(21) Appl. No.: 16/263,786

(22) Filed: Jan. 31, 2019

(65) Prior Publication Data
US 2020/0249948 A1 Aug. 6, 2020

(51) Int. Cl.
*G06F 9/30* (2018.01)
*H03M 7/40* (2006.01)
(Continued)

(52) U.S. Cl.
CPC .......... *G06F 9/3832* (2013.01); *G06F 9/3004* (2013.01); *G06F 9/30145* (2013.01);
(Continued)

(58) Field of Classification Search
None
See application file for complete search history.

(56) References Cited

U.S. PATENT DOCUMENTS 5,155,484 A * 10/1992 Chambers, IV ......... G06K 9/72
341/55
5,926,208 A * 7/1999 Noonen ................ H04N 7/141
348/14.1
(Continued)

FOREIGN PATENT DOCUMENTS

| CN | 101977061 A | 2/2011 |
|---|---|---|
| CN | 104300990 A | 1/2015 |
| CN | 105871382 A | 8/2016 |

OTHER PUBLICATIONS

'Addressing Modes' SlideShare by Jyothi Engineering College, Thrissur (Trichur), on slideshare.net on Jun. 30, 2014. (Year: 2014).*

(Continued)

*Primary Examiner* — Steven G Snyder
(74) *Attorney, Agent, or Firm* — Steven Chiu, Esq.; Blanche E. Schiller, Esq.; Heslin Rothenberg Farley & Mesiti P.C.

(57) ABSTRACT

An instruction to perform a function of a plurality of functions is obtained. The instruction is a single architected instruction of an instruction set architecture that complies to an industry standard for compression. The instruction is executed, and the executing includes performing the function specified by the instruction. The performing includes, based on the function being a compression function or a decompression function, transforming state of input data between an uncompressed form of the input data and a compressed form of the input data to provide a transformed state of data accessing. During performing the function, history relating to the function is accessed. The history is to (Continued)

be used in transforming the state of input data between the uncompressed form and the compressed form.

20 Claims, 25 Drawing Sheets

(51) Int. Cl.
*G06F 9/38* (2018.01)
*G06F 9/355* (2018.01)
(52) U.S. Cl.
CPC ............ *G06F 9/3552* (2013.01); *H03M 7/40* (2013.01); *G06F 9/30007* (2013.01)

(56) References Cited

U.S. PATENT DOCUMENTS

| | | | | |
|---|---|---|---|---|
| 6,822,589 B1* | 11/2004 | Dye | ........................ | H03M 7/30 341/51 |
| 6,879,266 B1* | 4/2005 | Dye | ........................ | G06F 12/08 341/51 |
| 7,307,552 B2* | 12/2007 | Ma | ........................ | H03M 7/3086 341/106 |
| 7,653,079 B2* | 1/2010 | Pessi | ........................ | H04L 69/04 370/338 |
| 7,882,263 B2* | 2/2011 | Pessi | ........................ | H03M 7/3088 709/238 |
| 7,991,622 B2 | 8/2011 | Malvar | | |
| 8,275,897 B2 | 9/2012 | Fallon | | |
| 8,766,827 B1* | 7/2014 | Milne | ........................ | H03M 7/3084 341/51 |
| 9,094,039 B2* | 7/2015 | Wu | ........................ | H03M 7/30 |
| 9,154,157 B2 | 10/2015 | Satish | | |
| 9,306,596 B2 | 4/2016 | Satpathy et al. | | |
| 9,374,106 B2 | 6/2016 | Agarwal et al. | | |
| 9,564,917 B1 | 2/2017 | Satpathy | | |
| 9,766,812 B2 | 9/2017 | Pendharkar | | |
| 9,917,597 B1* | 3/2018 | Cutter | ........................ | H03M 7/6029 |
| 9,940,230 B2 | 4/2018 | Shah | | |
| 10,268,412 B2* | 4/2019 | Guilford | ........................ | H01R 13/631 |
| 10,270,464 B1* | 4/2019 | Guilford | ........................ | H03M 7/40 |
| 10,496,703 B2* | 12/2019 | Gopal | ........................ | G06F 16/901 |
| 10,511,324 B1* | 12/2019 | Goyal | ........................ | H03M 7/6011 |
| 10,630,312 B1* | 4/2020 | Giamei | ........................ | H03M 7/4062 |
| 10,635,338 B2* | 4/2020 | Gopal | ........................ | H04L 41/044 |
| 10,673,460 B1* | 6/2020 | Kurup | ........................ | H03M 7/40 |
| 10,691,529 B2* | 6/2020 | Gopal | ........................ | H03M 7/3086 |
| 10,694,217 B2* | 6/2020 | Satpathy | ........................ | H04N 19/13 |
| 10,698,854 B1* | 6/2020 | Weishaupt | ........................ | G06F 13/4068 |
| 2003/0185301 A1 | 10/2003 | Abrams | | |
| 2007/0002780 A1* | 1/2007 | Pessi | ........................ | H03M 7/3088 370/261 |
| 2007/0002855 A1* | 1/2007 | Pessi | ........................ | H04L 69/04 370/389 |
| 2007/0109153 A1* | 5/2007 | Ma | ........................ | H03M 7/3086 341/50 |
| 2009/0115646 A1* | 5/2009 | Duxbury | ........................ | H03M 7/30 341/65 |
| 2010/0223237 A1 | 9/2010 | Mishra | | |
| 2014/0122831 A1* | 5/2014 | Uliel | ........................ | G06F 9/30036 712/4 |
| 2015/0109153 A1* | 4/2015 | Wu | ........................ | H03M 7/30 341/65 |
| 2016/0173126 A1 | 6/2016 | Guilford et al. | | |
| 2016/0321076 A1* | 11/2016 | Satpathy | ........................ | G06F 9/30109 |
| 2017/0161362 A1 | 6/2017 | Bradbury et al. | | |
| 2018/0152200 A1* | 5/2018 | Guilford | ........................ | G06F 3/0647 |
| 2018/0152202 A1* | 5/2018 | Gopal | ........................ | H04L 41/0816 |
| 2018/0246645 A1* | 8/2018 | Havlik | ........................ | G06F 3/064 |
| 2018/0373808 A1* | 12/2018 | Gopal | ........................ | G06F 16/901 |
| 2019/0042249 A1* | 2/2019 | Suresh | ........................ | H04L 9/0668 |
| 2019/0042257 A1* | 2/2019 | Baum | ........................ | G06F 9/30036 |
| 2019/0391869 A1* | 12/2019 | Gopal | ........................ | H03M 7/3086 |
| 2020/0099958 A1* | 3/2020 | Satpathy | ........................ | H03M 7/4037 |

OTHER PUBLICATIONS

'A Beginner's Guide to RISC and CIDC Architectures' by Soham Chatterjee, Feb. 5, 2018. (Year: 2018).*
'TMS320C67x/C67x+ DSP CPU and Instruction Set Reference Guide' by Texas Instruments, Nov. 2006. (Year: 2006).*
Abdelfattah, Mohamed et al., "Gzip on a Chip: High Performance Lossless Data Compress on FPGAs Using OpenCL," IWOCL '14, May 2014, pp. 1-9.
Anonymous, "Compression of Data in Implanted Memory," IP.com No. IPCOM000219504D, Jul. 2012, pp. 1-4 (+ cover).
Anonymous, "Method, System and Computer Program Product for Energy Conservation Best Practice Management," IP.com No. IPCOM000198978D, Aug. 19, 2010, pp. 1-38 (+ cover).
Barr, Kenneth et al., "Energy Aware Lossless Data Compression," MobiSys 2003: The First International Conference on Mobile Systems, Applications, and Systems, May 2003, pp. 231-244.
Deutsch, P., "DEFLATE Compressed Data Format Specification Version 1.3," May 1996, pp. 1-15.
Gradis, Harwell et al., "Control System Life Cycle," IP.com No. IPCOM000217357D, Oct. 1995 (IP.com Electronic Publication Date: May 7, 2012), pp. 1-16 (+ cover).
IBM, "IBM zEnterprise Data Compression (zEDC)," 2015 (no further date information available), pp. 1-10.
IBM, "Method of Compressing Firmware Images," IP. com No. IPCOM000129862D, Oct. 7, 2005, p. 1 (+ cover).
IBM, "z/Architecture—Principles of Operation," IBM Publication No. SA22-7832-11, Twelfth Edition, Sep. 2017, pp. 1-1902.
Mell, Peter and Tim Grance, "The NIST Definition of Cloud Computing," National Institute of Standards and Technology, Information Technology Laboratory, Special Publication 800-145, Sep. 2011, pp. 1-7.
Giamei, Bruce C., et al., "General-Purpose Processor Instruction to Perform Compression/Decompression Operations," U.S. Appl. No. 16/263,735, filed Jan. 31, 2019, pp. 1-131.
List of IBM Patents or Patent Applications Treated as Related, Mar. 6, 2019, pp. 1-2.

* cited by examiner

DFLTCC 300
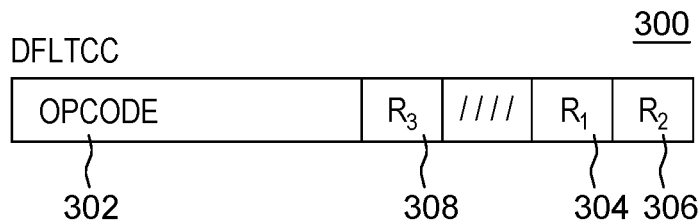
FIG. 3A
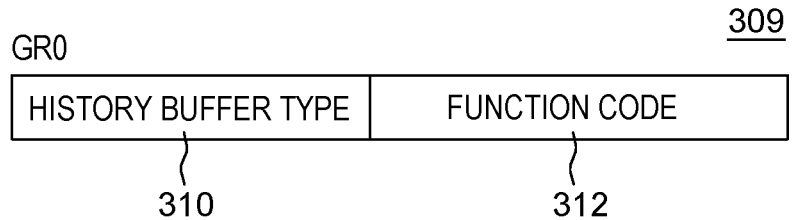
FIG. 3B
| | CODE | FUNCTION | PARAMETER BLOCK SIZE (BYTES) |
|---|---|---|---|
| 313 | 0 | DFLTCC - QAF | 32 |
| 315 | 1 | DFLTCC - GDHT | 384 |
| 317 | 2 | DFLTCC - CMPR | 1536 |
| 319 | 4 | DFLTCC - XPND | 1536 |
FIG. 3C
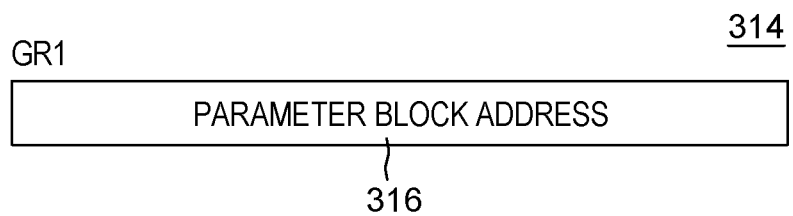
FIG. 3D
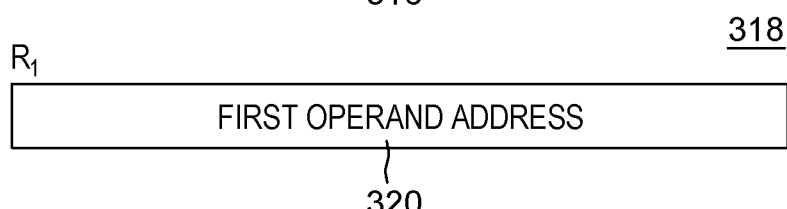
FIG. 3E
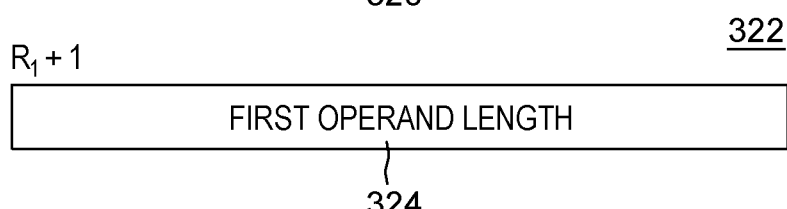
FIG. 3F

PARAMETER BLOCK FOR DFLTCC - CMPR + DFLTCC - XPND  370

| PARAMETER BLOCK VERSION NUMBER 362 | | | | | MODEL VERSION NUMBER 363 | | | CONTINUATION FLAG 373 | |
|---|---|---|---|---|---|---|---|---|---|
| NEW TASK 374 | CHECK VALUE TYPE 375 | HUFFMAN TABLE TYPE 376 | BLOCK CONT. FLAG 377 | BLOCK CLOSING CONTROL 378 | BLOCK HEADER FINAL 379 | DHTGC 364 | SUB-BYTE BOUNDARY 381 | OPER ENDING SUPP. CODE 365 | INCOMP FUNC STATUS 383 |
| | | | | | | | | | INCOMP FUNC LENGTH 384 |
| HISTORY LENGTH 385 | | | | HISTORY OFFSET 386 | | | | | |
| CHECK VALUE 387 | | | | END-OF-BLOCK SYMBOL 388 | | | END-OF-BLOCK LENGTH 389 | | |
| COMPRESSED DYNAMIC-HUFFMAN TABLE LENGTH 366 | | | | | | | | | |
| COMPRESSED DYNAMIC-HUFFMAN TABLE 367 | | | | | | | | | |
| CONTINUATION STATE BUFFER 392 | | | | | | | | | |

FIG. 3L

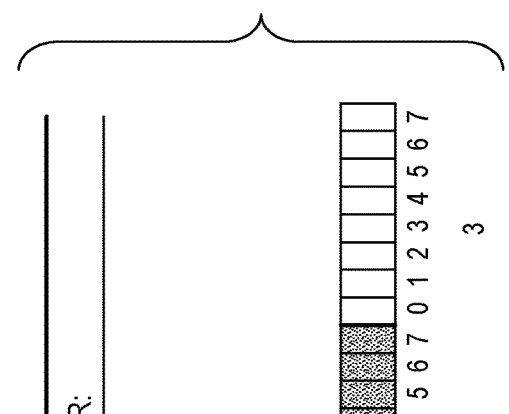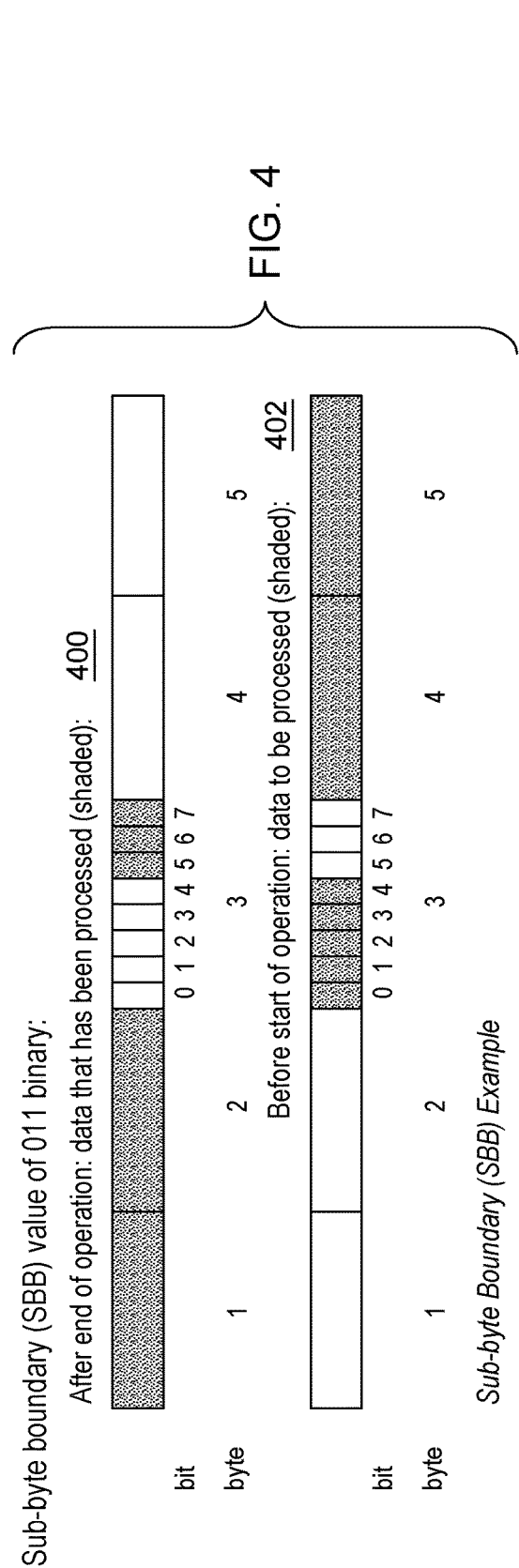

example 2:

| | before executing DFLTCC-CMPR: | after executing DFLTCC-CMPR: |
|---|---|---|
| GR R₁ | 1 | 2 |
| GR R₁+1 | 9 | 8 |
| NT | 0 | 0 |
| SBB | 6 | 2 |
| results generated | not applicable | 4 bits (shaded) | first operand:

bit  0 1 2 3 4 5 6 7 0 1 2 3 4 5 6 7 0 1 2 3 4 5 6 7 0 1 2 3 4 5 6 7
byte          1               2               3

FIG. 5B example 3:

| | before executing DFLTCC-CMPR: | after executing DFLTCC-CMPR: |
|---|---|---|
| GR R₁ | 1 | 1 |
| GR R₁+1 | 9 | 9 |
| NT | 0 | 0 |
| SBB | 1 | 7 |
| results generated | not applicable | 6 bits (shaded) | first operand:

bit  0 1 2 3 4 5 6 7 0 1 2 3 4 5 6 7 0 1 2 3 4 5 6 7 0 1 2 3 4 5 6 7
byte          1               2               3

600 stream 602 content: | 0 | 0 | f | | LEN$_{LSB}$ | LEN$_{MSB}$ | NLEN$_{LSB}$ | NLEN$_{MSB}$ | literal | literal | literal | literal | bit positions: $b_4$ $b_3$ $b_2$ $b_1$ $b_0$ | $b_{12}$ $b_{11}$ $b_{10}$ $b_9$ $b_8$ $b_7$ $b_6$ $b_5$ | $b_{20}$ $b_{19}$ $b_{18}$ $b_{17}$ $b_{16}$ $b_{15}$ $b_{14}$ $b_{13}$ | ... | $b_{60}$ $b_{59}$ $b_{58}$ $b_{57}$ $b_{56}$ $b_{55}$ $b_{54}$ $b_{53}$ bit: 0 1 2 3 4 5 6 7 | 0 1 2 3 4 5 6 7 | ... | 0 1 2 3 4 5 6 7 byte: 0 | 1 | 2 | 3 | 4 | 5 | 6 | 7

Explanation:
- b    Bits of the stream processed in order of subscripts, starting with $b_0$
- f    Block header final bit (BFINAL)
- LEN  Number of bytes in the block with literal data
- NLEN The one's complement of LEN
- LSB  Least Significant Byte
- MSB  Most Significant Byte
- literal  uncompressed byte of data

*Block Type 00 (no compression) Example*

FIG. 7

700 stream 702 content: | s | s | 0 | 1 | f | | s s s s s s s s | s s s s s s s s | ... | e e s s s s s s | e e e e e e e e | bit positions: $b_4$ $b_3$ $b_2$ $b_1$ $b_0$ | $b_{12}$ $b_{11}$ $b_{10}$ $b_9$ $b_8$ $b_7$ $b_6$ $b_5$ | $b_{20}$ $b_{19}$ $b_{18}$ $b_{17}$ $b_{16}$ $b_{15}$ $b_{14}$ $b_{13}$ | ... | $b_{60}$ $b_{59}$ $b_{58}$ $b_{57}$ $b_{56}$ $b_{55}$ $b_{54}$ $b_{53}$ | $b_{89}$ $b_{88}$ $b_{87}$ $b_{86}$ $b_{85}$ bit: 0 1 2 3 4 5 6 7 | 0 1 2 3 4 5 6 7 | ... | 0 1 2 3 4 5 6 7 | 0 1 2 3 4 5 6 7 byte: 0 | 1 | 2 | 3 | 4 | ... | 10 | 11

Explanation:
- b    Bits of the stream processed in order of subscripts, starting with $b_0$
- f    Block header final bit (BFINAL)
- s    A bit of a compressed data symbol
- e    A bit of the end-of-block (EOB) symbol

*Block Type 01 (compressed data using FHT) Example*

```
1000
1002  IABLK1   L       1,PBLKADDR    Load parameter block address into GR1
              ILL      0,2           Set GR0(56:63)=02 for DFLTCC-CMPR function
              L        2,CDSBADDR    Load compressed data set output address into GR2
              L        4,UD1ADDR     Load uncompressed data input address into GR4
              DFLTCC   2,4,10        Compress data into block1
              BRC      1,IABLK1      If operation ends with CC=3, branch back to resume the operation
              ...
1004  IABLK2   L       6,UD2ADDR     Load next uncompressed data input address into GR6
              DFLTCC   2,6,10        Compress data into block2
              BRC      1,IABLK2      If operation ends with CC=3, branch back to resume the operation
              ...
      IABLK3   L       8,UD3ADDR     Load next uncompressed data input address into GR8
              DFLTCC   2,8,10        Compress data into block3
              BRC      1,IABLK3      If operation ends with CC=3, branch back to resume the operation
              ...
```

FIG. 10

*Sample of a Program Compressing Data into Three Blocks of a Compressed Data Set*

| parameter block field 1100 | field value at start of operation 1102 | field value at end of operation when condition code 1, 2, or 3 is set (also the value at the start of resuming the operation) 1104 | field value at end of operation when condition code 0 is set 1106 |
|---|---|---|---|
| new task (NT) | 1 (specified by the program) | 0 | 0 |
| continuation flag (CF) | initialized to zero by the program | 1 | 0 |
| continuation state buffer (CSB) | initialized to all zeros by the program | internal-state data recorded at the end of the operation, which is required when the operation later resumes | undefined |
| check value | treated as an initial value, since NT is one | value generated from portion of data processed since the start of the operation and starting value for resuming the operation | value generated from all data processed by the operation and starting value for a subsequent operation |
| sub-byte boundary (SBB) | treated as equal to zero, since NT is one | applies to the last byte processed by the operation and the first byte when the operation later resumes | applies to the last byte processed by the operation and the first byte for a subsequent operation |

FIG. 11

*Parameter Block Contents for a DFLTCC-CMPR Function Operating on the First Compressed Data Block of a Set*

| parameter block field | field value at start of operation | field value at end of operation when condition code 1, 2, or 3 is set (also the value at the start of resuming the operation) | field value at end of operation when condition code 0 is set |
|---|---|---|---|
| new task (NT) | 0 (specified by the program) | 0 | 0 |
| continuation flag (CF) | initialized to zero by the program | 1 | 0 |
| continuation state buffer (CSB) | initialized to all zeros by the program | internal-state data recorded at the end of the operation, which is required when the operation later resumes | undefined |
| check value | value generated from prior operation (preserved by the program) | value generated from portion of data processed since the start of the current operation and starting value for resuming the current operation | value generated from all data processed by the operation and starting value for a subsequent operation |
| sub-byte boundary (SBB) | value associated with last byte processed by the prior operation (preserved by the program) | applies to the last byte processed by the current operation and the first byte when the current operation later resumes | applies to the last byte processed by the operation and the first byte for a subsequent operation |

FIG. 12

*Parameter Block Contents for a DFLTCC-CMPR Function Operating on the Second Compressed Data Block of a Set*

```
        1300

L       1,PBLKADDR    Load parameter block address into GR1
        ILL     0,4           Set GR0(56:63)=04 for DFLTCC-XPND function
        L       2,UDADDR      Load uncompressed data output address into GR2
        L       4,CDSBADDR    Load compressed data set input address into GR4
IASET   DFLTCC  2,4,10        Uncompress all blocks of the data set
        BRC     1,IASET       If operation ended with CC=3, branch back to resume the operation
        ...
```

FIG. 13

*Sample of a Program Uncompressing Data from a Compressed Data Set* before DFLTCC-CMPR execution number 1:     HL=0

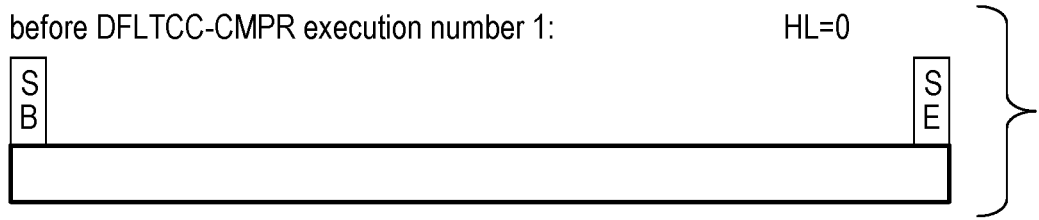

FIG. 14A during DFLTCC-CMPR execution number 1:     BP=10K
after DFLTCC-CMPR execution number 1:      HL=10K

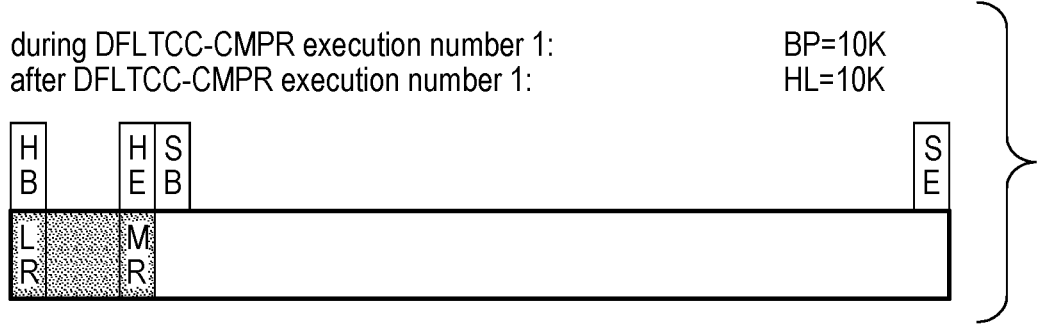

FIG. 14B during DFLTCC-CMPR execution number 2:     BP=40K
after DFLTCC-CMPR execution number 2:      HL=32K

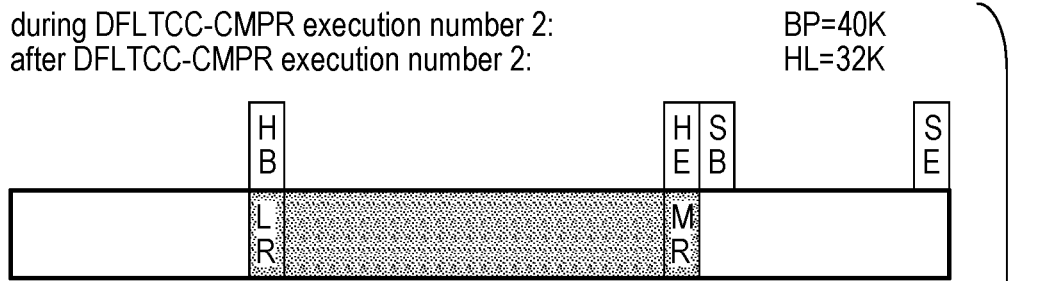

Explanation:
shaded areas: bytes of history
SB    source-begin address: location specified by $R_2$
SE    source-end address: location specified by
      $R_2 + (R_2 + 1) - 1$
HB    history-begin address: location specified by $R_2$ - HL
HE    history-end address: location specified by $R_2$ - 1
LR    least recently processed byte in history
MR    most recently processed byte in history
BP    bytes of uncompressed data processed
HL    history length

*In-line History before and after executing DFLTCC-CMPR multiple times*

FIG. 14C

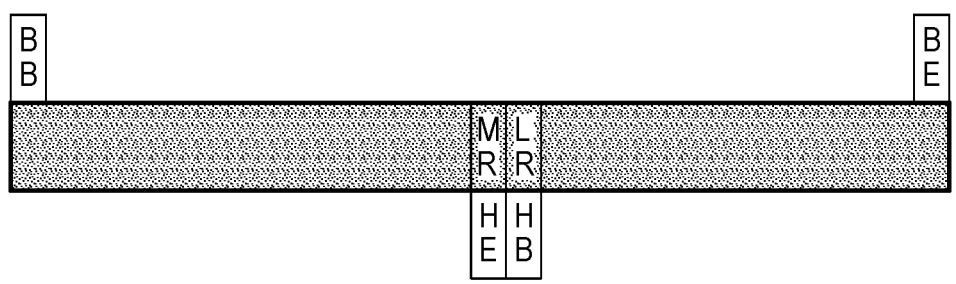

during DFLTCC execution number 4: BP=10K
after DFLTCC execution number 4: HO=18K    HL=32K

Explanation:

shaded areas: bytes of history within the circular history buffer
BB     buffer-begin address: location specified by $R_3$
BE     buffer-end address: location specified by $R_3 + 32K - 1$
HB     history-begin address: location specified by $R_3 + HO$
HE     history-end address: location specified by
          $R_3 + modulo32K(HO + HL - 1)$
LR     least recently processed byte in history
MR     most recently processed byte in history
BP     bytes of uncompressed data processed
HO     history offset
HL     history length

*Circular History Buffer before and after executing DFLTCC multiple times*

FIG. 15E before DFLTCC-XPND execution number 1:         HL=0

FIG. 16A during DFLTCC-XPND execution number 1:         BP=10K
after DFLTCC-XPND execution number 1:         HL=10K

FIG. 16B during DFLTCC-XPND execution number 2:         BP=40K
after DFLTCC-XPND execution number 2:         HL=32K

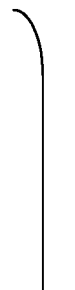

Explanation:

shaded areas: bytes of history
TB     target-begin address: location specified by $R_1$
TE     target-end address: location specified by
       $R_1 + (R_1 + 1) - 1$
HB    history-begin address: location specified by $R_1 - HL$
HE    history-end address: location specified by $R_1 - 1$
LR    least recently processed byte in history
MR   most recently processed byte in history
BP    bytes of uncompressed data processed
HL    history length

*In-line History before and after executing DFLTCC-XPND multiple times*

FIG. 16C

```
┌─────────────────────────────────────────────────────────────────────────┐
│  ┌───────────────────────────────────────────────────────────────────┐  │
│  │ OBTAIN, BY A PROCESSOR OF THE COMPUTING ENVIRONMENT, AN INSTRUCTION│ │
│  │ TO PERFORM A FUNCTION OF A PLURALITY OF FUNCTIONS SUPPORTED BY THE │ │
│  │ INSTRUCTION ~1900                                                 │  │
│  │                                                                   │  │
│  │      THE INSTRUCTION IS A SINGLE ARCHITECTED INSTRUCTION OF AN    │  │
│  │      INSTRUCTION SET ARCHITECTURE THAT COMPLIES TO AN INDUSTRY    │  │
│  │      STANDARD FOR COMPRESSION ~1904                               │  │
│  │                                                                   │  │
│  │ EXECUTE THE INSTRUCTION, THE EXECUTING INCLUDES ~1906             │  │
│  │                                                                   │  │
│  │      PERFORMING THE FUNCTION SPECIFIED BY THE INSTRUCTION ~1908   │  │
│  │                                                                   │  │
│  │           THE PERFORMING, BASED ON THE FUNCTION BEING A           │  │
│  │           COMPRESSION FUNCTION OR A DECOMPRESSION FUNCTION,       │  │
│  │           INCLUDES TRANSFORMING STATE OF INPUT DATA BETWEEN AN    │  │
│  │           UNCOMPRESSED FORM OF THE INPUT DATA AND A COMPRESSED    │  │
│  │           FORM OF THE INPUT DATA TO PROVIDE A TRANSFORMED STATE   │  │
│  │           OF DATA ~1910                                           │  │
│  │                                                                   │  │
│  │           ACCESS, DURING PERFORMING THE FUNCTION, HISTORY         │  │
│  │           RELATING TO THE FUNCTION, THE HISTORY TO BE USED IN     │  │
│  │           TRANSFORMING THE STATE OF THE INPUT DATA BETWEEN THE    │  │
│  │           UNCOMPRESSED FORM AND THE COMPRESSED FORM ~1912         │  │
│  │                                                                   │  │
│  │           PROVIDE AS OUTPUT THE TRANSFORMED STATE OF DATA TO BE   │  │
│  │           USED IN PERFORMING A TASK ~1914                         │  │
│  └───────────────────────────────────────────────────────────────────┘  │
│                                                                         │
│  ┌───────────────────────────────────────────────────────────────────┐  │
│  │ THE PROCESSOR IS A GENERAL-PURPOSE PROCESSOR ~1916                │  │
│  └───────────────────────────────────────────────────────────────────┘  │
│                                                                         │
│  ┌───────────────────────────────────────────────────────────────────┐  │
│  │ THE TRANSFORMING THE STATE OF THE INPUT DATA USES A COMPRESSION   │  │
│  │ FORMAT THAT COMPLIES WITH THE INDUSTRY STANDARD ~1918             │  │
│  └───────────────────────────────────────────────────────────────────┘  │
│                                                                         │
│  ┌───────────────────────────────────────────────────────────────────┐  │
│  │ THE HISTORY IS STORED IN A BUFFER SPECIFIED BY THE INSTRUCTION~1920│ │
│  └───────────────────────────────────────────────────────────────────┘  │
└─────────────────────────────────────────────────────────────────────────┘
```

FIG. 19A

THE INSTRUCTION INCLUDES AN OPERATION CODE FIELD THAT INCLUDES AN OPERATION CODE TO SPECIFY AN OPERATION AND A PLURALITY OF REGISTER FIELDS TO SPECIFY A PLURALITY OF REGISTERS TO BE USED BY THE INSTRUCTION —1922

THE PLURALITY OF REGISTERS INCLUDES ONE REGISTER USED TO IDENTIFY AN OUTPUT OPERAND LOCATION TO BE USED BY THE INSTRUCTION AS AN OUTPUT, AND ANOTHER REGISTER USED TO IDENTIFY AN INPUT OPERAND LOCATION TO BE USED BY THE INSTRUCTION AS AN INPUT —1924

THE INSTRUCTION USES A SELECTED REGISTER TO SPECIFY A LOCATION IN MEMORY OF THE BUFFER AND ANOTHER SELECTED REGISTER TO PROVIDE AN ADDRESS OF A PARAMETER BLOCK TO BE USED BY THE INSTRUCTION —1926

THE PARAMETER BLOCK SPECIFIES AN OFFSET WITHIN THE BUFFER WHICH DESIGNATES A BEGINNING OF THE HISTORY WITHIN THE BUFFER —1928

THE PARAMETER BLOCK FURTHER INCLUDES A LENGTH OF THE HISTORY WITHIN THE BUFFER —1930

THE INSTRUCTION USES A CHOSEN REGISTER TO SPECIFY A TYPE OF THE BUFFER —1932

THE TYPE OF THE BUFFER IS A CIRCULAR BUFFER —1934

THE INPUT DEPENDS ON THE FUNCTION —1936

BASED ON THE FUNCTION BEING THE COMPRESSION FUNCTION, THE INPUT INCLUDES DATA FROM THE INPUT OPERAND LOCATION TO BE ENCODED TO PROVIDE COMPRESSED DATA SYMBOLS STORED TO THE OUTPUT OPERAND LOCATION AND COPIED AS HISTORY STORED TO THE BUFFER FROM THE INPUT OPERAND LOCATION —1938

BASED ON THE FUNCTION BEING THE DECOMPRESSION FUNCTION, THE INPUT INCLUDES THE COMPRESSED DATA SYMBOLS FROM THE INPUT OPERAND LOCATION TO BE DECODED TO PROVIDE UNCOMPRESSED DATA STORED TO THE OUTPUT OPERAND LOCATION AND TO THE BUFFER —1940

FIG. 19B

COMPRESSION/DECOMPRESSION INSTRUCTION SPECIFYING A HISTORY BUFFER TO BE USED IN THE COMPRESSION/DECOMPRESSION OF DATA

BACKGROUND

One or more aspects relate, in general, to facilitating processing within a computing environment, and in particular, to facilitating processing of compression and decompression operations.

In one or more computing environments, a compressed form of information, rather than the original, uncompressed form, is maintained on storage devices. The compressed form occupies less bytes than the original form. As a result, transmitting and maintaining a compressed form of information requires less time and space, respectively, compared to performing the same functions with the original form of the information.

In such environments, an operating system (OS) provides a mechanism to perform the compressing and decompressing operations. In one example, to provide these operations, the operating system incorporates a zlib open-source software library, which adheres to the DEFLATE standard compression technique, specified in the IETF (Internet Engineering Task Force) RFC (Request for Comments) 1951 specification. The mechanism may include a software implementation in which a user executes many instructions on a general-purpose processor to perform the compressing or decompressing, or it may use a special purpose hardware implementation that is connected to an input/output (I/O) port of a system, in which an I/O device performs the operations.

SUMMARY

Shortcomings of the prior art are overcome and additional advantages are provided through the provision of a computer program product for facilitating processing within a computing environment. The computer program product includes a computer readable storage medium readable by a processing circuit and storing instructions for performing a method. The method includes obtaining, by a processor of the computing environment, an instruction to perform a function of a plurality of functions supported by the instruction. The instruction is a single architected instruction of an instruction set architecture that complies to an industry standard for compression. The instruction is executed, and the executing includes performing the function specified by the instruction. The performing, based on the function being a compression function or a decompression function, includes transforming state of input data between an uncompressed form of the input data and a compressed form of the input data to provide a transformed state of data. During performing the function, history relating to the function is accessed. The history is to be used in transforming the state of the input data between the uncompressed form and the compressed form. The transformed state of data is to be provided as output to be used in performing a task.

By using history to process data in, for instance, performing a compression or decompression function, the effectiveness of performing the function, including, for instance, detecting duplicate strings as part of performing the function, is improved, resulting in improved overall compression ratios.

In one example, the processor is a general-purpose processor. Further, in one example, the transforming the state of the input data uses a compression format that complies with the industry standard.

By using a single architected instruction dispatched on a general-purpose processor to perform a compression and/or decompression function (also referred to as an operation), a significant subset of primitive software instructions to perform those functions is replaced by the single architected instruction. The replacement of those primitive instructions with a single architected instruction reduces program complexity and eliminates the need to include code to optimize the primitive instructions. Overall performance is improved. Further, by not dispatching the operations to an input/output device, the operating system avoids task switches while waiting for the I/O device to perform the operation.

In one embodiment, the history is stored in a buffer specified by the instruction. The instruction includes an operation code field that includes an operation code to specify an operation and a plurality of register fields to specify a plurality of registers to be used by the instruction. The plurality of registers includes, for instance, one register used to identify an output operand location to be used by the instruction as an output, and another register used to identify an input operand location to be used by the instruction as an input.

The instruction uses, in one example, a selected register to specify a location in memory of the buffer and another selected register to provide an address of a parameter block to be used by the instruction. The parameter block specifies an offset within the buffer which designates a beginning of the history within the buffer. Further, in one example, the parameter block includes a length of the history within the buffer, and the instruction uses a chosen register to specify a type of the buffer. The type of the buffer is, for instance, a circular buffer.

By using a separate buffer for the history (e.g., a circular buffer), more history may be input to the operation than would be available with just using, for instance, in-line history.

In one embodiment, the input depends on the function, wherein based on the function being the compression function, the input includes data from the input operand location to be encoded to provide compressed data symbols stored to the output operand location and copied as history stored to the buffer from the input operand location, and wherein based on the function being the decompression function, the input includes the compressed data symbols from the input operand location to be decoded to provide uncompressed data stored to the output operand location and to the buffer.

Computer-implemented methods and systems relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIG. 3A depicts one format of a DEFLATE Conversion Call (DFLTCC) instruction, in accordance with an aspect of the present invention;

FIG. 3B depicts one example of fields of an implied register, general register 0, used by the DEFLATE Conversion Call instruction, in accordance with an aspect of the present invention;

FIG. 3C depicts one example of function codes for the DEFLATE Conversion Call instruction, in accordance with an aspect of the present invention;

FIG. 3D depicts one example of a field of an implied register, general register 1, used by the DEFLATE Conversion Call instruction, in accordance with an aspect of the present invention;

FIG. 3E depicts one example of contents of a register, $R_1$, specified by the DEFLATE Conversion Call instruction, in accordance with an aspect of the present invention;

FIG. 3F depicts one example of contents of a register, $R_1+1$, used by the DEFLATE Conversion Call instruction, in accordance with an aspect of the present invention;

FIG. 3L depicts one example of contents of a parameter block used by the DFLTCC-CMPR (compress) and DFLTCC-XPND (expand) functions of the DEFLATE Conversion Call instruction, in accordance with an aspect of the present invention;

FIG. 4 depicts one example of a sub-byte boundary, in accordance with one or more aspects of the present invention;

FIGS. 5A-5C depict examples illustrating how a sub-byte boundary applies to the DFTLCC-CMPR function, in accordance with an aspect of the present invention;

FIG. 6 depicts one example of a block of data with no compression, in accordance with an aspect of the present invention;

FIG. 7 depicts one example of a block with compressed data using a fixed-Huffman table (FHT), in accordance with an aspect of the present invention;

FIG. 10 depicts one example of a sample of a program compressing data into three blocks of a compressed data set, in accordance with an aspect of the present invention;

FIG. 11 depicts one example of parameter block contents for a DFLTCC-CMPR function operating on a first compressed data block of a set, in accordance with an aspect of the present invention;

FIG. 12 depicts one example of parameter block contents for a DFLTCC-CMPR function operating on a second compressed data block of a set, in accordance with an aspect of the present invention;

FIG. 13 depicts one example of a sample of a program decompressing data from a compressed data set, in accordance with an aspect of the present invention;

FIGS. 14A-14C depict examples of an in-line history buffer before and after executing DFLTCC-CMPR multiple times, in accordance with an aspect of the present invention;

FIGS. 15A-15E depict examples of a circular history buffer before and after executing DFLTCC multiple times, in accordance with an aspect of the present invention;

FIGS. 16A-16C depict examples of an in-line history buffer before and after executing DFLTCC-XPND multiple times, in accordance with an aspect of the present invention;

FIGS. 19A-19B depict one example of facilitating processing within a computing environment, in accordance with an aspect of the present invention;

DETAILED DESCRIPTION

In accordance with an aspect of the present invention, a capability is provided to facilitate processing within a computing environment. As one example, a single instruction (e.g., a single architected hardware machine instruction at the hardware/software interface) is provided to perform a function (also referred to as an operation), such as a compression or decompression function, to compress and/or decompress (also referred to as uncompress) data. The instruction is part of a general-purpose processor instruction set architecture (ISA), which is dispatched by a program (e.g., an operating system or a user program) on the general-purpose processor. By using an ISA instruction to perform compression/decompression, task switches by the operating system are not needed to perform the compression/decompression operations, thereby saving execution cycles. Further, by using a single instruction to compress and/or decompress data, execution time within a processor, such as a general-purpose processor, is reduced.

In one example, the instruction performs compressing and uncompressing operations compliant with an industry standard, referred to as the DEFLATE standard, and the instruction is referred to as a DEFLATE Conversion Call instruction. The DEFLATE standard includes descriptions for compressed data symbols which represent duplicate strings in the original form of the data (in the uncompressed form of the data). Such symbols include a pointer and a length of a duplicate string which describe the location and length of the duplicate string, which was previously processed, in relationship to the current location of data being processed. The previously processed uncompressed form of the data is referred to as history. In one example, the history is a contiguous number of bytes in memory, which can be as large as, for instance, 32 K-bytes.

In one aspect, the history is placed into a separate buffer (e.g., a circular buffer) which the instruction uses (e.g., in addition to or in lieu of in-line history which is a portion of the data stream in the uncompressed/original form). The circular history buffer provides the ability to present more history as an input to the operation than would be available with the use of just in-line history.

Figure 1A:
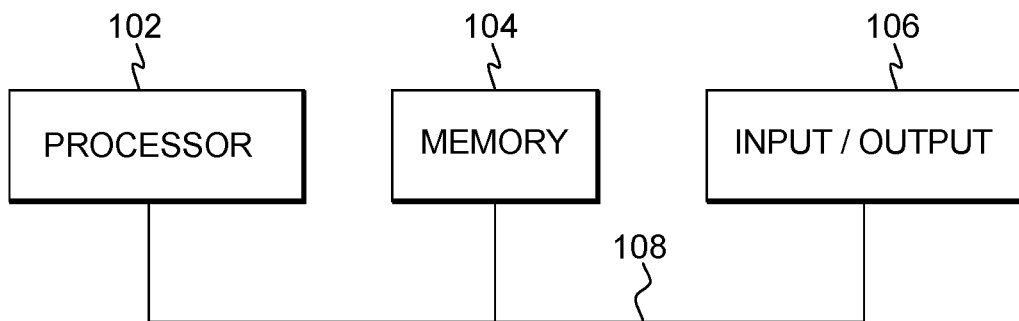
FIG. 1A depicts one example of a computing environment to incorporate and use one or more aspects of the present invention.

One embodiment of a computing environment to incorporate and use one or more aspects of the present invention is described with reference to FIG. 1A. A computing environment 100 includes, for instance, a processor 102 (e.g., a central processing unit), a memory 104 (e.g., main memory; a.k.a., system memory, main storage, central storage, storage), and one or more input/output (I/O) devices and/or interfaces 106 coupled to one another via, for example, one or more buses 108 and/or other connections.

In one example, processor 102 is based on the z/Architecture® hardware architecture offered by International Business Machines Corporation, Armonk, N.Y., and is part of a server, such as an IBM Z® server, which is also offered by International Business Machines Corporation and implements the z/Architecture hardware architecture. One embodiment of the z/Architecture hardware architecture is described in a publication entitled, "z/Architecture Principles of Operation," IBM Publication No. SA22-7832-11, 12$^{th}$ edition, Sep. 2017, which is hereby incorporated herein by reference in its entirety. The z/Architecture hardware architecture, however, is only one example architecture; other architectures and/or other types of computing environments may include and/or use one or more aspects of the present invention. In one example, the processor executes an operating system, such as the z/OS® operating system, also offered by International Business Machines Corporation.

Figure 1B:
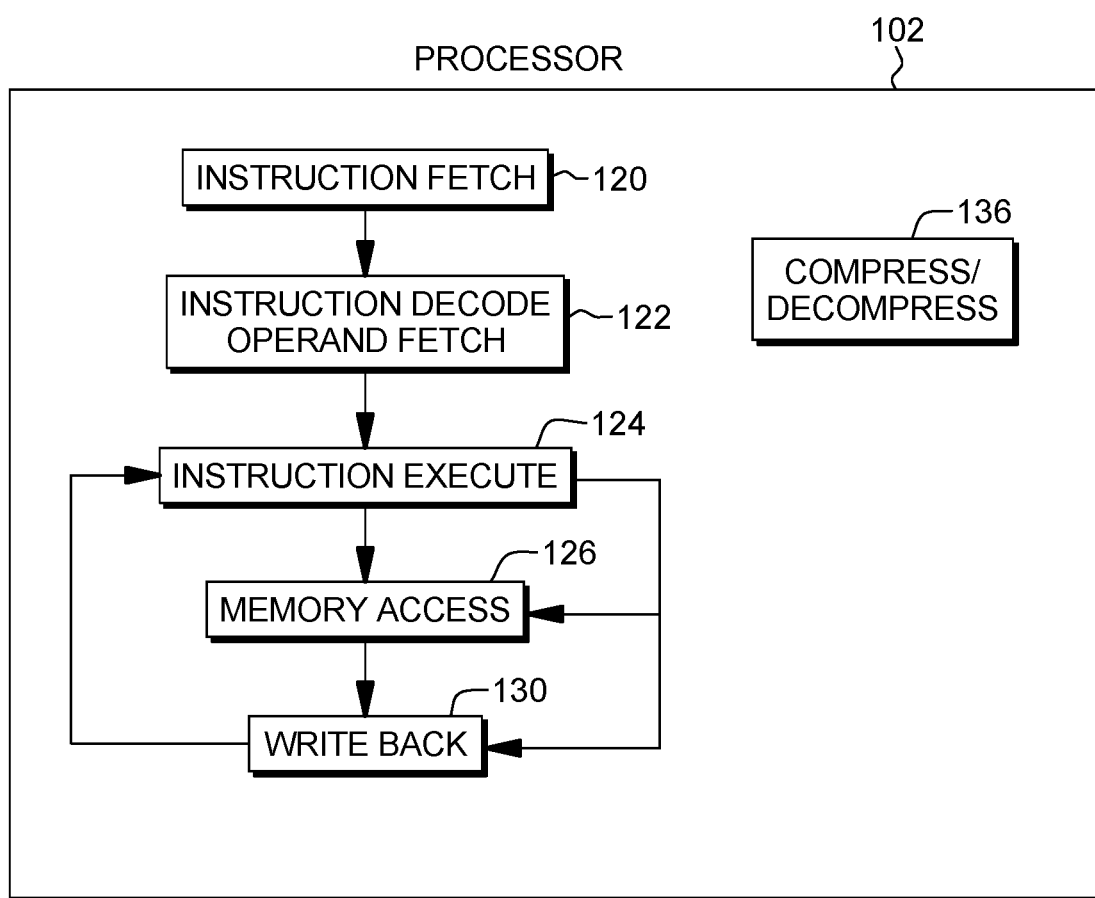
FIG. 1B depicts further details of a processor of FIG. 1A, in accordance with one or more aspects of the present invention.

Processor 102 includes a plurality of functional components used to execute instructions. As depicted in FIG. 1B, these functional components include, for instance, an instruction fetch component 120 to fetch instructions to be executed; an instruction decode unit 122 to decode the fetched instructions and to obtain operands of the decoded instructions; an instruction execute component 124 to execute the decoded instructions; a memory access component 126 to access memory for instruction execution, if necessary; and a write back component 130 to provide the results of the executed instructions. One or more of these components may, in accordance with one or more aspects of the present invention, include at least a portion of or have access to one or more other components used in compress/decompress processing (or other processing that may use one or more aspects of the present invention), as described herein. The one or more other components include, for instance, a compress/decompress component (or other component) 136.

Another example of a computing environment to incorporate and use one or more aspects of the present invention is described with reference to FIG. 2. In one example, the computing environment is based on the z/Architecture hardware architecture; however, the computing environment may be based on other architectures offered by International Business Machines Corporation or others.

Figure 2:
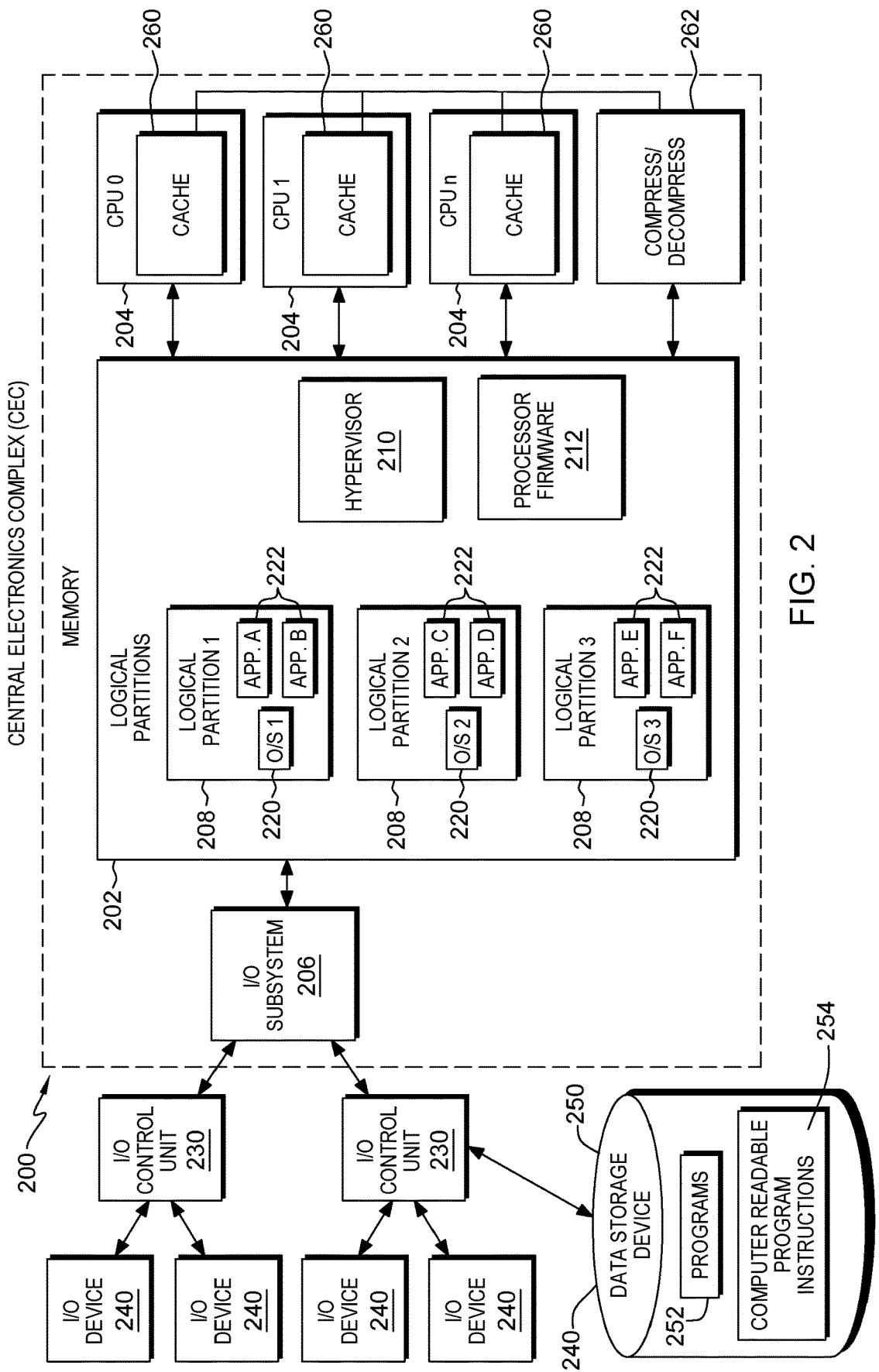
FIG. 2 depicts another example of a computing environment to incorporate and use one or more aspects of the present invention.

Referring to FIG. 2, in one example, the computing environment includes a central electronics complex (CEC) 200. CEC 200 includes a plurality of components, such as, for instance, a memory 202 (a.k.a., system memory, main memory, main storage, central storage, storage) coupled to one or more processors (a.k.a., central processing units (CPUs)) 204, and to an input/output subsystem 206.

Memory 202 includes, for example, one or more logical partitions 208, a hypervisor 210 that manages the logical partitions, and processor firmware 212. One example of hypervisor 210 is the Processor Resource/System Manager (PR/SM™) hypervisor, offered by International Business Machines Corporation, Armonk, N.Y. As used herein, firmware includes, e.g., the microcode of the processor. It includes, for instance, the hardware-level instructions and/or data structures used in implementation of higher level machine code. In one embodiment, it includes, for instance, proprietary code that is typically delivered as microcode that includes trusted software or microcode specific to the underlying hardware and controls operating system access to the system hardware.

Each logical partition 208 is capable of functioning as a separate system. That is, each logical partition can be independently reset, run a guest operating system 220 such as a z/OS operating system, or another operating system, and operate with different programs 222. An operating system or application program running in a logical partition appears to have access to a full and complete system, but in reality, only a portion of it is available.

Memory 202 is coupled to processors (e.g., CPUs) 204, which are physical processor resources that may be allocated to the logical partitions. For instance, a logical partition 208 includes one or more logical processors, each of which represents all or a share of a physical processor resource 204 that may be dynamically allocated to the logical partition.

Further, memory 202 is coupled to I/O subsystem 206. I/O subsystem 206 may be a part of the central electronics complex or separate therefrom. It directs the flow of information between main storage 202 and input/output control units 230 and input/output (I/O) devices 240 coupled to the central electronics complex.

Many types of I/O devices may be used. One particular type is a data storage device 250. Data storage device 250 may store one or more programs 252, one or more computer readable program instructions 254, and/or data, etc. The computer readable program instructions may be configured to carry out functions of embodiments of aspects of the invention.

As one example, each processor 204 includes at least one cache 260 (e.g., a local cache) of a cache hierarchy that includes a plurality of levels of cache, including one or more local caches and/or one or more shared caches. Further, in one embodiment, the local caches and memory 202 are coupled to a compress/decompress component (or other component) 262 used in performing one or more of compressing and/or decompressing of data (and/or other operations of one or more aspects of the present invention). In various examples, there may be one or more components performing these tasks. Many variations are possible.

In one embodiment, a processor (e.g., processor 204) obtains the instruction (e.g., the DEFLATE Conversion Call instruction), decodes the instruction, performs set-up for the instruction, including translating addresses to be used by the instruction, and sends commands for the instruction to a component coupled to the processor, such as component 262, to perform a function specified by the instruction. Component 262 has access to the cache hierarchy and memory, such that in performing the specified function, it reads data, processes it and stores the processed data back. As an example, component 262 is a hardware component.

In a further embodiment, at least a portion of component 262 is included as part of the processor. Many variations are possible.

Central electronics complex 200 may include and/or be coupled to removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with central electronics complex 200. Examples include, but are not limited to: microcode, device drivers, redundant processing units, external disk drive arrays, RAID systems, tape drives, and data archival storage systems, etc.

Further, central electronics complex 200 may be operational with numerous other general purpose or special purpose computing system environments or configurations. Examples of well-known computing systems, environments, and/or configurations that may be suitable for use with central electronics complex 200 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Although various examples of computing environments are described herein, one or more aspects of the present invention may be used with many types of environments. The computing environments provided herein are only examples.

In accordance with an aspect of the present invention, a computing environment, such as computing environment 100 or central electronics complex 200, employs a conversion facility that provides a mechanism to compress and decompress data. In one example, the conversion facility is a DEFLATE conversion facility that provides a mechanism to compress and decompress data using the DEFLATE compressed data format. In one example, the conversion facility is installed in the system when a facility indicator is set, e.g., to one. As one particular example of the z/Architecture hardware architecture, facility bit 151 is set to, e.g., one, when the conversion facility is installed in the z/Architecture architectural mode. The facility includes, for instance, the DEFLATE Conversion Call instruction, an embodiment of which is described below.

In one example, the DEFLATE Conversion Call instruction performs functions related to transforming the state of data between the original (uncompressed) form of the data, and a compressed representation of the data, as specified by a selected standard, such as the IETF (Internet Engineering Task Force) RFC (Request for Comments) 1951 specification, which is described in the DEFLATE Compressed Data Format Specification version 1.3 Internet Engineering Task Force, Request for Comments 1951, May 1996.

In one example, the uncompressed data is a sequence of bytes, and the compressed representation of the data includes symbols. Symbols represent an individual byte of uncompressed data, referred to as a literal byte, or represent a reoccurring sequence of bytes of uncompressed data, referred to as a duplicate string. A Huffman table, as an example, specifies the encoding and decoding between compressed data symbols and uncompressed data. There are two types of Huffman tables: a fixed-Huffman table (FHT), which is a predetermined specification which includes, for instance, all possible codings; and a dynamic-Huffman table (DHT), which is a set of codings created specifically for the data to be compressed, which may be a subset of all possible codings. A compressed representation of data generated with a DHT is typically smaller than a compressed representation of the same data generated with an FHT. A portion of the most recently processed uncompressed data, referred to as history, is maintained for encoding and decoding compressed data symbols representing duplicate strings. The history is the reference source for duplicate strings. The history is updated as data is processed during an operation.

As indicated, in one example, the DEFLATE Conversion Call instruction uses the DEFLATE compressed data format, which is described in RCF 1951, DEFLATE Compressed Data Format Specification version 1.3. Attributes of the DEFLATE standard which apply to the DEFLATE Conversion Call instruction include, for instance:

A compressed data set includes a series of blocks. There are three types of blocks. One type includes a 3-bit header followed by length information and uncompressed data, and two types of blocks include a 3-bit header followed by compressed data elements.

Compressed data elements may include a compressed representation of a dynamic-Huffman table, compressed data symbols, and an end-of-block (EOB) symbol.

Compressed data elements have various bit lengths.

Compressed data elements may begin or end between byte boundaries in storage.

Compressed data elements are loaded into bytes in order from, e.g., the rightmost bit position to the leftmost bit position.

When a compressed data element occupies part of, and not all of, a byte in storage, the entire byte in storage is accessed. Storage operand lengths specify the number of addressable bytes, which may specify more bits than the compressed data occupies.

Additional details regarding compressed data blocks are described further below.

One embodiment of the DEFLATE Conversion Call (DFLTCC) instruction is described with reference to FIGS. 3A-3L. The instruction is executed, in one example, using a general-purpose processor (e.g., processor 102 or 204). In the description herein, specific locations, specific fields and/or specific sizes of the fields are indicated (e.g., specific bytes and/or bits). However, other locations, fields and/or sizes may be provided. Further, although the setting of a bit to a particular value, e.g., one or zero, is specified, this is only an example. The bit may be set to a different value, such as the opposite value or to another value, in other examples. Many variations are possible.

In one embodiment, a program (e.g., an operating system or user program) may execute the DEFLATE Conversion Call instruction multiple times to compress or uncompress a single data stream. For instance, when an application compresses or decompresses a large data stream (e.g., greater than 1 M-bytes), the operation may include multiple calls to compress or decompress buffered portions of the data stream. In accordance with one aspect of the present invention, a program declares a buffer (e.g., a 32 K-byte buffer), which is used to accumulate the history of uncompressed data processed during an operation which spans multiple executions of the DEFLATE Conversion Call instruction. The buffer is referred to as a circular history buffer, which is defined using the DEFLATE Conversion Call instruction, as described herein.

Referring to FIG. 3A, in one example, a format of a DEFLATE Conversion Call (DFLTCC) instruction 300 is an RRF format that denotes a register and register operation with an extended operation code (opcode) field and an additional register field. As an example, the instruction includes an operation code field 302 (e.g., bits 0-15) having an operation code indicating a DEFLATE Conversion Call operation; a first register field ($R_1$) 304 (e.g., bits 24-27) designating a first pair of general registers; a second register field ($R_2$) 306 (e.g., bits 28-31) designating a second pair of general registers; and a third register field ($R_3$) 308 (e.g., bits 16-19) designating a third general register. The contents of a register designated by $R_1$ field 304 specify a location of a first operand (in storage); the contents of a register designated by $R_2$ field 306 specify a location of a second operand (in storage); and the contents of a register designated by $R_3$ field 308 specify a location of a third operand (in storage). The contents of $R_1+1$ specify the length of the first operand, and the contents of $R_2+1$ specify the length of the second operand. In one example, bits 20-23 of the instruction are reserved and should contain zeros; otherwise, the program may not operate compatibly in the future. As used herein, the program is the one issuing the DEFLATE Conversion Call instruction. It may be a user program, an operating system or another type of program.

In one embodiment, execution of the instruction includes the use of one or more implied general registers (i.e., registers not explicitly designated by the instruction). For instance, general registers 0 and 1 are used in execution of the DEFLATE Conversion Call instruction, as described herein. General register 0 is used, in one example, to specify a function to be performed (as well as a history buffer type, described below), and general register 1 is used to provide a location of a parameter block used by the instruction.

As an example, with reference to FIG. 3B, a general register 0 (309) includes a history buffer type field 310 and a function code field 312. In one particular example, bit position 56 of general register 0 includes a history buffer type, and bit positions 57-63 of general register 0 contain a function code; but in other embodiments, other bits may be used to contain the history buffer type and/or the function code. When bits 57-63 of general register 0 designate an unassigned or uninstalled function code, a specification exception is recognized, in one example.

Example assigned function codes for the DEFLATE Conversion Call instruction are shown in FIG. 3C and include, for instance: function code 0 (313) indicating a DFLTCC-QAF (query available functions) function; function code 1 (315) indicating a DFLTCC-GDHT (Generate Dynamic-Huffman Table) function; function code 2 (317) indicating a DFLTCC-CMPR (compress) function; and function code 4 (319) indicating a DFLTCC-XPND (expand) function. Each code uses a parameter block and the size of the parameter block depends, in one example, on the function. For instance, for the DFLTCC-QAF function, the parameter block is 32 bytes; for the DFLTCC-GDHT function, the parameter block is 384 bytes; and for the DFLTCC-CMPR and DFLTCC-XPND functions, the parameter block is 1536 bytes. Other function codes are unassigned in this example. Although example functions and function codes are described, other functions and/or function codes may be used.

When the specified function is DFLTCC-CMPR or DFLTCC-XPND, bit 56 of general register 0 specifies the history buffer type (HBT) used during the operation. When HBT is zero, the history buffer is called an in-line history buffer. When using an in-line history buffer, the history is, e.g., immediately to the left of the second operand when DFLTCC-CMPR is specified and is, e.g., immediately to the left of the first operand when DFLTCC-XPND is specified. When HBT is one, the history buffer is called a circular history buffer. When using a circular history buffer, the history is a portion of, or all of, the third operand when either DFLTCC-CMPR or DFLTCC-XPND is specified. When the DFLTCC-QAF or DFLTCC-GDHT function is specified, bit 56 of general register 0 is ignored. In one example, bit positions 0-31 of general register 0 are ignored. Further, in one example, bit positions 32-55 of general register 0 are reserved and should contain zeros; otherwise, the program may not operate compatibly in the future.

Further details regarding another implied register, general register 1, used by the DEFLATE Conversion Call instruction are described with reference to FIG. 3D. The contents of general register 1 (314) specify, for instance, a logical address 316 of the leftmost byte of a parameter block in storage. The parameter block is to be designated on a 4K-byte boundary, in one example; otherwise a specification exception is recognized. Further details regarding the parameter block are described further below.

For the specified functions (e.g., DFLTCC-QAF, DFLTCC-GDHT, DFLTCC-CMPR, DFLTCC-XPND), the contents of general registers 0, 1 and $R_3$ are not modified. Further, in one example, $R_1$ field 304 designates an even-odd pair of general registers. It is to designate an even-numbered register and is not to designate general register 0; otherwise, a specification exception is recognized.

As depicted in FIGS. 3E-3F and described in further detail herein, the contents of general register $R_1$ 318 indicate a first operand address 320, and the contents of general register $R_1+1$ 322 are used to determine the length 324 of the first operand. For instance, when the specified function is DFLTCC-CMPR or DFLTCC-XPND, the contents of general register $R_1$ 318 specify a logical address of the leftmost byte of the first operand. When the specified function is DFLTCC-CMPR, the contents of general register $R_1+1$, in conjunction with the values of the new task (NT) and sub-byte boundary (SBB) fields of the parameter block (described below), specify the length of the first operand. The following table provides examples which demonstrate the length of the first operand for the DFLTCC-CMPR function as a function of the contents of general register $R_1+1$, the NT field, and the SBB field:

| Contents of GR $R_1+1$ (hex) | NT | SBB (binary) | Length of First Operand |
|---|---|---|---|
| 00000000 00000002 | 0 | 001 | 15 bits |
| 00000000 00000001 | 1 | — | 8 bits |
| 00000000 00000001 | 0 | 000 | 8 bits |
| 00000000 00000001 | 0 | 011 | 5 bits |
| 00000000 00000001 | 0 | 111 | 1 bit |
| 00000000 00000000 | — | — | 0 bits |

When the specified function is DFLTCC-XPND, the contents of general register $R_1+1$ specify the length of the first operand. When the specified function is DFLTCC-CMPR or DFLTCC-XPND, the results of compressing or decompressing data are stored at the first operand location. When the DFLTCC-QAF or DFLTCC-GDHT function is specified, the contents of general registers $R_1$ and $R_1+1$ are ignored.

Moreover, for the specified functions (e.g., DFLTCC-QAF, DFLTCC-GDHT, DFLTCC-CMPR and DFLTCC-XPND), in one example, $R_2$ field 306 designates an even-odd pair of general registers. It is to designate an even-numbered register and is not to designate general register 0; otherwise, a specification exception is recognized.

Figure 3G:
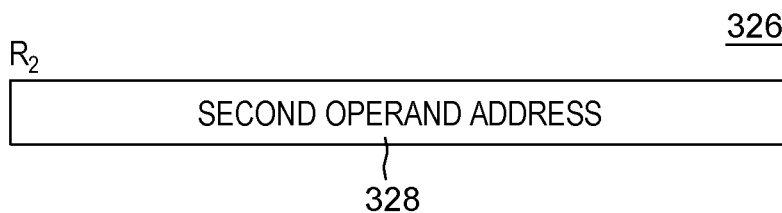
FIG. 3G depicts one example of contents of a register, $R_2$, specified by the DEFLATE Conversion Call instruction, in accordance with an aspect of the present invention.
Figure 3H:
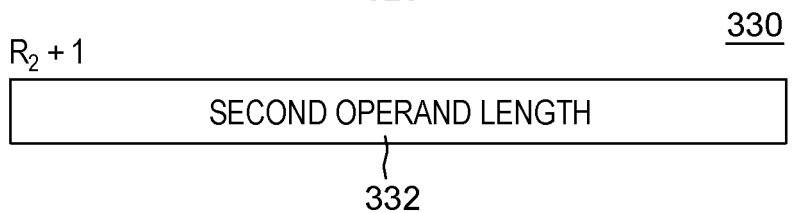
FIG. 3H depicts one example of contents of a register, $R_2+1$, used by the DEFLATE Conversion Call instruction, in accordance with an aspect of the present invention.

As depicted in FIGS. 3G-3H and described in further detail herein, the contents of general register $R_2$ 326 indicate a second operand address 328, and the contents of general register $R_2+1$ 330 are used to determine the length 332 of the second operand. For instance, when the specified function is DFLTCC-GDHT, DFLTCC-CMPR, or DFLTCC-XPND, the contents of general register $R_2$ specify a logical address of the leftmost byte of the second operand. When the specified function is DFLTCC-CMPR or DFLTCC-GDHT, the contents of general register $R_2+1$ specify the length of the second operand. When the specified function is DFLTCC-XPND, the contents of general register $R_2+1$, in conjunction with the values of the NT and SBB fields of the parameter block, specify the length of the second operand. When the second operand length is referenced and has a non-zero value at the beginning of the execution of the instruction, data is fetched from the second operand location. When the second operand length is referenced, has a value of zero at the beginning of the execution of the instruction, and the continuation flag (CF) field of the parameter block is one at the beginning of the execution of the instruction, the second operand is not accessed.

When the DFLTCC-QAF function is specified, the contents of general registers $R_2$ and $R_2+1$ are ignored. When the DFLTCC-GDHT function is specified and the contents of general register $R_2+1$ specify a length equal to zero, a specification exception is recognized, and the second operand is not accessed. When the DFLTCC-CMPR or DFLTCC-XPND function is specified, the continuation flag (CF) field of the parameter block is zero at the beginning of the execution of the instruction, and the contents of general register $R_2+1$ specify a length equal to zero, a specification exception is recognized, and the second operand is not accessed.

Figure 3I:
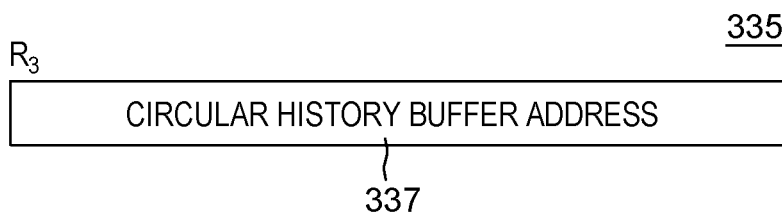
FIG. 3I depicts one example of contents of a register, $R_3$, specified by the DEFLATE Conversion Call instruction, in accordance with an aspect of the present invention.
Figure 3J:
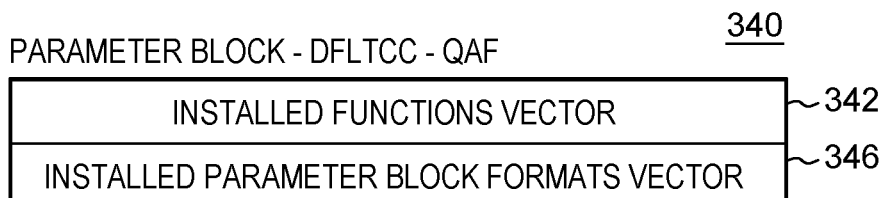
FIG. 3J depicts one example of contents of a parameter block used by the DFLTCC-QAF (query available functions) function of the DEFLATE Conversion Call instruction, in accordance with an aspect of the present invention.

As shown in FIG. 3I, when the specified function is DFLTCC-CMPR or DFLTCC-XPND and the history buffer type (HBT) is circular (e.g. HBT 310=1), the contents of general register $R_3$ 335 specify a circular history buffer address 337. For instance, a logical address of the leftmost byte of the third operand is specified. It is to designate, e.g., a 4 K-byte boundary; otherwise a specification exception is recognized. In one example, the circular history buffer is located at the third operand location. When the specified function is DFLTCC-CMPR or DFLTCC-XPND and the HBT is zero, the contents of general register $R_3$ are ignored. When the DFLTCC-QAF or DFLTCC-GDHT function is specified, the contents of general register $R_3$ are ignored. For the specified functions (e.g., DFLTCC-QAF, DFLTCC-GDHT, DFLTCC-CMPR and DFLTCC-XPND), the $R_3$ field is not to designate general register 0 or general register 1; otherwise, a specification exception is recognized, in one example.

As part of the operation, when the specified function is DFLTCC-CMPR, the address in general register $R_1$ is incremented by the number of bytes processed of the first operand that included processing bit position 0, and the length in general register $R_1+1$ is decremented by the same number; the address in general register $R_2$ is incremented by the number of bytes processed of the second operand, and the length in general register $R_2+1$ is decremented by the same number. The number of bytes processed of the first operand that included processing bit position 0 is, for instance, the integer quotient resulting from an integer division with the dividend being the sum of the number of output bits processed and the original value of the SBB, and the divisor being a value of eight. The formation and updating of the addresses and lengths are dependent on the addressing mode, as described below.

As part of the operation, when the specified function is DFLTCC-XPND, the address in general register $R_1$ is incremented by the number of bytes processed of the first operand, and the length in general register $R_1+1$ is decremented by the same number; the address in general register $R_2$ is incremented by the number of bytes processed of the second operand that included processing bit position 0, and the length in general register $R_2+1$ is decremented by the same number. The number of bytes processed of the second operand that included processing bit position 0 is the integer quotient resulting from an integer division with the dividend being the sum of the number of input bits processed and the original value of the SBB, and the divisor being a value of eight. The formation and updating of the addresses and lengths are dependent on the addressing mode, as described below.

In the 24-bit addressing mode, the following apply, in one embodiment:
  The contents of bit positions 40-63 of general registers 1, $R_1$, $R_2$, and $R_3$ constitute the addresses of the parameter block, first operand, second operand, and circular history buffer, respectively, and the contents of bit positions 0-39 are ignored.
  Bits 40-63 of the updated first operand and second operand addresses replace the corresponding bits in general registers $R_1$ and $R_2$, respectively. Carries out of bit position 40 of the updated addresses are ignored, and the contents of bit positions 32-39 of general registers $R_1$ and $R_2$ are set to zeros. The contents of bit positions 0-31 of general registers $R_1$ and $R_2$ remain unchanged. When the instruction ends with partial or normal completion, and an updated operand address equals the operand address at the beginning of execution of the instruction, bit positions 32-39 of the corresponding general register are set to zeros.
  The contents of bit positions 32-63 of general registers $R_1+1$ and $R_2+1$ form, e.g., 32-bit unsigned binary integers which specify the number of bytes in the first and second operands, respectively. The contents of bit positions 0-31 of general registers $R_1+1$ and $R_2+1$ are ignored.
  Bits 32-63 of the updated first operand and second operand lengths replace the corresponding bits in general registers $R_1+1$ and $R_2+1$, respectively. The contents of bit positions 0-31 of general registers $R_1+1$ and $R_2+1$ remain unchanged.

In the 31-bit addressing mode, the following apply, in one embodiment:
  The contents of bit positions 33-63 of general registers 1, $R_1$, $R_2$, and $R_3$ constitute the addresses of the parameter block, first operand, second operand, and circular history buffer, respectively, and the contents of bit positions 0-32 are ignored.

Bits 33-63 of the updated first operand and second operand addresses replace the corresponding bits in general registers $R_1$ and $R_2$, respectively. Carries out of bit position 33 of the updated addresses are ignored, and the content of bit position 32 of general registers $R_1$ and $R_2$ is set to zero. The contents of bit positions 0-31 of general registers $R_1$ and $R_2$ remain unchanged. When the instruction ends with partial or normal completion, and an updated operand address equals the operand address at the beginning of the execution of the instruction, bit position 32 of the corresponding general register is set to zero.

The contents of bit positions 32-63 of general registers $R_1+1$ and $R_2+1$ form 32-bit unsigned binary integers which specify the number of bytes in the first and second operands, respectively. The contents of bit positions 0-31 of general registers $R_1+1$ and $R_2+1$ are ignored.

Bits 32-63 of the updated first operand and second operand lengths replace the corresponding bits in general registers $R_1+1$ and $R_2+1$, respectively. The contents of bit positions 0-31 of general registers $R_1+1$ and $R_2+1$ remain unchanged.

In the 64-bit addressing mode, the following apply, in one embodiment:

The contents of bit positions 0-63 of general registers 1, $R_1$, $R_2$, and $R_3$ constitute the addresses of the parameter block, first operand, second operand, and circular history buffer, respectively.

Bits 0-63 of the updated first operand and second operand addresses replace the corresponding bits in general registers $R_1$ and $R_2$, respectively. Carries out of bit position 0 of the updated addresses are ignored.

The contents of bit positions 0-63 of general registers $R_1+1$ and $R_2+1$ form 64-bit unsigned binary integers which specify the number of bytes in the first and second operands, respectively.

Bits 0-63 of the updated first operand and second operand lengths replace the corresponding bits in general registers $R_1+1$ and $R_2+1$, respectively.

In the access-register mode, access registers 1, $R_1$, $R_2$, and $R_3$ specify the address spaces containing the parameter block, first operand, second operand, and circular history buffer, respectively. When DFTCC-CMPR with an in-line history buffer is specified in the access-register mode, access register $R_2$ specifies the address space containing the in-line history. When DFTCC-XPND with an in-line history buffer is specified in the access-register mode, access register $R_1$ specifies the address space containing the in-line history.

Further details regarding the various functions are described below:

Function Code 0: DFLTCC-QAF (Query Available Functions)

The DFLTCC-QAF (query available functions) function provides a mechanism to indicate the availability of the installed functions and installed parameter block formats. One example format of a parameter block for the DFLTCC-QAF function is described with reference to FIG. 3J. In one example, a parameter block 340 for the DFLTCC-QAF function (e.g., function code 0) includes an installed functions vector 342 and an installed parameter block formats vector 346. In one particular example, these vectors are stored to bytes 0-15 and bytes 24-25, respectively, of the parameter block. Each of the vectors is further described below.

As an example, bits 0-127 of installed functions vector 342 correspond to function codes 0-127, respectively, of the DEFLATE Conversion Call instruction. When a bit is, e.g., one, the corresponding function is installed; otherwise, the function is not installed.

Further, in one example, bits 0-15 of installed parameter block formats vector 346 correspond to parameter block formats 0-15, respectively for the DFLTCC-GDHT, DFLTCC-CMPR and DFLTCC-XPND functions. When a bit is, e.g., one, the corresponding parameter block format is installed; otherwise, the parameter block format is not installed. In one example, zeros are stored to reserved bytes 16-23 and 26-31 of the parameter block.

Although certain fields are described with respect to parameter block 340, additional, fewer and/or other fields may be included in other embodiments.

The contents of general registers $R_1$, $R_2$, $R_3$, $R_1+1$, and $R_2+1$ are ignored by the DFLTCC-QAF function, in one embodiment.

A PER (program event recording) storage alteration event is recognized, when applicable, for the parameter block. A PER zero address detection event is recognized, when applicable, for the parameter block.

In one example, condition code 0 is set when execution of the DFLTCC-QAF function completes; condition codes 1, 2, and 3 are not applicable to the query function, in one example.

Function Code 1: DFLTCC-GDHT (Generate Dynamic-Huffman Table)

When the DFLTCC-GDHT function is specified, the second operand is used, for instance, as a source to generate a compressed representation of a dynamic-Huffman table (DHT), as specified by the DEFLATE standard.

Figure 3K:
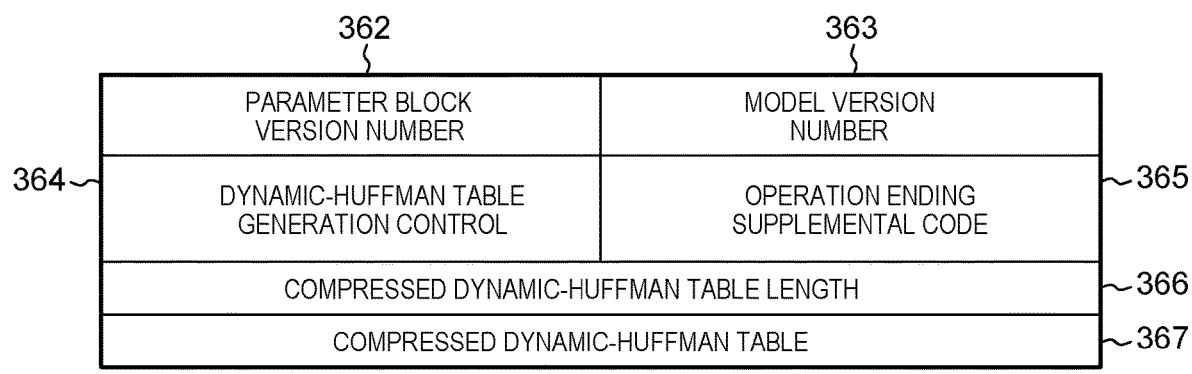
FIG. 3K depicts one example of contents of a parameter block used by the DFLTCC-GDHT (generate dynamic-Huffman table) function of the DEFLATE Conversion Call instruction, in accordance with an aspect of the present invention.

In one example, the DFLTCC-GDHT function uses a parameter block, an example of which is described with reference to FIG. 3K. In the example parameter block described herein, specific locations within the parameter block for specific fields and specific sizes of the fields are indicated (e.g., specific bytes and/or bits). However, other locations and/or sizes may be provided for one or more of the fields. Further, although the setting of a bit to a particular value e.g., one or zero, is specified, this is only an example. The bit may be set to a different value, such as the opposite value or to another value, in other examples. Many variations are possible.

Additionally, in one example, the parameter block includes one or more preserved fields and one or more reserved fields. Preserved fields are not modified by the DFLTCC-GDHT function. Preserved fields are distinguished from reserved fields to enable a program to initialize a single storage location, use that storage location for the parameter block of a DFLTCC-GDHT function, and subsequently use the same storage location for the parameter block of a DFLTCC-CMPR function. Reserved fields are to contain zeros; otherwise, the program may not operate compatibly in the future. When an operation ends, reserved fields may be stored as zeros or may remain unchanged.

Yet further, some of the fields are used by other functions (e.g., DFLTCC-CMPR or DFLTCC-XPND), and thus, aspects relating to those functions may also be described with the description of those fields.

In one example, a parameter block 360 for the DFLTCC-GDHT function includes the following fields:

Parameter Block Version Number (PBVN) 362: Bytes 0-1 of the parameter block specify the version and size of the parameter block. Bits 0-11 of the PBVN are reserved and should contain zeros; otherwise, the program may not operate compatibly in the future. Bits 12-15 of the PBVN contain an unsigned binary integer specifying the format of the parameter block. The DFLTCC-QAF function provides a mechanism to indicate the parameter block formats available. When the format of the parameter block specified is not supported by the model, a general operand data exception is recognized. The PBVN is specified by the program and is not modified during execution of the instruction.

Model Version Number (MVN) 363: Byte 2 of the parameter block is an unsigned binary integer identifying the model which executed the instruction. The program is not required to initialize the MVN. The MVN is updated during execution of the instruction. The value stored in the MVN is model-dependent.

Dynamic-Huffman Table (DHT) Generation Control (DHTGC) 364: Bit 2 of byte 17 of the parameter block applies to generating a dynamic-Huffman table (DHT). The DHT specifies Huffman codes for symbols representing literal bytes, duplicate string lengths, end-of-block (EOB) symbol, and duplicate string pointer distances. The value of a Huffman code for a particular symbol is a function of the count of occurrences for the entity, which the symbol represents, in the uncompressed form of the data. When the count for a symbol is zero, there is no Huffman code in the DHT for the symbol. The DHTGC specifies counts equal to zero will be treated as follows, in one example:

| DHTGC | Meaning |
| --- | --- |
| 0 | Treat counts of literal bytes, duplicate string lengths, and pointer distances equal to zero as equal to one (generate a universal DHT). |
| 1 | Treat counts of duplicate string lengths and pointer distances equal to zero as equal to one. |

A DHT which specifies a Huffman code for every possible value of literal bytes, an EOB symbol, duplicate string lengths, and duplicate string pointer distances is called a universal DHT. A DHT which does not specify Huffman codes for values of literal bytes, duplicate string lengths, or duplicate string pointer distances which do not occur in the uncompressed form of the data is called a non-universal DHT.

For all values of the DHTGC, the resulting DHT specifies Huffman codes for all possible duplicate string lengths and pointer distances, as defined by the DEFLATE standard. Therefore, the HLIT (Huffman literal) and HDIST (Huffman distances) sub-elements of the resulting compressed form of the DHT, described further below, each contain the value of, for instance, 29.

The DHTGC is an input to the operation when the DFLTCC-GDHT function is specified. The DHTGC does not apply to the operation when the DFLTCC-CMPR or DFLTCC-XPND function is specified. The DHTGC is not modified, in one embodiment, during execution of the instruction.

Operation Ending Supplemental Code (OESC) 365: Byte 19 of the parameter block is an unsigned binary integer providing additional information on the condition being reported to the program. Since this field is used by multiple functions, some of the conditions refer to fields of a parameter block used by other functions (e.g., the parameter block of FIG. 3L used by the DFLTCC-CMPR and DFLTCC-XPND functions). When the condition being reported is a general operand data exception, the operation is considered suppressed, although the OESC field of the parameter block is updated, in which case it is defined as follows, in one example:

| OESC (hex) | Meaning |
| --- | --- |
| 00 | No additional information is provided. |
| 01 | The format of the parameter block, as specified by parameter block version number 362, is not supported by the model. |
| 02 | The DFLTCC-CMPR or DFLTCC-XPND function is specified, a history length field 385 (FIG. 3L) is greater than, e.g., 32,768, and a new task field 374 (FIG. 3L) is zero. |
| 11 | A compressed data block with BTYPE (Block Type) equal to 11 binary is encountered. |
| 12 | A compressed data block with BTYPE equal to 00 binary and NLEN not equal to the one's complement of LEN (length) is encountered. |
| 21 | CDHTL field 366 (FIG. 3L) applies and is, e.g., less than 42 or greater than 2283. |
| 22 | The HLIT sub-element of a compressed DHT used during the operation is, e.g., greater than 29 (invalid DHT). |
| 23 | The HDIST sub-element of a compressed DHT used during the operation is, e.g., greater than 29 (invalid DHT). |
| 24 | A compressed DHT used during the operation specifies a code which is in the sequence of codes specifying the bit lengths for the possible code lengths (e.g., 19) defined for a compressed DHT and is less than the length required by the Huffman algorithm to specify a functional Huffman tree (invalid DHT). |
| 26 | A compressed DHT used during the operation specifies code length 16 (copy previous code length) as the first code length for the set of elements consisting of literal bytes, an EOB symbol, and duplicate string lengths (invalid DHT). |
| 27 | A compressed DHT used during the operation specifies a code which is in the sequence of codes specifying code lengths for literal bytes, and the code does not match any of the codes determined to represent the set of referenced code lengths, as specified earlier in the compressed DHT (invalid DHT). |
| 28 | A compressed DHT used during the operation specifies a code which assigns code length 0 (CL0) to the EOB symbol. In this case, the corresponding DHT does not specify a Huffman code to represent an EOB symbol (invalid DHT). |
| 29 | A compressed DHT used during the operation specifies a code which is in the sequence of codes specifying code lengths for duplicate string lengths and pointer distances, and the code does not match any of the codes determined to represent the set of referenced code lengths, as specified earlier in the compressed DHT (invalid DHT). |

| OESC (hex) | Meaning |
|---|---|
| 2A | A compressed DHT used during the operation specifies a number of code lengths which is greater than the number of Huffman codes in the DHT, as specified by the sum of the values in the HLIT field, the HDIST field, and, e.g., 258. This is possible with an improper uses of code lengths 16, 17, and 18, as examples (invalid DHT). |
| 2B | A compressed DHT used during the operation specifies a code length for the set of literal bytes, EOB symbol, and duplicate string lengths, which is less than the length required by the Huffman algorithm to specify a functional Huffman tree (invalid DHT). |
| 2D | A compressed DHT used during the operation specifies a code length for the set of duplicate string pointer distances, which is less than the length required by the Huffman algorithm to specify a functional Huffman tree (invalid DHT). |
| 2F | CDHTL field 366 (FIG. 3L) applies and does not equal the length of the compressed DHT in CDHT field 367 (FIG. 3L) used during the operation. |
| 31 | A compressed DHT used during the operation does not specify a Huffman code corresponding to a literal byte or a duplicate string length processed during the operation (deficient non-universal DHT), or the DFLTCC-XPND function is specified and a compressed data symbol, which is encountered in a compressed data block with BTYPE equal 01 binary, specifies an invalid code for a duplicate string length (11000110 or 11000111 binary). |
| 32 | A compressed DHT used during the operation does not specify a Huffman code corresponding to a duplicate string pointer distance processed during the operation (deficient non-universal DHT), or the DFLTCC-XPND function is specified and a compressed data symbol, which is encountered in a compressed data block with BTYPE equal 01 binary, specifies an invalid code for a duplicate string pointer distance (11110 or 11111 binary). |
| 40 | A compressed data symbol is encountered which is a duplicate string pointer and specifies a distance greater than the length of history available at the point of processing the symbol. |

When the operation ends without reporting a general operand data exception, zeros are stored to the OESC field.

Support for supplemental codes other than zero is model-dependent. When multiple conditions exist, it is model-dependent which code, if any, is reported in the OESC field.

Compressed Dynamic-Huffman Table Length (CDHTL) 366: Twelve bits, starting with bit 4 of byte 56 through bit 7 of byte 57, of the parameter block contain an unsigned binary integer which specifies the length, as a bit count, of the compressed format of the DHT in the CDHT field of the parameter block (e.g., CDHT 367).

The CDHTL is an output from the operation when the DFLTCC-GDHT function is specified.

The CDHTL is an input to the operation when the DFLTCC-CMPR function is specified and the Huffman table type (e.g., HTT 376 of FIG. 3L) is one. When the CDHTL does not specify an appropriate length for the CDHT, a general operand data exception is recognized. The CDHTL is not modified when the DFLTCC-CMPR function is specified.

When the DFLTCC-XPND function is specified and the operation ends after decoding only a portion of a block with BTYPE 10 binary, the length of the compressed representation of the DHT in the block is stored to this field. When the DFLTCC-XPND function is specified and the operation ends at a block boundary or after decoding only a portion of a block with BTYPE 00 or 01 binary, zeros are stored to this field. When an uncompressing operation is resumed within a block with BTYPE 10 binary (that is when CF (continuation flag 373 of FIG. 3L) equals one and IFS (incomplete function status 383) equals C or D hex, described below), this field is an input to the operation.

Compressed Dynamic-Huffman Table (CDHT) 367: Bytes 64-351 of the parameter block contain a compressed format of a dynamic-Huffman table (DHT).

The DHT specifies Huffman codes (bit sequences) to represent two sets of elements. The elements for one set include literal bytes, an EOB symbol, and duplicate string lengths. The elements for the other set include duplicate string pointer distances. The compressed representation of the DHT defines a set of code lengths and specifies a code length (CL) for each element of each set. The Huffman code for an element expected to be referenced during an operation is derived from the CL specified for that element and the number of elements in the same set with the same specified CL. Specifically, the compressed representation of the DHT includes the following, as an example:

An HLIT field to specify the number of Huffman codes representing literal bytes, an EOB symbol and duplicate string lengths.

An HDIST field to specify the number of Huffman codes representing duplicate string pointer distances.

An HCLEN (Huffman code lengths) field to specify the number of Huffman codes representing code lengths.

A sequence of codes specifying a bit length for each of the, for instance, 19 code lengths defined for the compressed DHT.

A sequence of codes specifying a code length for each of the elements of the set consisting of literal bytes, an EOB symbol, and duplicate string lengths.

A sequence of codes specifying a code length for each of the elements of the set consisting of duplicate string pointer distances.

Further details of a compressed representation of a DHT are described below with reference to the description of a compressed data block with block type 10 binary.

In one example, the compressed representation of the DHT is left justified in the CDHT field. That is, the rightmost bit of byte 64 contains the least-significant bit of the HLIT sub-element of the compressed representation of the DHT.

The compressed representation of a DHT is an output from the operation when the DFLTCC-GDHT function is specified.

The compressed representation of a DHT is an input to the operation when the DFLTCC-CMPR function is specified and HTT, described below, is one. The CDHT field is not modified by the DFLTCC-CMPR function.

When the DFLTCC-XPND function is specified and the operation ends after decoding only a portion of a block with BTYPE 10 binary, the compressed representation of the DHT in the block is stored to this field. When the DFLTCC-XPND function is specified and the operation ends at a block boundary or after decoding only a portion of a block with BTYPE 00 or 01 binary, zeros are stored to this field. When an uncompressing operation is resumed within a block with BTYPE 10 binary (that is when CF equals one and IFS equals C or D hex), this field is an input to the operation.

When the CDHT is modified, bits of the field not used to represent the compressed representation of the DHT are stored as zeros.

Although various fields are described above with respect to parameter block 360, additional, fewer and/or other fields may be included in other embodiments.

Aspects of DHT generation are specified by the program to the machine using dynamic-Huffman table generation control (DHTGC) field 364 of the parameter block. It is intended that the source contains uncompressed data and subsequent to completing the operation, the generated result is specified with the DFLTCC-CMPR function to compress the same source.

In one embodiment, there is no history to reference from prior operations while processing the current operation.

When the contents of general register $R_2+1$ specify a length greater than, e.g., 32 K-bytes, the following applies, in one example:
  Only the first 32 K-bytes of the second operand are used to generate the DHT.
  Access exceptions are not recognized for locations beyond the first 32 K-bytes of the second operand.

When the contents of general register $R_2+1$ specify a length equal to zero, a specification exception is recognized, and the second operand is not accessed.

The resulting compressed DHT includes a Huffman code representing an end-of-block (EOB) symbol.

A compressed format of the generated DHT is stored to compressed dynamic-Huffman Table (CDHT) field 367 of the parameter block. The length of the compressed format of the generated DHT is stored to CDHTL field 366 of the parameter block.

The operation includes storing a model identification to a model version number field 363 of the parameter block.

When the operation ends without recognizing a general operand data exception, zeros are stored to operation ending supplemental code (OESC) field 365 of the parameter block.

Condition code 0 is set when execution of the DFLTCC-GDHT function completes; condition codes 1, 2 and 3 are not applicable to the DFLTCC-GDHT function.

General registers $R_2$ and $R_2+1$ are not modified by the operation.

The contents of general registers $R_1$, $R_1+1$ and $R_3$ are ignored when the DFLTCC-GDHT function is specified.

A PER zero address detection event is recognized, when applicable, for the second operand location and for the parameter block.

Function Code 2: DFLTCC-CMPR (Compress)

When the DFLTCC-CMPR function is specified, a compressing operation is performed. The operation includes encoding data from the second operand location into compressed data symbols, which are stored to the first operand location.

In one example, the DFLTCC-CMPR function uses a parameter block, an example of which is described with reference to FIG. 3L. Some of the fields have been described above with respect to parameter block 360, and therefore, are listed below with the same reference number and not further described in detail.

In one example, parameter block 370 includes:
Parameter Block Version Number (PBVN) 362.
Model Version Number (MVN) 363.
Continuation Flag (CF) 373: Bit 63 of the parameter block, when one, indicates the operation is partially complete and the contents of the continuation state buffer (e.g., in continuation state buffer field 392) may be used to resume the operation. The program is to initialize the continuation flag (CF) to zero and not modify CF in the event the instruction is to be re-executed for the purpose of resuming the operation; otherwise results are unpredictable.

New Task (NT) 374: Bit 0 of byte 16 of the parameter block, when one, indicates the operation applies to the beginning of a compressed data set. Therefore, no history and no check value from a prior operation applies to the current operation. When NT is one at the beginning of the operation, and the operation ends after partial completion, zero is stored to the NT field. When NT is zero, history and a check value from a prior operation apply to the current operation.

Check Value Type (CVT) 375: Bit 2 of byte 16 of the parameter block specifies the type of check value contained in the check value field of the parameter block (e.g., field 387). When CVT is zero, the check value type is, e.g., a 32-bit cyclic-redundancy-check (CRC-32). When CVT is one, the check value type is, e.g., a 32-bit Adler checksum (Adler-32). The CVT bit is not modified during execution of the instruction.

Huffman Table Type (HTT) 376: Bit 4 of byte 16 of the parameter block, when zero, specifies a table containing fixed-Huffman codes (FHT), as defined by the DEFLATE standard, is used during a compression operation. When the HTT is one, a table containing dynamic-Huffman codes (DHT), as specified in the CDHT field of the parameter block, is used during a compression operation. The HTT does not apply to decompressing operations. The HTT bit is not modified during execution of the instruction.

Block Continuation Flag (BCF) 377: Bit 5 of byte 16 of the parameter block applies when the DFLTCC-CMPR function is specified. When zero, a 3-bit block header, and when applicable, the compressed format of a dynamic-Huffman table, as specified in the CDHT field of the parameter block (e.g., field 367), is stored to the first operand location prior to storing any compressed data elements. When one, neither a block header nor a compressed format of a DHT is stored to the first operand location. When NT is one, BCF is treated as equal to zero. The BCF bit is not modified during execution of the instruction.

Block Closing Control (BCC) 378: Bit 6 of byte 16 of the parameter block applies when the DFLTCC-CMPR function is specified. When one, subsequent to storing all compressed data symbols, an end-of block (EOB) symbol is stored to the first operand location. When the HTT specifies using an FHT, Huffman code 0000000 binary (which corresponds to the intermediate integer representation of 256 in the table specifying codes for literal bytes, an EOB symbol, and duplicate string lengths), as an example, is used for the EOB symbol. When the HTT specifies using a DHT, the Huffman code for the EOB symbol is specified in the DHT. When the BCC bit is zero, an EOB symbol is not stored to the first operand location. The BCC bit is not modified during execution of the instruction.

Block Header Final (BHF) 379: Bit 7 of byte 16 of the parameter block applies when the DFLTCC-CMPR function is specified and either BCF 377 is zero or NT 374 is one; otherwise the BHF does not apply. When applicable and one, the first bit of the block header (BFINAL) is set to one before storing the block header to the first operand location. When applicable and zero, the first bit of the block header (BFINAL) is set to zero before storing the block header to the first operand location. The BHF bit is not modified during execution of the instruction.

DHT Generation Control (DHTGC) 364: The DHTGC does not apply to the operation when the DFLTCC-CMPR function is specified. The DHTGC is not modified during execution of the instruction.

Sub-Byte Boundary (SBB) 381: Bits 5-7 of byte 18 of the parameter block contain an unsigned binary integer specifying the boundary between processed and unprocessed bits within a byte of the compressed data stream. The byte of the stream referenced is the last byte referenced, meaning the rightmost byte, when an operation ends, and is the first byte to be referenced, meaning the leftmost byte, when an operation begins or resumes. When the DFLTCC-CMPR function is specified, the SBB applies to the byte designated by the first operand address. When the DFLTCC-XPND function is specified, the SBB applies to the byte designated by the second operand address. The SBB specifies the number of rightmost bits that have been processed. The SBB is an input to the operation and an output of the operation.

One example of a compressed data stream when SBB has a value of 011 binary is depicted in FIG. 4. The data that has been processed after the end of the operation is depicted at 400; and the data to be processed before the start of the operation is depicted at 402.

Further, FIGS. 5A-5C provide examples which demonstrate how the SBB applies to the DFLTCC-CMPR function. For instance, one example of how SBB applies before and after executing the DFLTCC-CMPR function is depicted in FIG. 5A. Other examples are depicted in FIGS. 5B-5C. When NT 374 is one, SBB 381 is treated as equal to 000 binary.

Returning to FIG. 3L, additional fields of parameter block 370 are described:

Operation Ending Supplemental Code (OESC) 365.

Incomplete Function Status (IFS) 383: Bits 4-7 of byte 21 of the parameter block contain status information when certain operations end. When a decompressing operation ends, the IFS conveys information about the second operand as follows, in on example:

| IFS (binary) | Meaning |
| --- | --- |
| 0000 | The operation ended after decoding the last element of a block with BFINAL equal to one. |
| 1000 | The operation ended after decoding an element, other than the last element, of a block with BTYPE equal 00 binary and BFINAL equal to zero. |
| 1001 | The operation ended after decoding an element, other than the last element, of a block with BTYPE equal 00 binary and BFINAL equal to one. |
| 1010 | The operation ended after decoding an element, other than the last element, of a block with BTYPE equal 01 binary and BFINAL equal to zero. |
| 1011 | The operation ended after decoding an element, other than the last element, of a block with BTYPE equal 01 binary and BFINAL equal to one. |
| 1100 | The operation ended after decoding an element, other than the last element, of a block with BTYPE equal 10 binary and BFINAL equal to zero. |
| 1101 | The operation ended after decoding an element, other than the last element, of a block with BTYPE equal 10 binary and BFINAL equal to one. |
| 1110 | The operation ended at a block boundary, the last element of a block with BFINAL equal to one has not been decoded, and the block header first element of the subsequent block has not yet been processed. |

In one embodiment, an uncompressing operation may end with IFS equal 0000 binary and not satisfy normal completion. In such cases, the operation ends with condition code 1 or 3 set.

When a compressing operation ends, the IFS field is undefined, but may be modified.

The IFS is not an input to the operation.

Incomplete Function Length (IFL) 384: Bytes 22-23 of the parameter block contain length information when certain operations end. For a decompressing operation, the IFL applies to the second operand. When a decompressing operation ends after decoding some, but not all of a block with BTYPE equal 00 binary, the IFL contains an unsigned binary integer specifying the number of bytes of the block in the second operand, which have not yet been processed. Bytes 22-23 contain the IFL in, for instance, big-endian byte order unlike the LEN field of a block with BTYPE equal 00 binary, which is in, for instance, little-endian byte order.

When a decompressing operation ends after decoding a complete block with BTYPE equal 00 binary and BFINAL equal to one, zeros are stored to the IFL field. When a decompressing operation ends after decoding some, but not all of a block with a non-zero BTYPE, or ends at a block boundary, the IFL field is undefined, but may be modified.

When a compressing operation ends, the IFL field is undefined, but may be modified.

The IFL is not an input to the operation.

History Length (HL) 385: Bytes 44-45 of the parameter block contain an unsigned binary integer specifying the number of bytes of history in the history buffer which can be referenced during an operation. The HL applies to in-line and circular history buffers. When new task (NT) equals one, no history applies to the beginning of the operation and the history length is treated as zero as an input to the operation.

A general operand data exception is recognized when the history length is greater than, e.g., 32,768 and NT equals zero.

The history length is modified during compressing and decompressing operations. When the sum of the original HL and the number of uncompressed data bytes processed during the operation is less than, or equal to, e.g., 32,768, the updated HL is equal to the sum of the original HL and the number of uncompressed data bytes processed during the operation; otherwise the updated HL is equal to the value of 32,768.

History Offset (HO) 386: Fifteen bits, starting with bit 1 of byte 46, through bit 7 of byte 47, of the parameter block, contain an unsigned binary integer specifying an offset in the third operand when the history buffer type is circular. The sum of the contents of $R_3$ and the history offset designates the location of the first byte of history within the circular history buffer, which is the least recently processed byte of uncompressed data in the buffer. When the history buffer type is circular, history offset is an input to the operation and is updated at the end of the operation. When the sum of the original HL and the number of uncompressed data bytes processed during the operation is less than, or equal to, e.g., 32,768, the updated HO is equal to the original HO; otherwise, the updated HO is equal to the sum of the original HO, the original HL, and the number of uncompressed data bytes processed during the operation, modulo 32,768.

When the history buffer type is in-line, the HO field of the parameter block is undefined, but may be modified.

Check Value 387: Bytes 48-51 of the parameter block contain a check value. As part of the operation, a check value is generated. The check value applies to the uncompressed data operand. That is, the check value applies to the second operand for the DFLTCC-CMPR function and applies to the first operand for the DFLTCC-XPND function. When CVT bit 375 is zero, a, e.g., 32-bit cyclic-redundancy-check check value (CRC-32) is generated. When the CVT bit is one, a, e.g., 32-bit Adler checksum check value (Adler-32) is generated.

The inputs to generating a check value are, for instance, a 4-byte base and the uncompressed data processed during the operation. The base input provides the means to compute a single and consistent check value for a set of compressed data blocks, regardless of the number of times the DFLTCC instruction is executed to process the complete set of compressed data blocks. When the NT bit is zero, the original value in the check value field is used for the base input in generating a check value.

When an Adler-32 check value is generated, the following apply, in one example:
  When the NT bit is one, a value of one is used for the 4-byte base input.
  The sums defined in the Adler-32 check value generation are modulo 65,521.
  The result is stored to the check value field in big-endian byte order. That is, the most significant byte of the check value is located in byte 48 and the least significant byte of the check value is located in byte 51.

When a CRC-32 check value is generated, the following apply, in one embodiment:
  When the NT bit is one, a value of zero is used for the 4-byte base input.
  The polynomial used as the divisor in generating a CRC-32 check value is $x^{32}+x^{26}+x^{23}+x^{22}+x^{16}+x^{12}+x^{11}+x^{10}+x^8+x^7+x^5+x^4+x^2+x^1+x^0$, which is represented as 104C11DB7 hex. In this representation, the leftmost bit corresponds to the most significant bit.
  The first and final stages of generating the check value are computing the one's complement of the base input and computing the one's complement of the result, prior to storing the result, respectively.
  The result is stored to the check value field in little-endian byte order. That is, the least significant byte of the check value is located in byte 48 and the most significant byte of the check value is located in byte 51.

In one example, the check value is only meaningful to the program when the operation ends with condition code 0 set; otherwise, the check value is only an intermediate result and only meaningful to resume the operation. When the DFLTCC-CMPR function is specified and the operation ends with condition code 1, 2, or 3 set some bytes to the left of the byte designated by the second operand address may not be included in the computation of the resulting check value. When the DFLTCC-XPND function is specified and the operation ends with condition code 1, 2, or 3 set, some result bytes not yet stored to the right of the byte designated by the first operand address may already be included in the computation of the resulting check value.

End-Of-Block Symbol (EOBS) 388: Fifteen bits, starting with bit 0 of byte 52, through bit 6 of byte 53, of the parameter block, contain an end-of-block (EOB) symbol. The end-of-block length (EOBL) field 389 of the parameter block specifies the length of the EOB symbol in the EOBS field. The EOB symbol is left justified in the EOBS field. Bits of the EOBS field not occupied by the EOB symbol are stored as zeros. The EOBS field is an output of the operation when compressing data, regardless of which type of Huffman table applies. The EOBS field is not used as an input to the operation.

Bit 0 of byte 52 contains the most significant bit of the EOB symbol. When the length of the EOB symbol is 7 bits, bit 6 of byte 52 contains the least significant bit of the EOB symbol. When the length of the EOB symbol is 15 bits, bit 6 of byte 53 contains the least significant bit of the EOB symbol.

For blocks using a FHT, the EOB symbol is 0000000 binary, as defined by the DEFLATE standard. For blocks using a DHT, the EOB symbol is defined by the DHT. The EOB symbol is conveyed in order to provide the capability for the program to close a block.

The EOBS field is undefined when the DFLTCC-XPND function is specified but may be modified.

End-Of-Block Length (EOBL) 389: Bits 0-3 of byte 54 of the parameter block contain an unsigned binary integer specifying the length of the end-of-block (EOB) symbol in EOBS field 388 of the parameter block. The length specifies the number of bits which the EOB symbol occupies in the EOBS field. The EOBL field is an output of the operation when compressing data, regardless of which type of Huffman table applies. The EOBL field is not used as an input to the operation.

The EOBL field is undefined when the DFLTCC-XPND function is specified, but may be modified.

Compressed Dynamic-Huffman Table Length (CDHTL) 366.

Compressed Dynamic-Huffman Table (CDHT) 367: The compressed representation of a DHT is an input to the operation when the DFLTCC-CMPR function is specified and HTT is one. The CDHT field is not modified by the DFLTCC-CMPR function.

Continuation State Buffer (CSB) 392: When conditions cause a value of one to be stored in CF field 373, internal state data is stored to bytes 384-1535 of the parameter block; otherwise, bytes 384-1535 of the parameter block are undefined and may be modified. The internal state data stored is model-dependent and may be used subsequently to resume the operation. It is expected, but not required, for the program to initialize the continuation state buffer to contain, e.g., all zeros. Subsequent to the instruction ending with a non-zero condition code set, and prior to re-executing the instruction for the purpose of resuming the operation, the program should not modify the continuation state buffer; otherwise results are unpredictable.

Although various fields are described above with respect to parameter block 370, additional, fewer and/or other fields may be included in other embodiments.

One example of the compress operation is described below with respect to Compressing Data.

Normal completion for the DFLTCC-CCMPR function occurs when the entire second operand is compressed and stored to the first operand location. When the operation ends due to normal completion, the following occurs, in one example:

A model-dependent value is stored to model version number (MVN) field 363 of the parameter block.

Continuation flag (CF) field 373 of the parameter block is set to zero.

Sub-byte boundary (SBB) field 381 of the parameter block is updated.

End-of-block length (EOBL) 389 and end-of block symbol (EOBS) 388 fields of the parameter block are updated.

History length (HL) field 385 of the parameter block is updated.

The history offset (HO) field 386 of the parameter block is updated, when applicable.

Operation ending supplemental code (OESC) field 365 of the parameter block is set to zeros.

Check value field 387 of the parameter block is updated.

The address in general register $R_1$ is incremented by the number of bytes processed of the first operand that included processing bit 0, and the length in general register $R_1+1$ is decremented by the same number. The number of bytes processed of the first operand that included processing bit 0 is the integer quotient resulting from an integer division with the dividend being the sum of the number of output bits processed and the original value of the SBB, and the divisor being a value of eight.

The address in general register $R_2$ is incremented by the number of source bytes processed, and the length in general register $R_2+1$ is decremented by the same number.

Condition code 0 is set.

The formation and updating of the addresses and lengths are dependent on the addressing mode.

When normal completion occurs, CSB field 392 of the parameter block is undefined after the operation ends.

When a CPU-determined number of bytes have been processed, the operation ends and the following occurs, in one example:

Continuation flag (CF) bit 373 in the parameter block is set to one.

Continuation state buffer (CSB) field 392 in the parameter block is updated.

Sub-byte boundary (SBB) field 381 of the parameter block is updated.

History length (HL) field 385 of the parameter block is updated.

History offset (HO) field 386 of the parameter block is updated, when applicable.

Check value field 387 of the parameter block is updated.

A model-dependent value is stored to model version number (MVN) field 363 of the parameter block.

End-of-block length (EOBL) 389 and end-of block symbol (EOBS) 388 fields of the parameter block are updated.

Operation ending supplemental code (OESC) field 365 of the parameter block is set to zeros.

The address in general register R1 is incremented by the number of bytes processed of the first operand that included processing bit 0, and the length in general register $R_1+1$ is decremented by the same number. The number of bytes processed of the first operand that included processing bit 0 is the integer quotient resulting from an integer division with the dividend being the sum of the number of output bits processed and the original value of the SBB, and the divisor being a value of eight.

The address in general register $R_2$ is incremented by the number of source bytes processed, and the length in general register $R_2+1$ is decremented by the same number.

Condition code 3 is set.

The formation and updating of the addresses and lengths are dependent on the addressing mode.

The CPU-determined number of bytes depends on the model, and may be a different number each time the instruction is executed.

Subsequent to the instruction ending with condition code 3 set, it is expected the program does not modify any input or output specification for the instruction and branches back to re-execute the instruction to resume the operation.

In certain situations, despite ending the instruction with condition code 3 set, the parameter block and general registers are not updated. These situations may occur when the CPU performs a quiescing operation or CPU retry while executing the DEFLATE Conversion Call instruction. In these cases, the CPU-determined number of bytes processed is zero, data may have been stored to the first operand location, data may have been stored to the third operand location, when applicable, and corresponding change bits have been set.

The first operand length is insufficient to complete the operation when any of the following conditions apply, in one example:

The first operand length, as specified by the contents of general register $R_1+1$, is zero at the beginning of the execution of the instruction.

The first operand length becomes equal to zero during execution of the instruction and normal completion does not occur.

In one example, the first operand length is zero when the content of general register $R_1+1$ is zero, regardless of the values in the NT and SBB fields of the parameter block.

When the first operand length becomes equal to zero during execution of the instruction, the operation ends and the following occurs, in one embodiment:

Continuation flag (CF) bit 373 in the parameter block is set to one.

Continuation state buffer (CSB) field 392 in the parameter block is updated.

Sub-byte boundary (SBB) field 381 of the parameter block is updated.

History length (HL) field 385 of the parameter block is updated.

History offset (HO) field 386 of the parameter block is updated, when applicable.

Check value field 387 of the parameter block is updated.

A model-dependent value is stored to model version number (MVN) field 363 of the parameter block.

End-of-block length (EOBL) 389 and end-of block symbol (EOBS) 388 fields of the parameter block are updated.

Operation ending supplemental code (OESC) field 365 of the parameter block is set to zeros.

The address in general register $R_1$ is incremented by the number of bytes processed of the first operand that included processing bit 0, and the length in general register $R_1+1$ is decremented by the same number. The number of bytes processed of the first operand that included processing bit 0 is the integer quotient resulting from an integer division with the dividend being the sum of the number of output bits processed and the original value of the SBB, and the divisor being a value of eight.

The address in general register $R_2$ is incremented by the number of source bytes processed, and the length in general register $R_2+1$ is decremented by the same number.

Condition code 1 is set.

The formation and updating of the addresses and lengths are dependent on the addressing mode.

When the first operand length is zero at the beginning of the execution of the instruction, the operation ends and the following occurs, in one embodiment:

Condition code 1 is set.

Subsequent to the instruction ending with condition code 1 set, it is expected that the program modifies the first operand length, first operand address, or both and re-executes the instruction to resume the operation.

A PER storage alteration event is recognized, when applicable, for the following:

Stores to the parameter block, as described below.

Stores to the first operand location.

Stores to the third operand location, which occur, e.g., when the history buffer type (HBT) is one (circular).

When the entire parameter block overlaps the PER storage area designation, a PER storage alteration event is recognized, when applicable, for the parameter block. When only a portion of the parameter block overlaps the PER storage area designation, it is model-dependent which of the following occurs:

A PER storage alteration event is recognized when applicable, for the parameter block.

A PER storage alteration event is recognized, when applicable, for the portion of the parameter block that is stored.

A PER zero-address-detection event is recognized when applicable, for the parameter block, first operand location, second operand location, and third operand location when the HBT is one (circular).

Condition code 2 is not applicable to the DFLTC-CCMPR function.

When the instruction ends with condition code 1 or 3 set, input data referenced from the second operand location may be completely, or only partially, processed. When input data is only partially processed, results in the first operand location, first operand address, first operand length, and SBB field of the parameter block do not represent a state consistent with the updated second operand address and length. In these cases, partially processed data and internal-state information may be placed in the CSB field of the parameter block. The amount of partially processed data depends on conditions existing at the time the operation ends and the model. Although some data may only be partially processed, results stored to the left of the location designated by the updated first operand address are complete and will not be modified when the operation resumes. Furthermore, it is expected that the program subsequently re-executes the instruction to resume the operation, at which time the contents of the CSB field are referenced prior to resuming the operation. When the instruction ends with condition code 0 set, all data is completely processed and all results associated with input and output data represent a consistent state.

Subsequent to the instruction ending with a non-zero condition code set, and prior to re-executing the instruction for the purpose of resuming the operation, the program should not modify any fields of the parameter block; otherwise results are unpredictable.

Function Code 4: DFLTCC-XPND (Expand)

When the DFLTCC-XPND function is specified, an uncompressing operation is performed. The operation includes decoding compressed data symbols from the second operand location into uncompressed data, which is stored to the first operand location.

In one example, the DFLTCC-XPND function uses a parameter block, an example of which is described above with respect to FIGS. 3K-3L.

One example of the DFLTCC-XPND operation is described below with respect to Uncompressing Data.

Normal completion occurs when all elements of the final block of the data set in the second operand are decoded and all uncompressed data is stored to the first operand location. The last block of the data set is identified when the BFINAL bit of the block header is one. When the operation ends due to normal completion, the following occurs, in one embodiment:

A model-dependent value is stored to model version number (MVN) field 363 of the parameter block.

Continuation flag (CF) field 373 of the parameter block is set to zero.

Sub-byte boundary (SBB) field 381 of the parameter block is updated.

History length (HL) field 385 of the parameter block is updated.

History offset (HO) field 386 of the parameter block is updated, when applicable.

Compressed dynamic-Huffman table (CDHT) 367 and compressed dynamic-Huffman table length (CDHTL) fields 366 of the parameter block are set to zeros.

Operation ending supplemental code (OESC) field 365 of the parameter block is set to zeros.

Check value field 387 of the parameter block is updated.

The address in general register $R_1$ is incremented by the number of bytes stored at the first operand location, and the length in general register $R_1+1$ is decremented by the same number.

The address in general register $R_2$ is incremented by the number of bytes processed of the second operand that included processing bit 0, and the length in general register $R_2+1$ is decremented by the same number. The number of bytes processed of the second operand that included processing bit 0 is the integer quotient resulting from an integer division with the dividend being the sum of the number of input bits processed and the original value of the SBB, and the divisor being a value of eight.

Condition code 0 is set.

The formation and updating of the addresses and lengths are dependent on the addressing mode.

When normal completion occurs, CSB field 392 of the parameter block is undefined after the operation ends.

When a CPU-determined number of bytes have been processed, the operation ends and the following occurs, in one embodiment:

Continuation flag (CF) bit 373 in the parameter block is set to one.

Continuation state buffer (CSB) field 392 in the parameter block is updated.

Sub-byte boundary (SBB) field 381 of the parameter block is updated.

Compressed dynamic-Huffman table (CDHT) 367 and compressed dynamic-Huffman table length (CDHTL) 366 fields of the parameter block are updated. When partial completion occurs while processing a block with BTYPE value of 10 binary, the bytes of the CDHT field not required to represent the table are stored as zeros. When partial completion occurs while processing a block with BTYPE value of 00 or 01 binary, zeros are stored to the CDHT and CDHTL fields.

History length (HL) field 385 of the parameter block is updated.

History offset (HO) field 386 of the parameter block is updated, when applicable.

Check value field 387 of the parameter block is updated.

A model-dependent value is stored to model version number (MVN) field 363 of the parameter block.

Operation ending supplemental code (OESC) field 365 of the parameter block is set to zeros.

Incomplete function status (IFS) field 383 of the parameter block is updated.

Incomplete function length (IFL) field 384 of the parameter block is updated, when applicable.

The address in general register $R_1$ is incremented by the number of bytes stored at the first operand location, and the length in general register $R_1+1$ is decremented by the same number.

The address in general register $R_2$ is incremented by the number of bytes processed of the second operand that included processing bit 0, and the length in general register $R_2+1$ is decremented by the same number. The number of bytes processed of the second operand that included processing bit 0 is the integer quotient resulting from an integer division with the dividend being the sum of the number of input bits processed and the original value of the SBB, and the divisor being a value of eight.

Condition code 3 is set.

The formation and updating of the addresses and lengths are dependent on the addressing mode.

The CPU-determined number of bytes depends on the model, and may be a different number each time the instruction is executed.

Subsequent to the instruction ending with condition code 3 set, it is expected the program does not modify any input or output specification for the instruction and branches back to re-execute the instruction to resume the operation.

In certain situations, despite ending the instruction with condition code 3 set, the parameter block and general registers are not updated. These situations may occur when the CPU performs a quiescing operation or CPU retry while executing the DEFLATE Conversion Call instruction. In these cases, the CPU-determined number of bytes processed is zero, data may have been stored to the first operand location, data may have been stored to the third operand location, when applicable, and corresponding change bits have been set.

The second operand length is insufficient to complete the operation when the following applies, for instance:

The last element of a compressed data block with BFINAL equal to one has not been decoded during the operation, and the number of bits in the second operand, as designated by the second operand length and SBB, is less than the number of bits of the next element to decode and all results from decoding data from the second operand location have been placed at the first operand location.

When the second operand length is insufficient to complete the operation, the operation has been partially completed, the operation ends, and the following occurs, in one embodiment:

Continuation flag (CF) bit 373 in the parameter block is set to one.

Continuation state buffer (CSB) field 392 in the parameter block is updated.

Sub-byte boundary (SBB) field 381 of the parameter block is updated.

Compressed dynamic-Huffman table (CDHT) 367 and compressed dynamic-Huffman-table length (CDHTL) fields 366 of the parameter block are updated. When partial completion occurs while processing a block with BTYPE value of 10 binary, the bytes of the CDHT field not required to represent the table are stored as zeros. When partial completion occurs while processing a block with BTYPE value of 00 or 01 binary, zeros are stored to the CDHT and CDHTL fields.

History length (HL) field 385 of the parameter block is updated.

History offset (HO) field 386 of the parameter block is updated, when applicable.

Check value field 387 of the parameter block is updated.

A model-dependent value is stored to the model version number (MVN) field 363 of the parameter block.

Operation ending supplemental code (OESC) field 365 of the parameter block is set to zeros.

Incomplete function status (IFS) field 383 of the parameter block is updated.

Incomplete function length (IFL) field 384 of the parameter block is updated, when applicable.

The address in general register $R_1$ is incremented by the number of bytes stored at the first operand location, and the length in general register $R_1+1$ is decremented by the same number.

The address in general register $R_2$ is incremented by the number of bytes processed of the second operand that included processing bit 0, and the length in general register $R_2+1$ is decremented by the same number. The number of bytes processed of the second operand that included processing bit 0 is the integer quotient resulting from an integer division with the dividend being the sum of the number of input bits processed and the original value of the SBB, and the divisor being a value of eight.

Condition code 2 is set.

The formation and updating of the addresses and lengths are dependent on the addressing mode.

Subsequent to the instruction ending with condition code 2 set, it is expected that the program modifies the second operand length, second operand address, or both and re-executes the instruction to resume the operation.

The first operand length is insufficient to complete the operation when the following applies, for instance:

Results from decoding data from the second operand location cannot be placed at the first operand location due to the first operand length being equal to zero.

When the first operand length is insufficient to complete the operation, the operation has been partially completed, the operation ends, and the following occurs, in one embodiment:

Continuation flag (CF) bit 373 in the parameter block is set to one.

Continuation state buffer (CSB) field 392 in the parameter block is updated.

Sub-byte boundary (SBB) field 381 of the parameter block is updated.

The compressed dynamic-Huffman table (CDHT) 367 and compressed dynamic-Huffman-table length (CDHTL) fields 366 of the parameter block are updated. When partial completion occurs while processing a block with BTYPE value of 10 binary, the bytes of the CDHT field not required to represent the table are stored as zeros. When partial completion occurs while processing a block with BTYPE value of 00 or 01 binary, zeros are stored to the CDHT and CDHTL fields.

History length (HL) field 385 of the parameter block is updated.

History offset (HO) field 386 of the parameter block is updated, when applicable.

Check value field 387 of the parameter block is updated.

A model-dependent value is stored to model version number (MVN) field 363 of the parameter block.

Operation ending supplemental code (OESC) field 365 of the parameter block is set to zeros.

Incomplete function status (IFS) field 383 of the parameter block is updated.

Incomplete function length (IFL) field 384 of the parameter block is updated, when applicable.

The address in general register $R_1$ is incremented by the number of bytes stored at the first operand location, and the length in general register $R_1+1$ is decremented by the same number.

The address in general register $R_2$ is incremented by the number of bytes processed of the second operand that included processing bit 0, and the length in general register $R_2+1$ is decremented by the same number. The number of bytes processed of the second operand that included processing bit 0 is the integer quotient resulting from an integer division with the dividend being the sum of the number of input bits processed and the original value of the SBB, and the divisor being a value of eight.

Condition code 1 is set.

The formation and updating of the addresses and lengths are dependent on the addressing mode.

Subsequent to the instruction ending with condition code 1 set, it is expected that the program modifies the first operand length, first operand address, or both and re-executes the instruction to resume the operation.

A PER storage-alteration event is recognized, when applicable, for the following:

Stores to the parameter block, as described herein.

Stores to the first operand location.

Stores to the third operand location, which occur, e.g., when the history buffer type (HBT) is one (circular).

In one example, when the entire parameter block overlaps the PER storage area designation, a PER storage alteration event is recognized, when applicable, for the parameter block. When only a portion of the parameter block overlaps the PER storage area designation, it is model-dependent which of the following occurs, in one embodiment:

A PER storage alteration event is recognized when applicable, for the parameter block.

A PER storage alteration event is recognized, when applicable, for the portion of the parameter block that is stored.

A PER zero-address-detection event is recognized when applicable, for the parameter block, first operand location, second operand location, and third operand location when the HBT is one (circular).

When the instruction ends with condition code 1, 2, or 3 set, input data referenced from the second operand location may be completely, or only partially, processed. When input data is only partially processed, results in the first operand location, first operand address, first operand length, SBB field of the parameter block, check value field of the parameter block, HL field of the parameter block, IFS field of the parameter block, and when applicable, the third operand location and HO field of the parameter block, do not represent a state consistent with the updated second operand address and length. In these cases, partially processed data and internal state information may be placed in the CSB field of the parameter block. The amount of partially processed data depends on conditions existing at the time the operation ends and the model. Although some data may only be partially processed, results stored to the left of the location designated by the updated first operand address are complete and will not be modified when the operation resumes. Furthermore, it is expected that the program subsequently re-executes the instruction to resume the operation, at which time the contents of the CSB field are referenced prior to resuming the operation. When the operation ends with condition code 0 set, all data is completely processed and all results associated with input and output data represent a consistent state.

Subsequent to the instruction ending with a non-zero condition code set, and prior to re-executing the instruction for the purpose of resuming the operation, the program should not modify any fields of the parameter block; otherwise results are unpredictable.

Compressed Data Blocks

In one example, the bytes of a compressed data block in storage are processed from, e.g., left to right. Compressed data blocks may, or may not, start or end on byte boundaries. A compressed data block is, for instance, a bit stream. Elements of the block are loaded into storage one bit at a time. The bit stream is loaded, e.g., from right to left within each byte of storage and in byte order from, e.g., left to right. When the element is a Huffman code, the bits are stored in order from, e.g., most significant bit to least significant bit of the element. When the element is not a Huffman code, the bits are stored in order from, e.g., least significant bit to most significant bit of the element.

FIG. 6 illustrates an example of a block 600 with block type 00 binary, which contains no compressed data symbols. The following applies to this example, in one embodiment:

Compressed data block 600 consists of a bit stream 602 which begins with bit 4 of byte 0, identified as b0, and ends with bit 0 of byte 7, identified as $b_{60}$.

The first element encountered in the bit stream is BFINAL (block header final bit) in bit 4 of byte 0.

The second element encountered in the bit stream is BTYPE (block type) in bits 2-3 of byte 0. In this example, the BTYPE is 00 binary.

Bits to the left of the BTYPE and to the right of a byte boundary are ignored when the BTYPE is 00 binary, which is bits 0-1 of byte 0 in this example.

The third element encountered in the bit stream is the least significant byte (LSB) of the LEN field, which is followed by the most significant byte (MSB) of the LEN field. The LEN field specifies the number of bytes in the block with literal data. Literal data is, e.g., uncompressed data. The bytes with literal data follow the NLEN field in the bit stream. NLEN is the one's complement of LEN. In one example, bytes 1-2 contain the LEN field in little-endian byte order.

The elements encountered in the bit stream following the LEN field are the least significant byte of the NLEN field, followed by the most significant byte of the NLEN field, respectively. Bytes 3-4 contain the NLEN field in little-endian byte order. The NLEN field is the one's complement of the LEN field.

Elements encountered in the bit stream following the NLEN field are uncompressed data, identified as literal bytes. Bytes 5-7 contain uncompressed data, which is unchanged from the source data used to generate this block.

None of the elements contained in this block are Huffman codes. Every element in this block is stored to the bit stream order in order from least significant bit to most significant bit of the element, as defined by the DEFLATE standard. Since the LEN, NLEN, and literal elements are each an integral number of bytes aligned on byte boundaries, these elements may be processed as units of bytes, and not necessarily as units of bits.

FIG. 7 illustrates an example of a block 700 with block type 01 binary, which contains compressed data symbols generated using a fixed-Huffman table (FHT). The following applies to this example, in one embodiment:

Compressed data block 700 consists of a bit stream 702 which begins with bit 4 of byte 0, identified as b0, and ends with bit 3 of byte 11, identified as b89.

The first element encountered in the bit stream is BFINAL in bit 4 of byte 0.

The second element encountered in the bit stream is BTYPE in bits 2-3 of byte 0. In this example, the BTYPE is 01 binary.

The fixed-Huffman table (FHT) is not a component of the block.

The third element encountered in the bit stream is the first compressed data symbol, which begins in bit 1 of byte 0. A compressed data symbol consists of the following sub-elements which are encountered in the bit stream in the order in which they are listed, in one example:

1. A Huffman code of variable length. The most significant bits of the code designate the length of the code. The code is encountered in the bit stream starting with the most significant bit of the code and ending with the least significant bit of the code. When the code represents a literal value or the end-of-block symbol, the code is the only sub-element of the compressed data symbol. When the code represents a length of a pointer to the history buffer, the code is followed by subsequent sub-elements of the compressed data symbol.

2. When applicable, as specified by the DEFLATE standard, extra length bits may follow the Huffman code representing a pointer length. Extra length bits are encountered in the bit stream starting with the least significant bit and ending with the most significant bit of the extra length bits.

3. The next sub-element encountered in the bit stream is a 5-bit distance code of a pointer to the history buffer. The distance code is encountered in the bit stream starting with, e.g., the most significant bit of the code and ending with the least significant bit of the distance code.

4. When applicable, as specified by the DEFLATE standard, extra distance bits may follow the distance code. Extra distance bits are encountered in the bit stream starting with the least significant bit and ending with the most significant bit of the extra distance bits.

Bits 0-1 of byte 0, all bits of bytes 1 through 9 and bits 2-7 of byte 10 contain bits of compressed data symbols, as an example.

The last element encountered in the bit stream is a compressed data symbol containing a single sub-element, which is the Huffman code representing the end-of-block (EOB) symbol. The EOB symbol for a block with BTYPE 01 binary is 0000000 binary. In this example, bit 1 of byte 10 contains the most significant bit of the EOB symbol and bit 3 of byte 11 contains the least significant bit of the EOB symbol.

Bit 3 of byte 11 contains the last bit of the bit stream, which is the last bit of the compressed data block.

Figure 8:
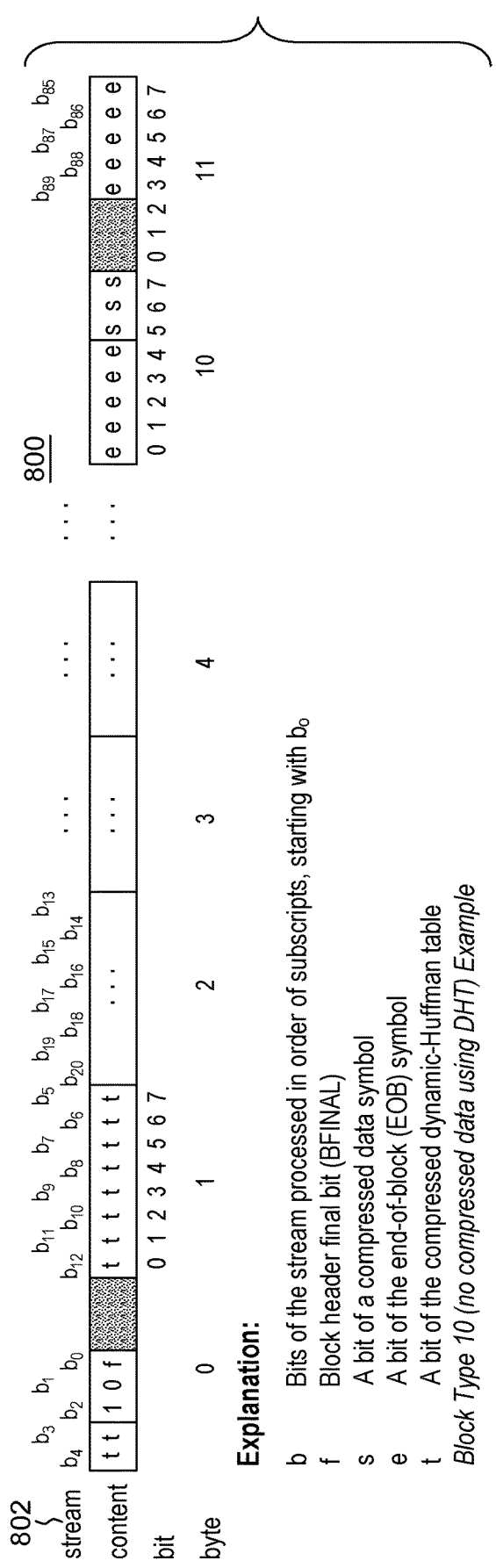
FIG. 8 depicts one example of a block with compressed data using a dynamic-Huffman table (DHT), in accordance with an aspect of the present invention.

FIG. 8 illustrates an example of a block 800 with block type 10 binary, which contains compressed data symbols generated using a dynamic-Huffman table (DHT). The following applies to this example, in one embodiment:

Compressed data block 800 consists of a bit stream 802 which begins with bit 4 of byte 0, identified as $b_0$, and ends with bit 3 of byte 11, identified as $b_{89}$.

The first element encountered in the bit stream is BFINAL in bit 4 of byte 0.

The second element encountered in the bit stream is BTYPE in bits 2-3 of byte 0. In this example, the BTYPE is 10 binary.

The third element encountered in the bit stream is the compressed representation of the dynamic-Huffman table (DHT), which begins in bit 1 of byte 0. The compressed representation of the DHT consists of the following sub-elements, which are encountered in the bit stream in the order which they are listed, in one example:

1. HLIT: The sum of the 5-bit HLIT sub-element and 257 specifies the number of Huffman codes representing literal bytes, an EOB symbol, and duplicate string lengths. Valid values of HLIT range from, e.g., 0 to 29. HLIT bits are encountered in the bit stream starting with the least significant bit and ending with the most significant bit of the HLIT sub-element. In this example, bit 1 of byte 0, identified as b3 is the least significant bit of the HLIT sub-element.

2. HDIST: The sum of the 5-bit HDIST sub-element and 1 specifies the number of Huffman codes representing duplicate string pointer distances. Valid values of HDIST range from, e.g., 0 to 29. HDIST bits are encountered in the bit stream starting with the least significant bit and ending with the most significant bit of the HDIST sub-element.

3. HCLEN: The sum of the 4-bit HCLEN sub-element and 4 specifies the number of Huffman codes representing code lengths. Valid values of HCLEN range from, e.g., 0 to 15. HCLEN bits are encountered in the bit stream starting with the least significant bit and ending with the most significant bit of the HCLEN sub-element.

4. A sequence of codes specifying a bit length for each of the code lengths defined for the compressed DHT. The number of codes is equal to the sum of HCLEN and 4. Each code is 3 bits.

5. A sequence of codes specifying a code length for each of the elements of the set consisting of literal bytes, an EOB symbol, and duplicate string lengths. The number of code lengths specified is equal to the sum of HLIT and 257.

When the last code length (CL) for the set of literal bytes, an EOB symbol, and duplicate string lengths is 16, 17, or 18, and the extra bits following the CL specify repeating the CL for more elements than are defined for the set, the code length also applies to the set of duplicate string pointer distances. The sequence of codes specifying code lengths for the set of literal bytes, an EOB symbol and duplicate string lengths, followed by the sequence of codes specifying code lengths for duplicate string pointer distances is a contiguous sequence for both sets.

6. A sequence of codes specifying a code length for each of the elements of the set consisting of duplicate string pointer distances. The number of code lengths specified is equal to the sum of HDIST and 1.

The fourth element encountered in the bit stream is the first compressed data symbol. A compressed data symbol consists of the following sub-elements, which are encountered in the bit stream in the order which they are listed, in one embodiment:

1. A Huffman code of variable length. The most significant bits of the code designate the length of the code. The code is encountered in the bit stream starting with the most significant bit of the code and ending with the least significant bit of the code. When the code represents a literal value or the end-of-block symbol, the code is the only sub-element of the compressed data symbol. When the code represents a length of a pointer to the history buffer, the code is followed by subsequent sub-elements of the compressed data symbol.

2. When applicable, as specified by the DEFLATE standard, extra length bits may follow the Huffman code representing a pointer length. Extra length bits are encountered in the bit stream starting with, e.g., the least significant bit and ending with the most significant bit of the extra length bits.

3. The next sub-element encountered in the bit stream is a 5-bit distance code of a pointer to the history buffer. The distance code is encountered in the bit stream starting with, e.g., the most significant bit of the code and ending with the least significant bit of the distance code.

4. When applicable, as specified by the DEFLATE standard, extra distance bits may follow the distance code. Extra distance bits are encountered in the bit stream starting with, e.g., the least significant bit and ending with the most significant bit of the extra distance bits.

Subsequent bits encountered in the bit stream, up to and including, e.g., bit 5 of byte 10, contain bits of compressed data symbols.

The last element encountered in the bit stream is a compressed data symbol containing a single sub-element, which is the Huffman code representing the end-of-block (EOB) symbol. In this example, bit 4 of byte 10 contains the most significant bit of the EOB symbol and bit 3 of byte 11 contains the least significant bit of the EOB symbol.

Bit 3 of byte 11 contains the last bit of the bit stream, which is the last bit of the compressed data block.

In the above descriptions of the various block types, certain constant values are specified, as well as specific bits, bytes, directions, etc. These are only examples. Other constant values, bits, bytes, directions, etc. may be specified in other embodiments.

Processing a Compressed Data Set

Figure 9:
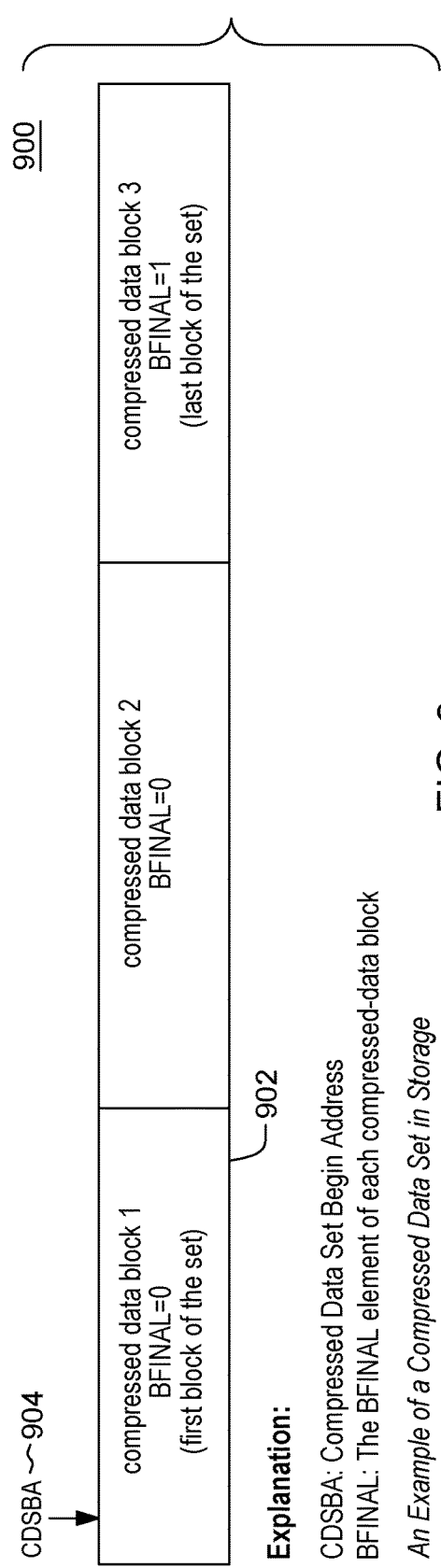
FIG. 9 depicts one example of a compressed data set in storage, in accordance with an aspect of the present invention.

Examples of processing a compressed data set to illustrate example uses of the DEFLATE Conversion Call instruction and augment the descriptions of various fields of the parameter block are provided. The examples do not describe all possible scenarios, requirements, and capabilities, but illustrate various of the scenarios, requirements and/or capabilities. The examples and descriptions apply, for instance, to a compressed data set in storage, an example of which is illustrated in FIG. 9. As shown, a compressed data set 900 includes a plurality of compressed data blocks 902, and a beginning of data set 900 is indicated by a compressed data set begin address (CDSBA) 904.

For the examples described herein, it is intended for a program processing the compressed data set to consider the following, in one embodiment:

A single parameter block may be defined and referenced by multiple usages of the DEFLATE Conversion Call instruction to process the entire compressed data set. Check value 387 and check value type 375 fields of the parameter block shall apply to the compressed data blocks (e.g., all blocks) in the compressed data set. Sub-byte boundary field 381 of the parameter block shall apply to transitions between individual blocks. History length 385 and history offset 386 may apply to multiple blocks. The remaining fields of the parameter block only apply, in one example, to the individual compressed data block being processed by a specific execution of a DEFLATE Conversion Call instruction.

An individual check value applies, e.g., to all of the uncompressed data represented by the compressed data set.

There is no history for the first compressed data symbol in block 1 to reference. Subsequent symbols in block 1 may reference history corresponding to previously encountered symbols in block 1. Symbols in block 2 may reference history corresponding to previously encountered symbols in blocks 2 and 1. Symbols in block 3 may reference history corresponding to previously encountered symbols in blocks 3, 2, and 1.

FIG. 10 lists one example of a portion of a sample program 1000 used to compress data in compressed data set 900 described in FIG. 9. Further, FIG. 11 lists the values for certain fields of the parameter block used during execution of the DFLTCC instruction located at the instruction address labeled IABLK1 (1002) in FIG. 10. For instance, FIG. 11 depicts various parameter block fields 1100; values for those fields at the start of the compress operation 1102; values for those fields at the end of the operation when condition code 1, 2 or 3 is set 1104; and values for those fields at the end of the operation when condition code 0 is set 1106.

Similarly, FIG. 12 lists the values for certain fields of the parameter block used during execution of the DFLTCC instruction located at the instruction address labeled IABLK2 (1004) of FIG. 10. These figures demonstrate some of the details associated with using the DEFLATE Conversion Call instruction multiple times to process an entire compressed data set.

Moreover, referring to FIG. 13, one example of a portion of a sample program 1300 used to decompress data from the compressed data set of FIG. 9 is depicted.

Compressing Data

The process of compressing data includes generating one or more compressed data blocks. The compress function of the DEFLATE Conversion Call instruction is used to construct a portion of an individual block. The portion may be the entire block. This function generates portions of a block with block type (BTYPE) 01 or 10 binary, and not 00 binary. When the new task bit (NT) of the parameter block is one, the first block of compressed data is generated and there is no history to reference from previously performed compressing operations.

In one example, an individual block contains the following elements in the order which they are listed:
1. Final block indication (BFINAL).
2. Block type (BTYPE).
3. Compressed format of a dynamic-Huffman table, when applicable.
4. Compressed data symbols.
5. End-of-block (EOB) symbol.

The compression operation generates the elements specified in the order defined for a block. The elements may begin or end between byte boundaries in storage. The sub-byte boundary (SBB) applies to storing of the first element to the first operand location. A compressed data block is a bit stream. Components of the block are loaded into storage one bit at a time. As an example, the bit stream is loaded from right to left within each byte of storage and in byte order from left to right.

When the SBB is non-zero, the reference to the first byte at the first operand location is an update reference.

Uncompressed data from the second operand location is compressed and stored as compressed data symbols to the first operand location.

When the first operand length is zero at the beginning of the execution of the instruction, the first operand is not accessed, and the first operand address and first operand length in general registers $R_1$ and $R_1+1$, respectively, are not changed. This applies when the value of CF field 373 (FIG. 3L) is zero or one at the beginning of execution of the instruction.

When the second operand length is zero at the beginning of execution of the instruction, the second operand is not accessed, and the second operand address and second operand length in general registers $R_2$ and $R_2+1$, respectively, are not changed. The second operand length is zero at the beginning of execution of the instruction for the following case, as an example:

The instruction is being re-executed to resume the operation (CF field 373 of the parameter block is one at the beginning of execution of the instruction) and completing the operation can be performed with references to CSB field 392 of the parameter block, and without references to the second operand.

In one embodiment, the program is not to use the DEFLATE Conversion Call instruction to perform the following operations:

Generate an empty compressed data block. An empty compressed data block consists of, e.g., a block header, a compressed format of a DHT when applicable, and an EOB symbol.

Close an open compressed data block. That is, only store an EOB symbol to the end of the compressed data block.

The compression algorithm includes searching an updated history of recently compressed data for a string of bytes which matches data currently being compressed from the second operand location. Before the compression operation begins or resumes, the following applies, in one embodiment:

When new task (NT) 374 is one, there is no initial history available to reference.

When NT is zero, and bit 56 of general register 0 (HBT) is zero (in-line), the initial history available to reference is located to the left of, and adjacent to, the leftmost byte of the second operand, and the length of the initial history is specified by history length (HL) field 385 of the parameter block.

When NT is zero, and bit 56 of general register 0 (HBT) is one (circular), the initial history available to reference is located in the third operand location, as specified by history offset (HO) 386 and history length (HL) 385 fields of the parameter block.

During the compression operation, fetch-type references to the entire history may be made, regardless of which bytes of history are used to perform the operation. Furthermore, when the history buffer type is circular, fetch-type references to the entire 32 K-byte history buffer may be made, regardless of which bytes of history are used to perform the operation.

During the compression operation, history is updated. Subsequent to encoding one or more bytes of source data into a compressed data symbol without encountering a general operand data exception condition, the source bytes are concatenated to the end of the history. The most recently processed bytes of source data, up to a maximum of 32 K-bytes, constitute the updated history available to reference while processing subsequent bytes of source data.

When the compression operation ends, the following applies, in one example, to the resulting history available to subsequently resume the operation, or begin another operation:

When the HBT is in-line, storage updates to the second operand location are not required when the history is updated. The updated second operand address and updated HL specify the updated location and updated length of the resulting history.

When the HBT is circular, storage updates to the third operand location are performed when the history is updated. The third operand address, updated HO, and updated HL specify the updated location and updated length of the resulting history.

As examples, FIGS. 14A-14C illustrate the location of an in-line history buffer with respect to the second operand before and after multiple executions of a DEFLATE Conversion Call instruction with the DFLTCC-CMPR function specified, as well as in-line history specified (e.g., bit 310=0), when each execution ends with partial completion. For instance, FIG. 14A depicts in-line history before DFLTCC-CMPR execution number 1; FIG. 14B depicts in-line history before DFLTCC-CMPR execution number 2 and after execution number 1; and FIG. 14C depicts in-line history after DFLTCC-CMPR execution number 2. The explanation provided in FIG. 14C also applies to FIGS. 14A and 14B.

When the HBT (history buffer type) specified by bit 56 of general register 0 is circular (e.g., bit 310=1), the history is maintained in, for instance, a 32 K-byte buffer located at the third operand location. The location of the first byte of history within the buffer (HB) is designated by, e.g., the sum of the contents of general register $R_3$ and history offset (HO) 386 (FIG. 3L). The first byte of history is the least recently processed byte of uncompressed data in the buffer. The location of the last byte of history within the buffer (HE) is designated by the following equation, as an example:

$$HE=R_3+\mathrm{modulo}32K(HO+HL-1)$$

The last byte of history is the most recently processed byte of uncompressed data in the buffer. When the sum of history offset (HO) 386 (FIG. 3L) and history length (HL) 385 exceeds the size of the third operand (e.g., 32 K-bytes), the history wraps from the end of the third operand to the beginning of the third operand.

Figure 15A:
Figure 15B:
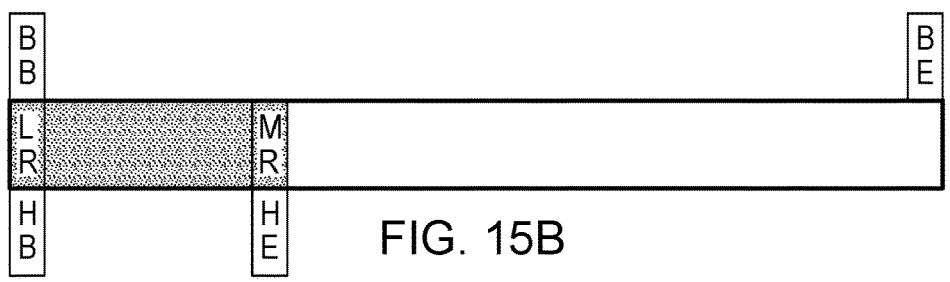
Figure 15C:
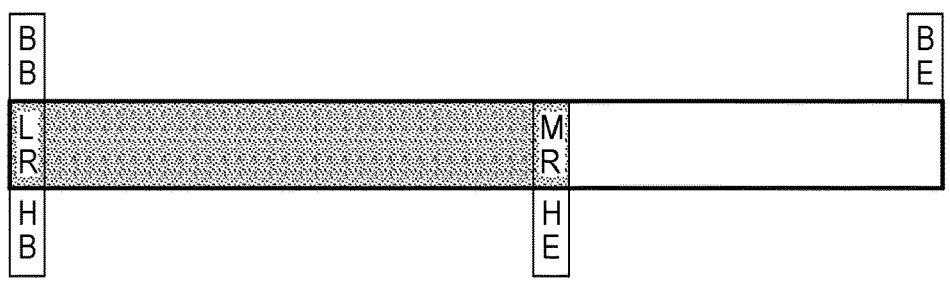
Figure 15D:
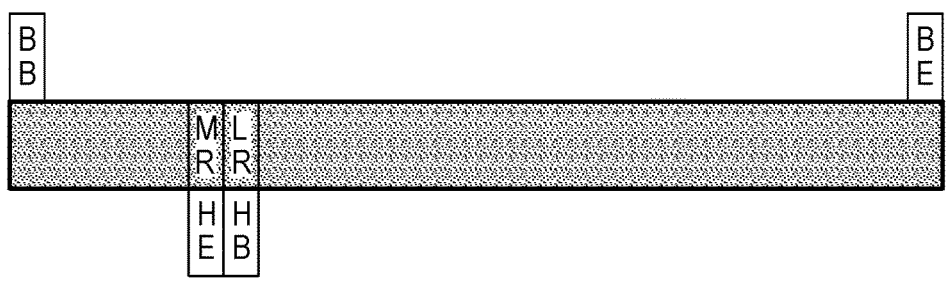

As examples, FIGS. 15A-15E illustrate the location of the history within a circular history buffer before and after multiple executions of a DEFLATE Conversion Call instruction with the DFLTCC-CMPR function specified, as well as a circular history buffer specified (bit 310=1), when each execution ends with partial completion. For instance, FIG. 15A depicts a circular history buffer before DFLTCC execution number 1; FIG. 15B depicts a circular buffer before DFLTCC execution number 2 and after execution number 1; FIG. 15C depicts a circular buffer before DFLTCC execution number 3 and after execution number 2; FIG. 15D depicts the circular buffer before DFLTCC execution number 4 and after DFLTCC execution number 3; and FIG. 15E depicts the circular buffer before after DFLTCC execution number 4. The explanation provided in FIG. 15E also applies to FIGS. 15A-15D.

When the HBT is circular and the number of bytes processed from the second operand location is less than, e.g., 32,768, the following applies, in one example:

Stores are made to a range of bytes in the third operand location. The range of bytes includes and starts with the location designated by, for instance:

$R3+\text{modulo}32K(HOO+HLO)$, where

HOO: The history offset before the instruction executes.
HLO: The history length before the instruction executes.
The range of bytes includes and ends with the location designated by, e.g.:

$R3+\text{modulo}32K(HOO+HLO+BP-1)$, where

BP: The number of bytes processed from the second operand location during execution of the instruction.
Stores made to the range of bytes just described are subject to store-type access exceptions, PER storage alteration events, and setting change bits, as an example.
Stores which do not modify the contents of storage locations and are not necessary, may be made to bytes in the third operand location which are not included in the range just described. Stores to such locations are also subject to store type access exceptions, PER storage alteration events, and setting change bits.

When the HBT is circular and the number of bytes processed from the second operand location is more than, or equal to, e.g., 32,768, stores are made to all bytes of the third operand location and subject to store type access exceptions, PER storage alteration events, and setting change bits.

When the block continuation flag (BCF) 377 is zero, a 3 bit block header, including BFINAL followed by BTYPE, is stored to the first operand location. The BFINAL bit of the block header is set equal to the block header final bit (BHF) 379 of the parameter block. When the Huffman table type (HTT) 376 is zero, the BTYPE field of the block header is set to, e.g., 01 binary and when the HTT is one, the BTYPE field of the block header is set to, e.g., 10 binary. When a block header is stored, the BFINAL bit is stored to the bit specified by the SBB in the first byte of the first operand. Subsequently, the BTYPE is stored to the first operand location. When the BCF is one, a block header is not stored.

When the Huffman table type (HTT) is one, the compressed format of the dynamic-Huffman table (DHT) 367 specified in the parameter block is examined for general operand data exception conditions. When a general operand data exception condition exists for the specified compressed format of the DHT, the compressed DHT is referred to as invalid and is not to be used to compress data. Example definitions of general operand data exception conditions are described further below. When the compressed format of the DHT specifies a bit length for a code length, or a code length for a literal byte, the EOB symbol, a duplicate string length, or a duplicate string pointer distance, which is greater than the length required by the Huffman algorithm to specify a proper and functional Huffman tree, the compressed DHT is still used to derive a functional DHT and compress data. When the block continuation flag (BCF) is zero and the HTT is one, the compressed format of the DHT, as specified in CDHT field 367 of the parameter block is stored to the first operand location.

During the compression operation, source data from the second operand location is encoded into compressed data symbols. As part of the encoding, source data is compared to the history. When no match is found, the intermediate representation of the source data is literal bytes, which is the same as the source data. When a match is found, the intermediate representation of the source data is a pointer to a location within the history which contains a duplicate copy of the source data. A pointer consists of a length and a distance. The length is the number of source data bytes which match a string in the history. The distance is the number of bytes from the end of the history to the beginning of the string which matches the source data. Two Huffman code trees from the Huffman table are used, in one example, to encode the intermediate representation of the source data into compressed data symbols. When the Huffman table type (HTT) is zero, a fixed-Huffman table (FHT), as described by the DEFLATE standard, specifies the two Huffman code trees used for encoding intermediate results. When HTT 376 is one, the dynamic-Huffman table (DHT), which is derived from the compressed representation of the DHT, specified in CDHT field 367 of the parameter block, specifies the two Huffman code trees used for encoding intermediate results. The encoding is performed as described by the DEFLATE standard. When a non-universal DHT is used which does not specify a Huffman code to be used to encode the intermediate representation of the source data, a general operand data exception is recognized. The bits of the resulting compressed data symbol are arranged in the order specified by the DEFLATE standard before storing the result to the first operand location.

In one example, duplicate-string lengths range from 3 to 258 bytes.

Prior to processing further source data, the history is updated, as described herein.

The process is repeated, in one example, until all source bytes have been processed.

After the source bytes (e.g., all source bytes) have been processed and the block closing control (BCC) 378 is one, an end-of-block (EOB) symbol is stored to the first operand location. When a fixed-Huffman table is used, Huffman code 0000000 binary is used for the EOB symbol. When a dynamic-Huffman table (DHT) is used, the Huffman code used for the EOB symbol is specified by the DHT. The bits of the EOB symbol are arranged in the order specified by the DEFLATE standard before storing the EOB symbol to the first operand location.

When the last compressed data symbol of the operation (including the EOB symbol), only occupies a portion of the last byte to store, the bits that do not contain a portion of the last symbol are stored as zeros, in one example.

Subsequent to processing the last compressed data symbol, the following occurs, in one embodiment:

A model-dependent value is stored to model version number (MVN) field 363 of the parameter block.
Sub-byte boundary (SBB) field 381 of the parameter block is updated.

End-of-block length (EOBL) 389 and end-of block symbol (EOBS) 388 fields of the parameter block are updated.

The address in general register $R_1$ is incremented by the number of bytes processed of the first operand that included processing bit 0, and the length in general register $R_1+1$ is decremented by the same number. The number of bytes processed of the first operand that included processing bit 0 is the integer quotient resulting from an integer division with the dividend being the sum of the number of output bits processed and the original value of the SBB, and the divisor being a value of eight.

The address in general register $R_2$ is incremented by the number of source bytes processed, and the length in general register $R_2+1$ is decremented by the same number.

The formation and updating of the addresses and lengths are dependent on the addressing mode.

Coincident with compressing the source data, the source data is an input to generating a 32-bit check value, described above. The resulting check value is stored to check value field 387 of the parameter block.

Uncompressing Data

In one embodiment, the expand function of the DEFLATE Conversion Call instruction is used to decode a compressed data set into uncompressed data. The compressed data set in the second operand location includes one or more consecutive compressed data blocks. The blocks of the data set are processed from left to right, in one example, and the bytes of a block are processed, e.g., from left to right. The blocks may or may not start or end on byte boundaries. Each block is decoded independent of other blocks in the data set. General register $R_2$ specifies the logical address of the leftmost byte of the first block in the data set. The last block in the data set is the block encountered during processing with the BFINAL bit equal to one. In one example, there are three types of blocks to process. The technique of decoding the contents of a block is a function of the block type (BTYPE).

When the operation begins (e.g., when continuation flag field 373 of the parameter block is zero), the bit designated by general register $R_2$, new task (NT) field 374, and sub-byte boundary (SBB) field 381 is interpreted as the first bit of a compressed data block (the BFINAL bit of a block header).

The expand function includes referencing an updated history of recently decoded uncompressed data. Before the uncompressing operation begins or resumes, the following applies, in one embodiment:

When new task (NT) 374 is one, there is no initial history available to reference.

When NT is zero, and bit 56 of general register 0 (HBT) is zero (in-line), the initial history available to reference is located to the left of, and adjacent to, the leftmost byte of the first operand, and the length of the initial history is specified by history length (HL) field 385 of the parameter block.

When NT is zero, and bit 56 of general register 0 (HBT) is one (circular), the initial history available to reference is located in the third operand location, as specified by history offset (HO) 386 and history length (HL) 385 fields of the parameter block.

During the operation, fetch-type references to the entire history may be made, regardless of which bytes of history are used to perform the operation. Furthermore, when the history buffer type is circular, fetch-type references to the entire history buffer (e.g., 32 K-byte) may be made, regardless of which bytes of history are used to perform the operation.

During the uncompressing operation, history is updated. Subsequent to decoding source data without encountering a general operand data exception condition, the resulting bytes of uncompressed data are concatenated to the end of the history. The most recently decoded bytes of uncompressed data, up to a maximum of, e.g., 32 K-bytes, constitute the updated history available to reference while processing subsequent source data.

When the uncompressing operation ends, the following applies to the resulting history available to subsequently resume the operation, or begin another operation, in one example:

When the HBT is in-line, storage updates to the first operand location also constitute updates to the resulting history. The updated first operand address and updated HL specify the updated location and updated length of the resulting history.

When the HBT is circular, storage updates to the third operand location are performed when the history is updated. The third operand address, updated HO, and updated HL specify the updated location and updated length of the resulting history.

As examples, FIGS. 16A-16C illustrate examples of the location of an in-line history buffer with respect to the first operand before and after multiple executions of a DEFLATE Conversion Call instruction with the DFLTCC-XPND function specified, as well as in-line history specified, when each execution ends with partial completion. History length (HL) 385 is modified during the operation. For instance, FIG. 16A depicts one example of the in-line history prior to DFLTCC-XPND execution number 1; FIG. 16B depicts an example of the in-line history before DFLTCC-XPND execution number 2 and after execution number 1; and FIG. 16C depicts an example of the in-line history after DFLTCC-XPND execution number 2. The explanation provided in FIG. 16C also applies to FIGS. 16A-16B.

When the HBT specified by bit 56 of general register 0 is circular, the history is maintained in, for instance, a 32 K-byte buffer located at the third operand location. The location of the first byte of history within the buffer (HB) is designated by the sum of the contents of general register $R_3$ and history offset (HO) 386. The first byte of history is the least recently processed byte of uncompressed data in the buffer. The location of the last byte of history within the buffer (HE) is designated by, e.g., the following equation:

$$HE = R_3 + \text{modulo32}K(HO + HL - 1).$$

The last byte of history is the most recently processed byte of uncompressed data in the buffer. When the sum of the history offset (HO) and history length (HL) exceeds the size of the third operand (e.g., 32 K-bytes), the history wraps from the end of the third operand to the beginning of the third operand. FIGS. 15A-15E, described herein, illustrate examples of the location of the history within a circular history buffer before and after multiple executions of a DEFLATE Conversion Call instruction with the DFLTCC-XPND function and a circular history buffer specified, when each execution ends with partial completion.

When the HBT is circular and the number of bytes stored to the first operand location is less than, e.g., 32,768, the following applies, in one example:

Stores are made to a range of bytes in the third operand location. The range of bytes includes and starts with the location designated by:

$$R_3 + \text{modulo32}K(HOO + HLO), \text{ where}$$

HOO: The history offset before the instruction executes.
HLO: The history length before the instruction excutes.
The range of bytes includes and ends with the location designated by, e.g., $R_3+\text{modulo}32K(HOO+HLO+BP-1)$, where BP: The number of bytes stored to the first operand location during execution of the instruction.

Stores made to the range of bytes just described are subject to store-type access exceptions, PER storage-alteration events, and setting change bits.

Stores which do not modify the contents of storage locations and are not necessary, may be made to bytes in the third operand location which are not included in the range just described. Stores to such locations are also subject to store-type access exceptions, PER storage-alteration events, and setting change bits.

When the HBT is circular and the number of bytes stored to the first operand location is more than, or equal to, e.g., 32,768, stores are made to, e.g., all bytes of the third operand location and subject to store-type access exceptions, PER storage-alteration events, and setting change bits.

When the BTYPE is 00 binary, the block does not contain compressed data. FIG. 6, described herein, illustrates one example of a block with BTYPE equal 00 binary. The LEN field specifies the number of literal bytes in the block. The byte order of the LEN field is little-endian. The LEN field may specify zero literal bytes. The literal bytes of the block are placed at the first operand location. The history is also updated, as previously described, with each literal byte of the block.

When the BTYPE is 01 binary, the block contains compressed data symbols that were generated using a fixed-Huffman table (FHT). The FHT is defined by the DEFLATE standard and is not part of the block. FIG. 7, as described herein, illustrates one example of a block with BTYPE equal 01 binary. Subsequent to interpreting the block header, compressed data symbols are decoded in the order in which they appear in the block. Bytes of the block are processed from, e.g., left to right and bits within each byte of the block are processed from, e.g., right to left. In one example, each symbol is completely processed prior to processing the next symbol in the block. Each symbol which is not the end-of-block (EOB) symbol represents a literal value or a pointer to a substring previously decoded in the history buffer. A previously decoded substring is also referred to as a duplicate string. In one example, duplicate string lengths range from 3 to 258 bytes. A pointer consists of codes representing the substring length and the distance from the end of the history to the beginning of the substring. When a symbol represents a substring in the history, the substring is referenced from the history buffer. The uncompressed data resulting from decoding a symbol is placed at the first operand location.

Prior to processing further source data, the history is updated as previously described.

The updated history applies to decoding the next symbol of the block. When the EOB symbol is encountered, processing of the block is complete.

When the BTYPE is 10 binary, the block contains compressed data symbols that were generated using a dynamic-Huffman table (DHT). A compressed format of the DHT used is an element of the compressed data block. FIG. 8, described herein, illustrates one example of a block with BTYPE equal 10 binary. Subsequent to interpreting the block header, the compressed format of the DHT provided within the compressed data block is examined for general operand data exception conditions. When a general operand data exception condition exists for the provided compressed format of the DHT, the compressed format of the DHT is referred to as invalid and is not to be used to uncompress data. When the compressed format of the DHT specifies a bit length for a code length, or a code length for a literal byte, the EOB symbol, a duplicate string length, or a duplicate string pointer distance, which is greater than the length required by the Huffman algorithm to specify a proper and functional Huffman tree, the compressed DHT is still used to derive a functional DHT and compress data. Subsequent to examining the compressed format of the DHT, compressed data symbols are decoded in the order in which they appear in the block. Bytes of the block are processed, e.g., from left to right and bits within each byte of the block are processed from, e.g., right to left. Each symbol is completely processed, in one example, prior to processing the next symbol in the block. The processing of symbols in a block with BTYPE 10 binary is the same as previously described for processing symbols in a block with BTYPE 01, except the former uses the DHT provided to decode symbols, and the latter uses the FHT to decode symbols. When a non-universal DHT is provided which does not specify a Huffman code to be used to decode a compressed data symbol, a general operand data exception is recognized.

Coincident with uncompressing the second operand, the uncompressed data is an input to generating a check value (e.g., a 32-bit check value). The resulting check value is stored to check value field 387 of the parameter block.

Subsequent to processing the last block of the data set, the following occurs, in one embodiment:

A model-dependent value is stored to model version number (MVN) field 363 of the parameter block.

Sub-byte boundary (SBB) field 381 of the parameter block is updated.

The address in general register $R_1$ is incremented by the number of bytes stored at the first operand location, and the length in general register $R_1+1$ is decremented by the same number.

The address in general register $R_2$ is incremented by the number of bytes processed of the second operand that included processing bit 0, and the length in general register $R_2+1$ is decremented by the same number. The number of bytes processed of the second operand that included processing bit 0 is the integer quotient resulting from an integer division with the dividend being the sum of the number of input bits processed and the original value of the SBB, and the divisor being a value of eight.

The formation and updating of the addresses and lengths are dependent on the addressing mode.

When the first operand length is zero at the beginning of the execution of the instruction, the first operand is not accessed, and the first operand address and first operand length in general registers $R_1$ and $R_1+1$, respectively, are not changed. This applies when the value of CF field 373 is zero or one at the beginning of the execution of the instruction.

When the second operand length is zero at the beginning of the execution of the instruction, the second operand is not accessed, and the second operand address and second operand length in general registers $R_2$ and $R_2+1$, respectively, are not changed. The second operand length is zero at the beginning of the execution of the instruction for the following case, in one embodiment:

The instruction is being re-executed (e.g., CF field 373 of the parameter block is one at the beginning of the execution of the instruction) and the entire second operand was processed when the instruction was previously executed.

The uncompressing operation may end without storing any results to the first operand location, even though data was processed from the second operand location. This occurs when the data processed from the second operand location only contains any of the following compressed data block elements, in an example:

A block header.
The LEN field of a block with block type 00 binary.
The NLEN field of a block with block type 00 binary.
A compressed format of a dynamic-Huffman table.
An end-of-block (EOB) symbol.

The following conditions apply to executing the DEFLATE Conversion Call instruction, in one or more embodiments:

A general operand data exception is recognized when the DFLTCC-GDHT function is specified and the following condition occurs, in one example:

The format of the parameter block, as specified by parameter block version number 362, is not supported by the model.

A general operand data exception is recognized when the DFLTCC-CMPR function is specified and any of the following conditions occur, in one example:

The format of the parameter block, as specified by parameter block version number 362, is not supported by the model.

NT 374 is zero and HL 385 is greater than, e.g., 32,768.

HTT 376 is one and CDHTL 366 is less than, e.g., 42 or greater than, e.g., 2283.

HTT 376 is one and CDHTL 366 does not equal the length of the compressed format of the DHT specified in CDHT field 367.

HTT 376 is one and the HLIT sub-element of the compressed format of the DHT is greater than, e.g., 29 (invalid DHT).

HTT 376 is one and the HDIST sub-element of the compressed format of the DHT is greater than, e.g., 29 (invalid DHT).

HTT 376 is one and the compressed format of the DHT (contents of CDHT field 367) specifies a code which is in the sequence of codes specifying the bit lengths for the, e.g., 19 possible code lengths defined for a compressed DHT, and is less than the length required by the Huffman algorithm to specify a functional Huffman tree (invalid DHT).

HTT 376 is one and the compressed format of the DHT (contents of CDHT field 367) specifies code length, e.g., 16 (copy previous code length) as the first code length for the set of elements consisting of literal bytes, an EOB symbol, and duplicate string lengths (invalid DHT).

HTT 376 is one and the compressed format of the DHT (contents of CDHT field 367) specifies a code which is in the sequence of codes specifying code lengths for literal bytes, and the code does not match any of the codes determined to represent the set of referenced code lengths, as specified earlier in the compressed DHT (invalid DHT).

HTT 376 is one and the compressed format of the DHT (contents of CDHT field 367) specifies a code which assigns code length 0 (CL0) to the EOB symbol. In this case, the corresponding DHT does not specify a Huffman code to represent an EOB symbol (invalid DHT).

HTT 376 is one and the compressed format of the DHT (contents of the CDHT field 367) specifies a code which is in the sequence of codes specifying code lengths for duplicate string lengths and pointer distances, and the code does not match any of the codes determined to represent the set of referenced code lengths, as specified earlier in the compressed DHT (invalid DHT).

HTT 376 is one and the compressed format of the DHT (contents of the CDHT field 367) specifies a number of code lengths which is greater than the number of Huffman codes in the DHT, as specified by the sum of the values in the HLIT field, the HDIST field, and, e.g., 258. This is possible with improper uses of code lengths 16, 17, and 18, as examples (invalid DHT).

HTT 376 is one and the compressed format of the DHT (contents of the CDHT field 367) specifies a code length for the set of literal bytes, EOB symbol, and duplicate string lengths, which is less than the length required by the Huffman algorithm to specify a functional Huffman tree (invalid DHT).

HTT 376 is one and the compressed format of the DHT (contents of the CDHT field 367) specifies a code length for the set of duplicate string pointer distances, which is less than the length required by the Huffman algorithm to specify a functional Huffman tree (invalid DHT).

The CPU attempts to generate a compressed data symbol to represent a literal byte in the second operand, and the DHT derived from the contents of the CDHT field is non-universal and does not specify a Huffman code corresponding to that literal byte.

The CPU attempts to generate a compressed data symbol to represent a duplicate string in the second operand, and the DHT derived from the contents of the CDHT field is non-universal and does not specify a Huffman code corresponding to that duplicate string length or pointer distance.

A general operand data exception is recognized when, for instance, the DFLTCC-XPND function is specified and any of the following conditions occur, as examples:

The format of the parameter block, as specified by parameter block version number 362, is not supported by the model.

NT 374 is zero and HL 385 is greater than, e.g., 32,768.

A compressed data block with BTYPE equal 11 binary is encountered.

A compressed data block with BTYPE equal 00 binary and NLEN not equal to the one's complement of LEN is encountered.

A compressed format of a DHT (contents of a compressed data block with BTYPE equal 10 binary) is encountered and the HLIT sub-element of the compressed DHT is greater than, e.g., 29 (invalid DHT).

A compressed format of a DHT (contents of a compressed data block with BTYPE equal 10 binary) is encountered and the HDIST sub-element of the compressed DHT is greater than, e.g., 29 (invalid DHT).

A compressed format of a DHT (contents of a compressed data block with BTYPE equal 10 binary) is encountered which specifies a code which is in the sequence of codes specifying the bit lengths for, e.g., the 19 possible code lengths defined for a compressed DHT, and is less than the length required by the Huffman algorithm to specify a functional Huffman tree (invalid DHT).

A compressed format of a DHT (contents of a compressed data block with BTYPE equal 10 binary) is encountered which specifies code length, e.g., 16 (copy previous code length) as the first code length for the set of elements consisting of literal bytes, an EOB symbol, and duplicate string lengths (invalid DHT).

A compressed format of a DHT (contents of a compressed data block with BTYPE equal 10 binary) is encountered which specifies a code which is in the sequence of codes specifying code lengths for literal bytes, and the code does not match any of the codes determined to represent the set of referenced code lengths, as specified earlier in the compressed DHT (invalid DHT).

A compressed format of a DHT (contents of a compressed data block with BTYPE equal 10 binary) is encountered which specifies a code which assigns code length 0 (CL0) to the EOB symbol. In this case, the corresponding DHT does not specify a Huffman code to represent an EOB symbol (invalid DHT).

A compressed format of a DHT (contents of a compressed data block with BTYPE equal 10 binary) is encountered which specifies a code which is in the sequence of codes specifying code lengths for duplicate string lengths and pointer distances, and the code does not match any of the codes determined to represent the set of referenced code lengths, as specified earlier in the compressed DHT (invalid DHT).

A compressed format of a DHT (contents of a compressed data block with BTYPE equal 10 binary) is encountered which specifies a number of code lengths which is greater than the number of Huffman codes in the DHT, as specified by the sum of the values in the HLIT field, the HDIST field, and, e.g., 258. This is possible with improper uses of code lengths 16, 17, and 18, as examples (invalid DHT).

A compressed format of a DHT (contents of a compressed data block with BTYPE equal 10 binary) is encountered which specifies a code length for the set of literal bytes, EOB symbol, and duplicate string lengths, which is less than the length required by the Huffman algorithm to specify a functional Huffman tree (invalid DHT).

A compressed format of a DHT (contents of a compressed data block with BTYPE equal 10 binary) is encountered which specifies a code length for the set of duplicate string pointer distances, which is less than the length required by the Huffman algorithm to specify a functional Huffman tree (invalid DHT).

A compressed data symbol, which is encountered in a compressed data block with BTYPE equal 10 binary, specifies a Huffman code which is not defined by the non-universal DHT derived from the compressed format of the DHT in the same block. In this case, the number of bits of the second operand which are to be available to process, for the purpose of recognizing the general operand data exception, is model-dependent. More specifically, a model attempting to decode an undefined code may process, e.g., 15 bits prior to recognizing the exception, even though the exception could be determined after processing less bits.

A compressed data symbol is encountered which is a duplicate string pointer and specifies a distance greater than the length of history available at the point of processing the symbol.

A compressed data symbol, which is encountered in a compressed data block with BTYPE equal 01 binary, specifies an invalid code (e.g., a code of 11000110 or 11000111 binary for a duplicate string length, or a code of 11110 or 11111 binary for a duplicate string pointer distance). In this case, the number of bits of the second operand which are to be available to process, for the purpose of recognizing the general operand data exception, is model-dependent. More specifically a model attempting to decode an invalid code may process, e.g., 8 bits, in the case of a duplicate string length, or 5 bits, in the case of a duplicate string pointer distance, prior to recognizing the exception, even though the exception could be determined after processing less bits.

When a general operand data exception is recognized, the operation is considered suppressed, even though operation ending supplemental code (OESC) 365 and model version number (MVN) fields 363 of the parameter block are updated to provide additional information associated with the exception.

When a DFLTCC-CMPR or DFLTCC-XPND function is being executed and a general operand data exception is due to be recognized for the second operand, the result is that either the exception is recognized, or the operation ends with partial completion and condition code, e.g., 3 is set. If condition code 3 is set, the exception will be recognized when the instruction is executed again to continue processing the same operands and the exception condition still exists.

Other Conditions include, for instance:

The execution of the instruction is interruptible. When an interruption occurs, the addresses in general registers $R_1$ and $R_2$, the lengths in general registers $R_1+1$ and $R_2+1$, and specific fields of the parameter block are updated, so that the instruction, when reexecuted, resumes at the point of interruption.

When a DFLTCC-CMPR or DFLTCC-XPND function is being executed and an access exception is due to be recognized for the first or second operand, the result is that either the exception is recognized, or the operation ends with partial completion and condition code, e.g., 3 is set. If condition code 3 is set, the exception will be recognized when the instruction is executed again to continue processing the same operands and the exception condition still exists.

As observed by this CPU, other CPUs, and channel programs, references to the parameter block, first, second, and third operands may be multiple-access references, accesses to these storage locations are not necessarily block concurrent, and the sequence of these accesses or references is undefined.

Results are unpredictable if the DFLTCC-CMPR or DFLTCC-XPND function is specified and any of the following apply, in one embodiment:

The parameter block overlaps the first or second operand.

The first operand overlaps the second operand.

The specified history buffer type (HBT) is circular and the third operand overlaps the first operand, the second operand, or the parameter block.

The specified history buffer type (HBT) is in-line, the DFLTCC-CMPR function is specified, and the history overlaps the first operand or the parameter block.

The specified history buffer type (HBT) is in-line, the DFLTCC-XPND function is specified, and the history overlaps the second operand or the parameter block.

In certain situations, despite ending the execution of the DEFLATE Conversion Call instruction with a CPU-determined number of bytes processed being zero, data may have been stored to the first operand location, data may have been stored to the third operand location, when applicable, and corresponding change bits have been set, when applicable. In these cases, the contents of the parameter block and general registers have not been modified from original values. These situations may occur when the CPU performs a quiescing operation or a CPU retry while executing the DEFLATE Conversion Call instruction.

The following are example Resulting Condition Codes from executing the DEFLATE Conversion Call instruction:
0 Normal completion
1 The first operand length is insufficient to complete the operation
2 The second operand length is insufficient to complete the operation (DFLTCC-XPND)
3 CPU-determined amount of data processed Program Exceptions:
Access (fetch, operand 2, in-line history; fetch and store, parameter block, operand 1, operand 3)
Data with DXC 0, general operand
Operation (if the DEFLATE conversion facility is not installed)
Specification
Transaction constraint Example priorities of execution for the DEFLATE CONVERSION CALL instruction are shown below:
1.-6. Exceptions with the same priority as the priority of program-interruption conditions for the general case.
7.A Access exceptions for second instruction halfword.
7.B Operation exception.
7.C Transaction constraint.
8.A Specification exception due to invalid function code or invalid register number.
8.B Specification exception due to parameter block not designated on a 4 K-byte boundary.
8.C Specification exception due to circular history buffer not designated on a 4 K-byte boundary.
9. Access exceptions for an access to the parameter block.
10. General operand data exception when specified format of the parameter block is not supported by the mode.
11. Specification exception due to second operand length equal to zero and CF equal to zero at the beginning of the execution of the instruction.
12. Condition code 1 due to first operand length equal to zero at the beginning of the execution of the instruction and DFLTCC-CMPR is specified.
13.A General operand data exception due to the history length field greater than 32,768 and the new task field is zero when DFLTCC-CMPR or DFLTCC-XPND is specified.
13.B Access exceptions for an access to the first operand and the first operand length is non-zero.
13.C Access exceptions for an access to the second operand and the second operand length is non-zero.
13.D Access exceptions for an access to in-line history specified at the beginning of the execution of the instruction.
13.E Access exceptions for an access to the third operand.
14.A General operand data exception due to conditions other than those included in items 10 and 13.A above.
14.B Condition codes 1, 2 or 3 due to conditions other than those included in item 12 above.
15. Condition code 0.

Prior to usage, the compressed format of a DHT is examined for the existence of general operand data exception conditions. When the length of the compressed format of a DHT is not precisely defined due to a general operand data exception condition, the interpreted length may depend on the condition, be model-dependent, and does not exceed, e.g., 286 bytes. As a result, when the DFLTCC-XPND function is specified and a compressed format of a DHT with a general operand data exception condition is encountered in the, e.g., rightmost 286 bytes of the second operand, it is model-dependent whether the exception condition (priority 14.A) or condition code 2 (priority 14.B) is recognized.

Example programming notes are provided below:
1. When compressing or uncompressing data, it may be more efficient overall when the operation is performed with a minimum number of times the DEFLATE Conversion Call instruction is executed. In other words, executing DFLTCC with a large operand may be more efficient than executing DFLTCC with small operands multiple times.
2. For the compressing and uncompressing operations, when condition code 3 is set, the general registers used by the instruction and the parameter block have been updated such that the program can branch back to the instruction to continue the operation.
3. In one embodiment, the DEFLATE Conversion Call instruction is interruptible, but may be completed after performing a CPU-determined sub-portion of the processing specified by the parameters of the instruction. When the instruction is completed after performing only a CPU-determined amount of processing instead of all specified processing, the instruction sets condition code 3. On such completion, the instruction address in the PSW (program status word) designates the next sequential instruction, and the operand parameters of the instruction have been adjusted so that the processing of the instruction can be resumed by branching back to the instruction to execute it again. When the instruction has performed all specified processing, it sets a condition code other than 3.
4. When the DFLTCC-CMPR function is specified and the operation ends with a non-zero value in the sub-byte boundary (SBB) field of the parameter block, the operation included storing to the byte designated by the resulting first operand address. When the DFLTCC-XPND function is specified and the operation ends with a non-zero value in the SBB, the operation included fetching the byte designated by the resulting second operand address.
5. When the operation ends with a non-zero condition code set, CSB field 392 of the parameter block may contain partially processed data, and it is expected that the program re-executes the instruction to resume the operation.
6. Subsequent to an operation ending with a non-zero condition code set, and prior to re-executing the instruction for the purpose of resuming the operation, the program is not to modify any fields of the parameter block; otherwise results are unpredictable.
7. When the DFLTCC-GDHT function is specified, the compressed representation of a DHT generated describes three proper-full Huffman code trees, according to the Huffman algorithm. That is, no under-full Huffman code trees are described. An under-full Huffman code tree is derived from a compressed representation of a DHT which specifies a code length for an element which is greater than the length required by the Huffman algorithm to specify a proper and functional Huffman tree.

When the DFLTCC-CMPR function is specified, HTT is one, and the compressed representation of the DHT includes a description of an under-full Huffman code tree, the compressed data results can be transformed to the original uncompressed data by using the DFLTCC-XPND function, but not all decoders, which comply to the DEFLATE standard may be able to transform the results to the original uncompressed data. This may occur, for instance, when the compressed representation of a DHT specified by the program, for the DFLTCC-CMPR function was not generated as a result of performing the DFLTCC-GDHT function.

8. When the DFLTCC-CMPR function ends with condition code 1 set, the result stored to sub-byte boundary (SBB) field 381 of the parameter block is 000 binary. Recognizing this scenario may be relevant to a program allocating output buffers for use with the DEFLATE Conversion Call instruction.

As described herein, in one aspect, a single instruction (e.g., a single architected machine instruction at the hardware/software interface, e.g., DEFLATE Conversion Call instruction) is provided to perform compress and/or decompress operations using a general-purpose processor. This instruction is, for instance, a hardware instruction defined in an Instruction Set Architecture (ISA). As a result, the complexity of the program related to the compressing and/or decompressing operations is reduced. Further, performance of the operations, and thus, the processor, is improved.

Advantageously, the DEFLATE Conversion Call instruction is dispatched, by, e.g., a programmer, on a general-purpose processor (e.g., a central processing unit, referred to herein as a processor), rather than a special-purpose processor, such as an I/O device, an application specific device connected through an I/O interface, or other types of special-purpose processors. Compared to a software implementation, executing the disclosed instruction requires significantly fewer execution cycles to perform the same operation. Further, compared to dispatching an operation to an I/O device, executing the disclosed instruction does not require I/O operations by an operating system and does not trigger the operating system to perform a task switch while waiting for the operation to complete.

Although various fields and registers are described, one or more aspects of the present invention may use other, additional or fewer fields or registers, or other sizes of fields and registers, etc. Many variations are possible. For instance, implied registers may be used instead of explicitly specified registers or fields of the instruction and/or explicitly specified registers or fields may be used instead of implied registers or fields. Other variations are also possible.

Figure 17:
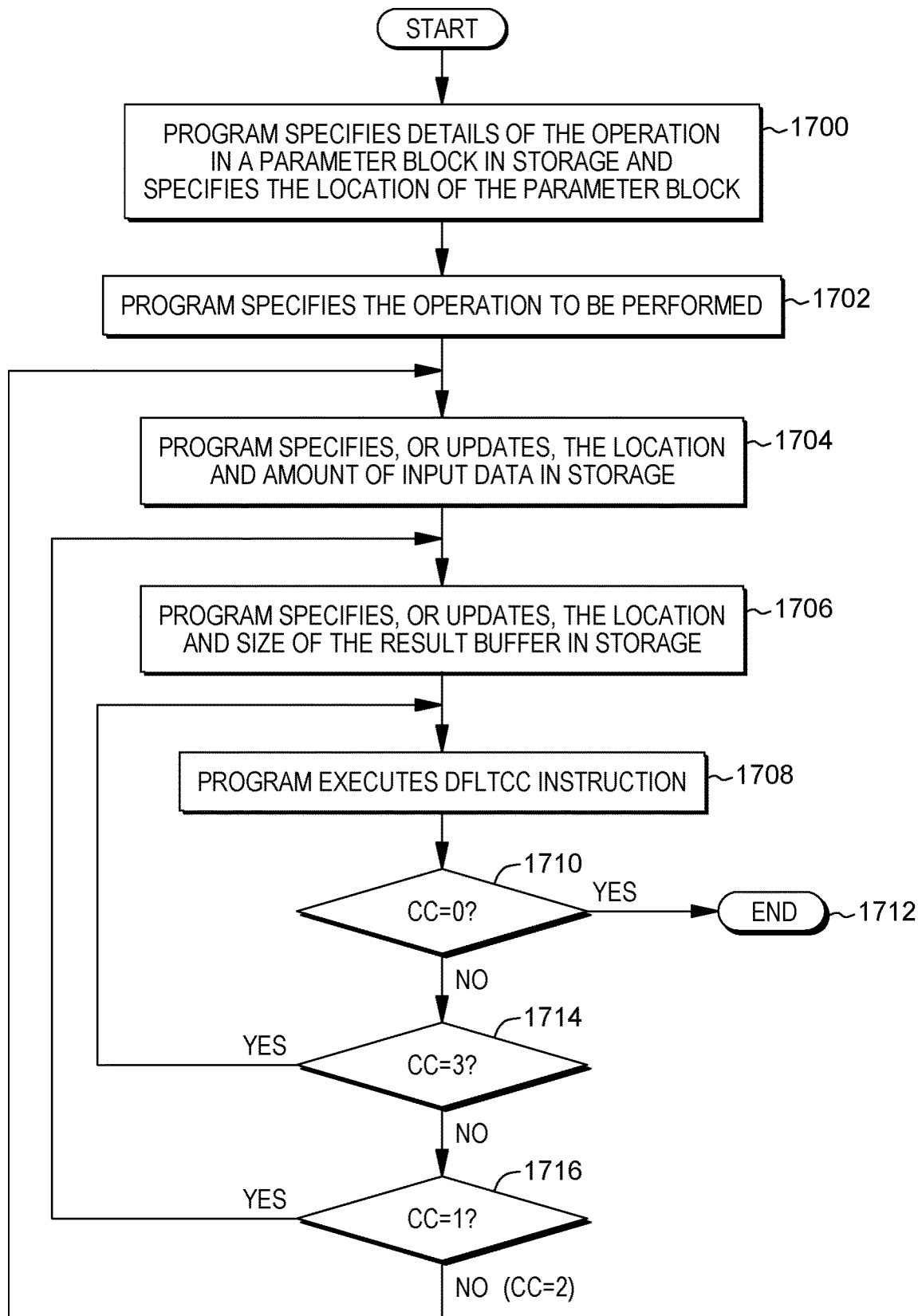
FIG. 17 depicts one example of using the DEFLATE Conversion Call instruction, in accordance with an aspect of the present invention.

One embodiment of using the DEFLATE Conversion Call instruction is described with reference to FIG. 17. In one example, a program executing on a processor, such as a general-purpose processor, specifies details of an operation to be performed in a parameter block in storage and specifies the location of the parameter block, STEP 1700. For instance, one or more of the fields of a parameter block (e.g., parameter block 340, 360 or 370) are provided or set, depending on the function to be performed. Further, the program specifies the operation to be performed (e.g., query, generate, compress, expand, etc.), STEP 1702. Additionally, the program specifies or updates the location and amount of input data in storage, STEP 1704, as well as the location and size of the result buffer in storage, STEP 1706.

Thereafter, the program executes the DEFLATE Conversion Call (DFLTCC) instruction, STEP 1708. In one example, the instruction is dispatched on a general-purpose processor. As examples, it is processed on the general-purpose processor, or, at least in part, is processed by hardware coupled to the general-purpose processor and accessible absent using an I/O interface.

Based on the instruction terminating, a determination is made as to whether the condition code resulting from execution is equal to a first defined value, e.g., 0, INQUIRY 1710. If the condition code is equal to the first defined value, then processing of the instruction is complete, STEP 1712. However, if the condition code is not equal to the first defined value, then a further determination is made as to whether the condition code is equal to a second defined value, e.g., 3, INQUIRY 1714. If the condition code is equal to the second defined value indicating there is additional data to be processed, then the instruction is re-executed, STEP 1708. However, if the condition code is not equal to the second defined value, then another determination is made as to whether the condition code is set to a third defined value, e.g., 1, INQUIRY 1716. If the condition code is set to the third defined value indicating the first operand length is insufficient, then processing continues with STEP 1706; otherwise, the second operand length is insufficient for the function and processing continues with STEP 1704.

As indicated, the DEFLATE Conversion Call instruction may be executed multiple times to compress or decompress a single data stream. Therefore, in one aspect, the DEFLATE Conversion Call instruction includes an attribute which provides a mechanism for a program to declare a buffer (e.g., a 32 K-byte buffer), which is used to accumulate the history of uncompressed data processed during an operation which spans multiple executions of the DEFLATE Conversion Call instruction. The buffer is, for instance, a circular history buffer.

In one aspect, the DEFLATE Conversion Call instruction uses an indicator (e.g., a bit) in an implied register (e.g., GR0.56) to indicate use of a circular history buffer. When the circular history buffer is indicated and the specified function to be performed by the DEFLATE Conversion Call instruction is compressing or uncompressing data, a field of the instruction (e.g., $R_3$) specifies the location in memory of, e.g., a 32 K-byte buffer, which the processor uses to fetch history from at the beginning of an operation and store history to at the end of an operation. The length of the history within the circular history buffer is specified by a field of a parameter block associated with the DEFLATE Conversion Call instruction (e.g., HL field 385), and the beginning of the history within the buffer is specified by an offset included in another field of the parameter block (e.g., HO field 386).

Figure 18:
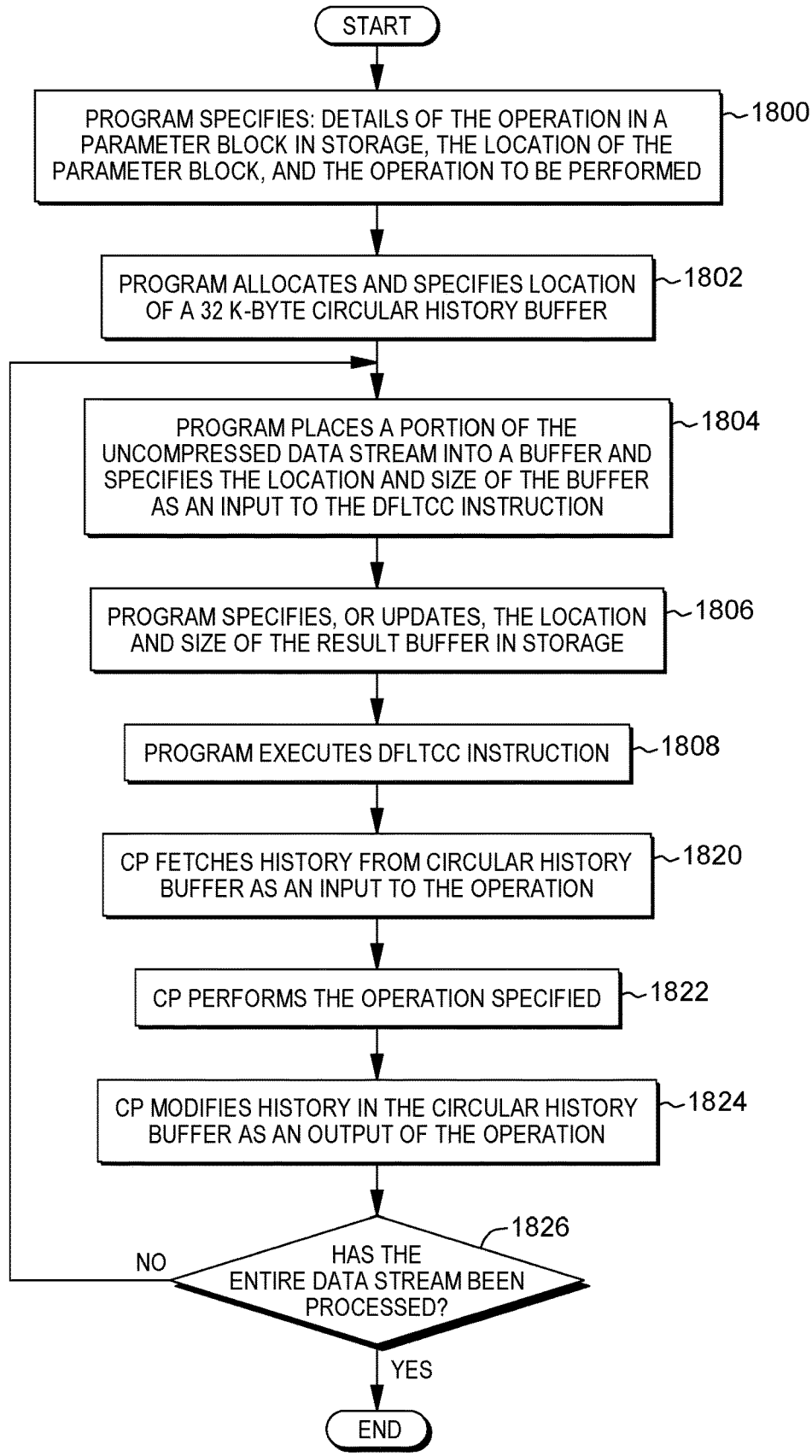
FIG. 18 depicts one example of using a circular history buffer, in accordance with an aspect of the present invention.

Further details of using a circular history buffer are described with reference to FIG. 18. In one example, a program executing on a processor, such as a general-purpose processor, specifies details of an operation to be performed in a parameter block in storage and specifies the location of the parameter block, STEP 1800. For instance, one or more of the fields of a parameter block (e.g., parameter block 360 or 370) are provided or set, depending on the function to be performed. Further, the program specifies the operation to be performed (e.g., compress, expand, etc.).

Further, in one example, the program allocates and specifies a location in memory of a pre-defined sized (e.g., 32 K-byte) circular buffer, STEP 1802. Additionally, the program places a portion of an uncompressed data stream into a buffer and specifies the location and the size of the buffer as an input to the DEFLATE Conversion Call instruction, STEP 1804, and specifies or updates the location and size of a result buffer in storage, STEP 1806.

The DEFLATE Conversion Call instruction is then executed, STEP 1808. Based on executing the instruction, the processor fetches history from, e.g., a circular history buffer, as an input to the operation, STEP 1820, and performs the specified operation, STEP 1822, as described herein. Further, the processor modifies the history in the circular history buffer as an output of the operation, STEP 1824. A determination is made as to whether the entire data stream has been processed, INQUIRY 1826. If not, then processing continues with STEP 1804. Otherwise, processing is complete.

Use of a circular history buffer provides the following, as examples:

When the size of the input or output buffer, specified for use with an individual execution of the DEFLATE Conversion Call instruction, is relatively small (e.g., 512 bytes), a history spanning multiple segments of buffered data, up to, e.g., 32 K-bytes, may be used as an input to the DEFLATE Conversion Call instruction, which processes a small number of bytes.

When the size of the input or output buffer, specified for use with an individual execution of the DEFLATE Conversion Call instruction, is relatively large (e.g., 128 K-bytes), a history of the prior segment of buffered data, up to, e.g., 32 K-bytes, may be used as a input to the DEFLATE Conversion Call instruction which is processing the first 32 K-bytes of data.

In both cases, more history is available to process data than would otherwise be available. As a result, the effectiveness of detecting duplicate strings is improved, resulting in improved overall compression ratios. This facilitates processing within the computing environment and improves performance.

One or more aspects of the present invention are inextricably tied to computer technology and facilitate processing within a computer, improving performance thereof. The use of a single architected machine instruction to perform compressing and/or decompressing improves performance within the computing environment. The compressed/decompressed data may be used in many technical fields that manage and/or use data, such as in computer processing, medical processing, security, inventory control, etc. By providing optimizations in compressing/decompressing, these technical fields are improved by reducing execution time.

Further details of one embodiment of facilitating processing within a computing environment, as it relates to one or more aspects of the present invention, are described with reference to FIGS. 19A-19B.

Referring to FIG. 19A, in one embodiment, a processor of the computing environment obtains an instruction to perform a function of a plurality of functions supported by the instruction (1900). The instruction is a single architected instruction of an instruction set architecture that complies to an industry standard for compression (1904). The instruction is executed (1906), and the executing includes performing the function specified by the instruction (1908). The performing, based on the function being a compression function or a decompression function, includes transforming state of input data between an uncompressed form of the input data and a compressed form of the input data to provide a transformed state of data (1910). During performing the function, history relating to the function is accessed, and the history is to be used in transforming the state of the input data between the uncompressed form and the compressed form (1912). The transformed state of data is provided as output to be used in performing a task (1914).

In one example, the processor is a general-purpose processor (1916), and the transforming the state of the input data uses a compression format that complies with the industry standard (1918). Further, as an example, the history is stored in a buffer specified by the instruction (1920).

As an example, with reference to FIG. 19B, the instruction includes an operation code field that includes an operation code to specify an operation and a plurality of register fields to specify a plurality of registers to be used by the instruction (1922). The plurality of registers includes one register used to identify an output operand location to be used by the instruction as an output, and another register used to identify an input operand location to be used by the instruction as an input (1924). The instruction uses a selected register to specify a location in memory of the buffer and another selected register to provide an address of a parameter block to be used by the instruction (1926). The parameter block specifies an offset within the buffer which designates a beginning of the history within the buffer (1928). The parameter block further includes a length of the history within the buffer (1930).

Further, in one example, the instruction uses a chosen register to specify a type of the buffer (1932), which, in one example, is a circular buffer (1934).

In one embodiment, the input depends on the function (1936), and based on the function being the compression function, the input includes data from the input operand location to be encoded to provide compressed data symbols stored to the output operand location and copied as history stored to the buffer from the input operand location (1938). Further, based on the function being the decompression function, the input includes the compressed data symbols from the input operand location to be decoded to provide uncompressed data stored to the output operand location and to the buffer (1940).

Other variations and embodiments are possible.

Figure 20A:
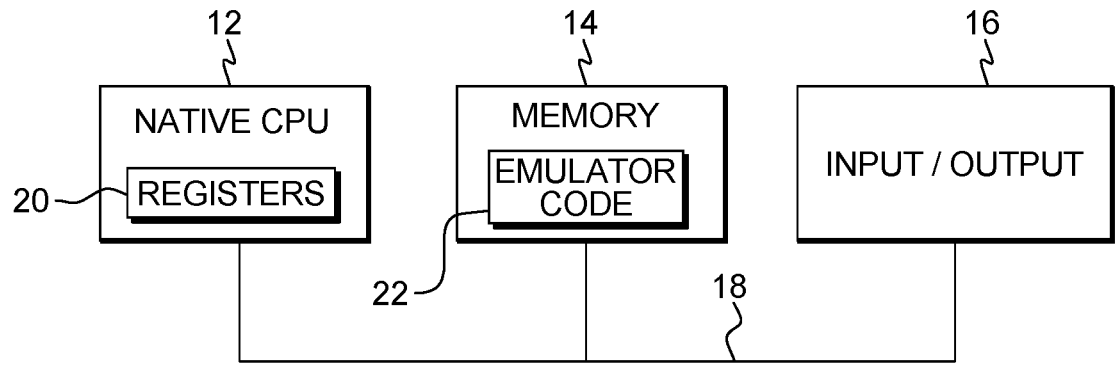
FIG. 20A depicts another example of a computing environment to incorporate and use one or more aspects of the present invention.

Aspects of the present invention may be used by many types of computing environments. Another embodiment of a computing environment to incorporate and use one or more aspects of the present invention is described with reference to FIG. 20A. In this example, a computing environment 10 includes, for instance, a native central processing unit (CPU) 12, a memory 14, and one or more input/output devices and/or interfaces 16 coupled to one another via, for example, one or more buses 18 and/or other connections. As examples, computing environment 10 may include a PowerPC® processor offered by International Business Machines Corporation, Armonk, N.Y.; an HP Superdome with Intel Itanium II processors offered by Hewlett Packard Co., Palo Alto, Calif.; and/or other machines based on architectures offered by International Business Machines Corporation, Hewlett Packard, Intel Corporation, Oracle, or others. IBM, z/Architecture, IBM Z, z/OS, PR/SM and PowerPC are trademarks or registered trademarks of International Business Machines Corporation in at least one jurisdiction. Intel and Itanium are trademarks or registered trademarks of Intel Corporation or its subsidiaries in the United States and other countries.

Native central processing unit 12 includes one or more native registers 20, such as one or more general purpose registers and/or one or more special purpose registers used during processing within the environment. These registers include information that represents the state of the environment at any particular point in time.

Moreover, native central processing unit 12 executes instructions and code that are stored in memory 14. In one particular example, the central processing unit executes emulator code 22 stored in memory 14. This code enables the computing environment configured in one architecture to emulate another architecture. For instance, emulator code 22 allows machines based on architectures other than the z/Architecture hardware architecture, such as PowerPC processors, HP Superdome servers or others, to emulate the z/Architecture hardware architecture and to execute software and instructions developed based on the z/Architecture hardware architecture.

Figure 20B:
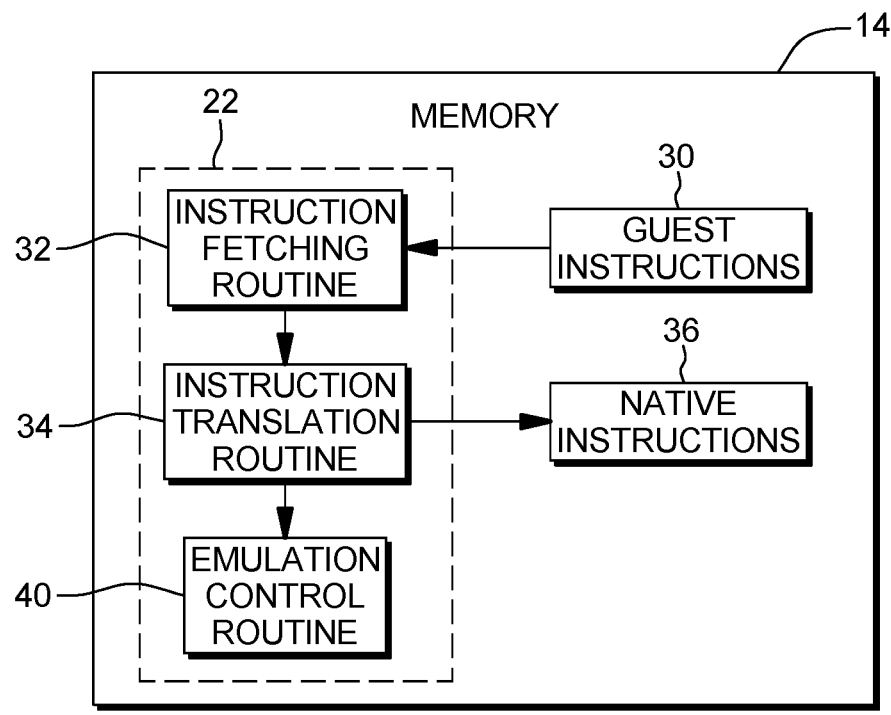
FIG. 20B depicts further details of the memory of FIG. 20A.

Further details relating to emulator code 22 are described with reference to FIG. 20B. Guest instructions 30 stored in memory 14 comprise software instructions (e.g., correlating to machine instructions) that were developed to be executed in an architecture other than that of native CPU 12. For example, guest instructions 30 may have been designed to execute on a processor based on the z/Architecture hardware architecture, but instead, are being emulated on native CPU 12, which may be, for example, an Intel Itanium II processor. In one example, emulator code 22 includes an instruction fetching routine 32 to obtain one or more guest instructions 30 from memory 14, and to optionally provide local buffering for the instructions obtained. It also includes an instruction translation routine 34 to determine the type of guest instruction that has been obtained and to translate the guest instruction into one or more corresponding native instructions 36. This translation includes, for instance, identifying the function to be performed by the guest instruction and choosing the native instruction(s) to perform that function.

Further, emulator code 22 includes an emulation control routine 40 to cause the native instructions to be executed. Emulation control routine 40 may cause native CPU 12 to execute a routine of native instructions that emulate one or more previously obtained guest instructions and, at the conclusion of such execution, return control to the instruction fetch routine to emulate the obtaining of the next guest instruction or a group of guest instructions. Execution of the native instructions 36 may include loading data into a register from memory 14; storing data back to memory from a register; or performing some type of arithmetic or logic operation, as determined by the translation routine.

Each routine is, for instance, implemented in software, which is stored in memory and executed by native central processing unit 12. In other examples, one or more of the routines or operations are implemented in firmware, hardware, software or some combination thereof. The registers of the emulated processor may be emulated using registers 20 of the native CPU or by using locations in memory 14. In embodiments, guest instructions 30, native instructions 36 and emulator code 22 may reside in the same memory or may be disbursed among different memory devices.

The computing environments described above are only examples of computing environments that can be used. Other environments, including but not limited to, other non-partitioned environments, other partitioned environments, and/or other emulated environments, may be used; embodiments are not limited to any one environment.

Each computing environment is capable of being configured to include one or more aspects of the present invention. For instance, each may be configured to provide sorting and/or merging, in accordance with one or more aspects of the present invention.

One or more aspects may relate to cloud computing.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 21:
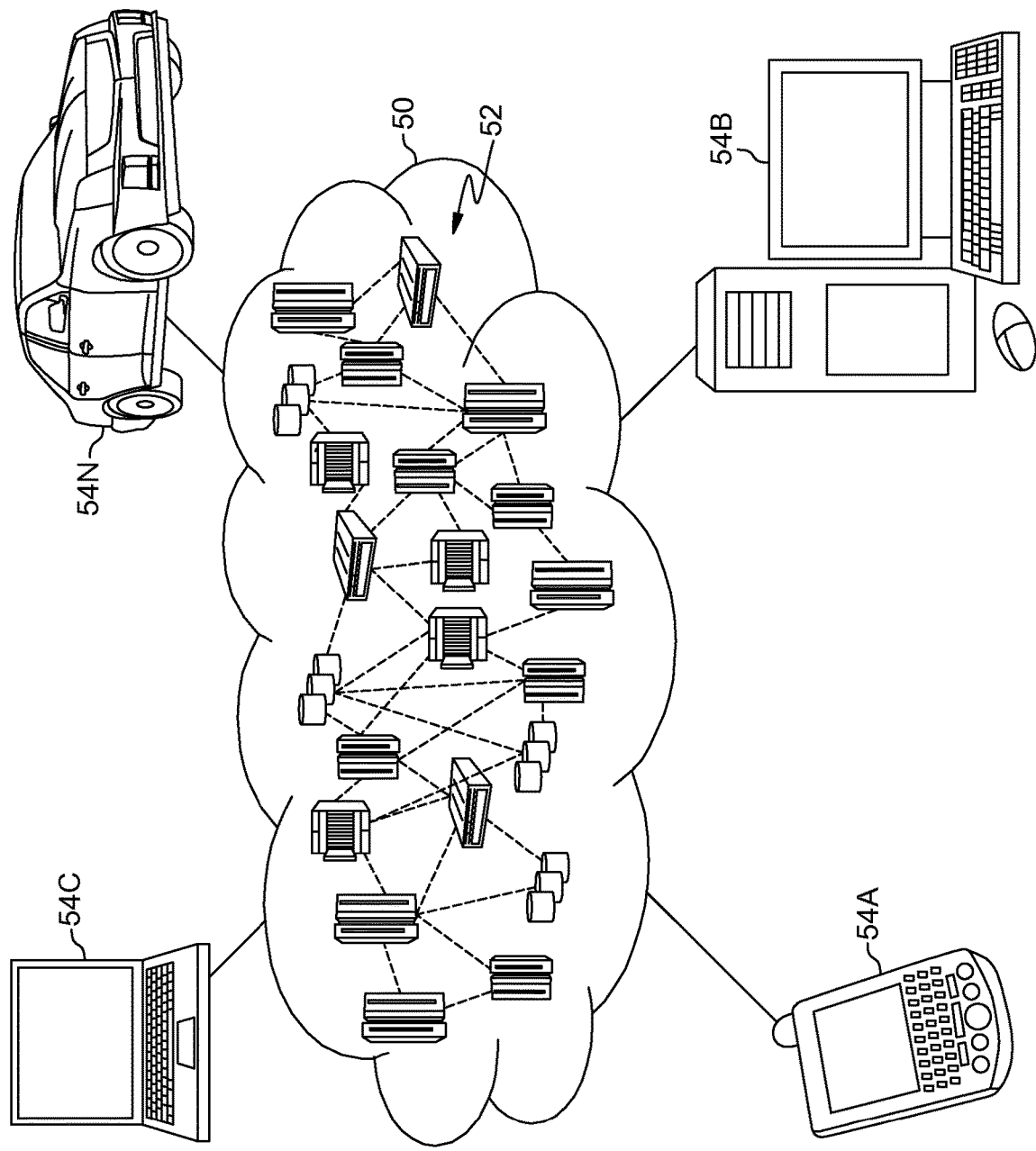
FIG. 21 depicts one embodiment of a cloud computing environment.

Referring now to FIG. 21, illustrative cloud computing environment 50 is depicted. As shown, cloud computing environment 50 includes one or more cloud computing nodes 52 with which local computing devices used by cloud consumers, such as, for example, personal digital assistant (PDA) or cellular telephone 54A, desktop computer 54B, laptop computer 54C, and/or automobile computer system 54N may communicate. Nodes 52 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 21 are intended to be illustrative only and that computing nodes 52 and cloud computing environment 50 can communicate with any type of computerized device over any type of network and/or network addressable connection (e.g., using a web browser).

Figure 22:
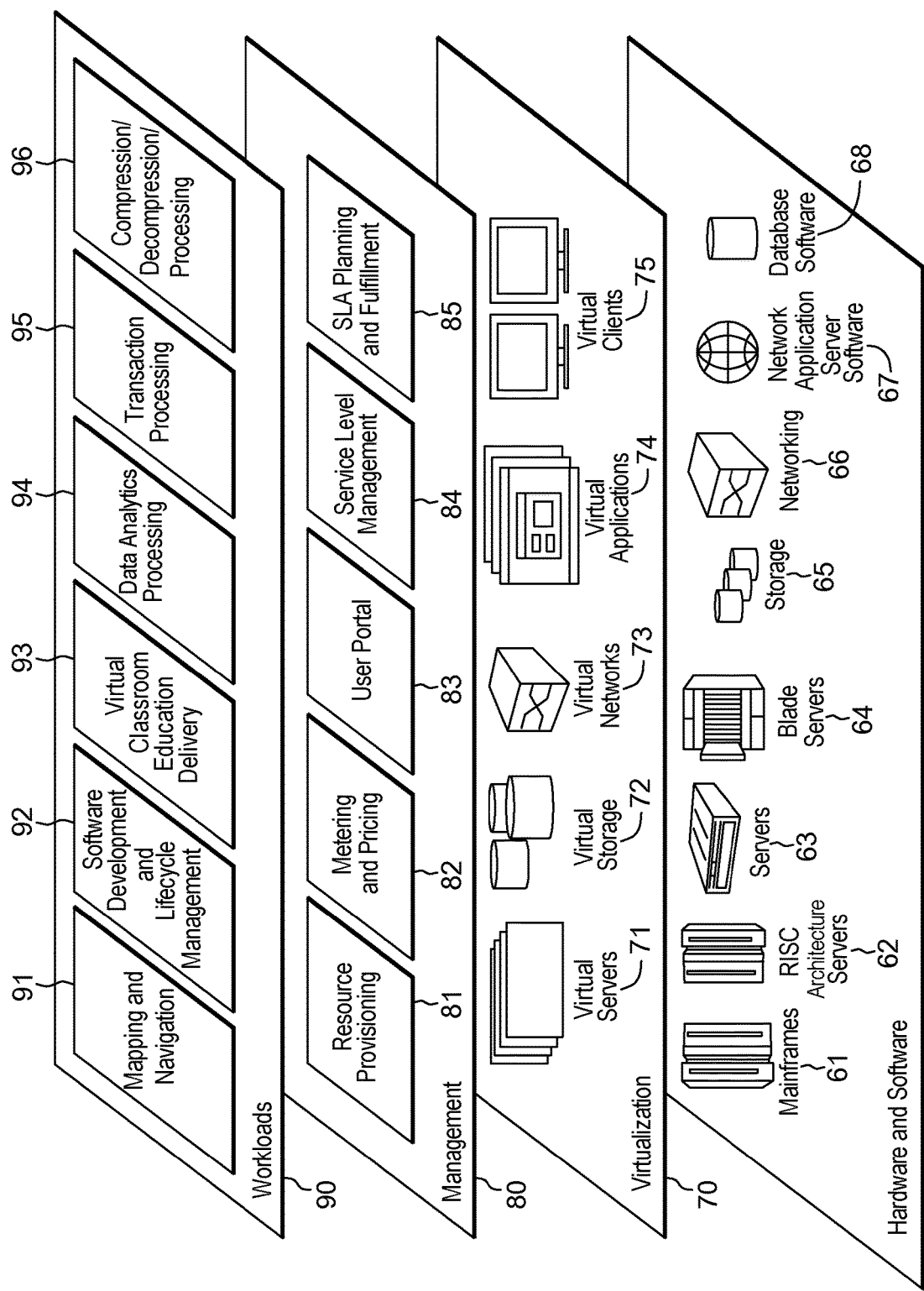
FIG. 22 depicts one example of abstraction model layers.

Referring now to FIG. 22, a set of functional abstraction layers provided by cloud computing environment 50 (FIG. 21) is shown. It should be understood in advance that the components, layers, and functions shown in FIG. 22 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and compression/decompression processing 96.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally, or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different instructions or operations may be used. Additionally, different registers may be used and/or other types of indications (other than register numbers) may be specified. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer program product for facilitating processing within a computing environment, the computer program product comprising:

a computer readable storage medium readable by a processing circuit and storing instructions for performing a method comprising:

obtaining, by a processor of the computing environment, an instruction to perform a function of a plurality of functions supported by the instruction, the instruction including an operation code specifying an operation and being a single architected instruction of an instruction set architecture, the instruction complying to an industry standard for compression, and the operation code being separate from an indication of the function to be performed; and executing the instruction, the executing including:

performing the function specified by the instruction, wherein, based on the function being a compression function or a decompression function, the performing comprises transforming state of input data between an uncompressed form of the input data and a compressed form of the input data to provide a transformed state of data;

accessing, during performing the function, history relating to the function, the history to be used in transforming the state of the input data between the uncompressed form and the compressed form; and providing as output the transformed state of data to be used in performing a task.

2. The computer program product of claim 1, wherein the processor is a general-purpose processor.

3. The computer program product of claim 1, wherein the transforming the state of the input data uses a compression format that complies with the industry standard.

4. The computer program product of claim 1, wherein the history is stored in a buffer specified by the instruction.

5. The computer program product of claim 4, wherein the instruction comprises an operation code field that includes the operation code to specify the operation and a plurality of register fields to specify a plurality of registers to be used by the instruction, wherein the plurality of registers comprises one register used to identify an output operand location to be used by the instruction as an output, and another register used to identify an input operand location to be used by the instruction as an input.

6. The computer program product of claim 5, wherein the input depends on the function, wherein based on the function being the compression function, the input comprises data from the input operand location to be encoded to provide compressed data symbols stored to the output operand location and copied as history stored to the buffer from the input operand location, and wherein based on the function being the decompression function, the input comprises the compressed data symbols from the input operand location to be decoded to provide uncompressed data stored to the output operand location and to the buffer.

7. The computer program product of claim 5, wherein the instruction uses a selected register to specify a location in memory of the buffer and another selected register to provide an address of a parameter block to be used by the instruction, the parameter block specifying an offset within the buffer which designates a beginning of the history within the buffer.

8. The computer program product of claim 7, wherein the parameter block further includes a length of the history within the buffer.

9. The computer program product of claim 7, wherein the instruction uses a chosen register to specify a type of the buffer.

10. The computer program product of claim 9, wherein the type of the buffer is a circular buffer.

11. A computer system for facilitating processing within a computing environment, the computer system comprising:

a memory; and a processor coupled to the memory, wherein the computer system is configured to perform a method comprising:

obtaining, by the processor, an instruction to perform a function of a plurality of functions supported by the instruction, the instruction including an operation code specifying an operation and being a single architected instruction of an instruction set architecture, the instruction complying to an industry standard for compression, and the operation code being separate from an indication of the function to be performed; and executing the instruction, the executing including:

performing the function specified by the instruction, wherein, based on the function being a compression function or a decompression function, the performing comprises transforming state of input data between an uncompressed form of the input data and a compressed form of the input data to provide a transformed state of data;

accessing, during performing the function, history relating to the function, the history to be used in transforming the state of the input data between the uncompressed form and the compressed form; and providing as output the transformed state of data to be used in performing a task.

12. The computer system of claim 11, wherein the history is stored in a buffer specified by the instruction.

13. The computer system of claim 12, wherein the instruction comprises an operation code field that includes the operation code to specify the operation and a plurality of register fields to specify a plurality of registers to be used by the instruction, wherein the plurality of registers comprises one register used to identify an output operand location to be used by the instruction as an output, and another register used to identify an input operand location to be used by the instruction as an input.

14. The computer system of claim 13, wherein the instruction uses a selected register to specify a location in memory of the buffer and another selected register to provide an address of a parameter block to be used by the instruction, the parameter block specifying an offset within the buffer which designates a beginning of the history within the buffer.

15. The computer system of claim 14, wherein the parameter block further includes a length of the history within the buffer, and wherein the instruction uses a chosen register to specify a type of the buffer, the type of the buffer being a circular buffer.

16. A computer-implemented method of facilitating processing within a computing environment, the computer-implemented method comprising:

obtaining, by a processor of the computing environment, an instruction to perform a function of a plurality of functions supported by the instruction, the instruction including an operation code specifying an operation and being a single architected instruction of an instruction set architecture, the instruction complying to an industry standard for compression, and the operation code being separate from an indication of the function to be performed; and executing the instruction, the executing including:

performing the function specified by the instruction, wherein, based on the function being a compression function or a decompression function, the performing comprises transforming state of input data between an uncompressed form of the input data and a compressed form of the input data to provide a transformed state of data;

accessing, during performing the function, history relating to the function, the history to be used in transforming the state of the input data between the uncompressed form and the compressed form; and providing as output the transformed state of data to be used in performing a task.

17. The computer-implemented method of claim 16, wherein the history is stored in a buffer specified by the instruction.

18. The computer-implemented method of claim 17, wherein the instruction comprises an operation code field that includes the operation code to specify the operation and a plurality of register fields to specify a plurality of registers to be used by the instruction, wherein the plurality of registers comprises one register used to identify an output operand location to be used by the instruction as an output, and another register used to identify an input operand location to be used by the instruction as an input.

19. The computer-implemented method of claim 18, wherein the instruction uses a selected register to specify a location in memory of the buffer and another selected register to provide an address of a parameter block to be used by the instruction, the parameter block specifying an offset within the buffer which designates a beginning of the history within the buffer.

20. The computer-implemented method of claim 19, wherein the parameter block further includes a length of the history within the buffer, and wherein the instruction uses a chosen register to specify a type of the buffer, the type of the buffer being a circular buffer.

* * * * *